(12) United States Patent
Jang et al.

(10) Patent No.: US 11,757,073 B2
(45) Date of Patent: Sep. 12, 2023

(54) LIGHT EMITTING DEVICE AND LED DISPLAY APPARATUS HAVING THE SAME

(71) Applicant: SEOUL VIOSYS CO., LTD., Ansan-si (KR)

(72) Inventors: Jong Min Jang, Ansan-si (KR); Sung Hyun Lee, Ansan-si (KR); Chang Yeon Kim, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 412 days.

(21) Appl. No.: 17/133,608

(22) Filed: Dec. 23, 2020

(65) Prior Publication Data

US 2021/0202806 A1 Jul. 1, 2021

Related U.S. Application Data

(60) Provisional application No. 63/000,087, filed on Mar. 26, 2020, provisional application No. 62/954,407, filed on Dec. 28, 2019.

(51) Int. Cl.

| | |
|---|---|
| *H01L 33/58* | (2010.01) |
| *H01L 25/075* | (2006.01) |
| *H01L 27/15* | (2006.01) |
| *H01L 33/38* | (2010.01) |
| *H01L 33/62* | (2010.01) |
| *H01L 33/44* | (2010.01) |

(52) U.S. Cl.
CPC .......... *H01L 33/58* (2013.01); *H01L 25/0753* (2013.01); *H01L 27/15* (2013.01); *H01L 33/38* (2013.01); *H01L 33/44* (2013.01); *H01L 33/62* (2013.01); *H01L 2933/0016* (2013.01); *H01L 2933/0025* (2013.01); *H01L 2933/0066* (2013.01)

(58) Field of Classification Search
CPC ..... H01L 33/58; H01L 25/0753; H01L 27/15; H01L 33/38; H01L 33/44; H01L 33/62; H01L 2933/0016; H01L 2933/0025; H01L 2933/0066
See application file for complete search history.

(56) References Cited

U.S. PATENT DOCUMENTS

| | | | |
|---|---|---|---|
| 2016/0260869 A1 | 9/2016 | Jeon et al. | |
| 2017/0288095 A1* | 10/2017 | Cheng | ............... H01L 33/502 |
| 2019/0165207 A1 | 5/2019 | Kim et al. | |

(Continued)

FOREIGN PATENT DOCUMENTS

| | | |
|---|---|---|
| KR | 10-2015-0007640 | 1/2015 |
| KR | 10-2015-0114446 | 10/2015 |
| KR | 10-2019-0026617 | 3/2019 |

OTHER PUBLICATIONS

International Search Report dated Apr. 19, 2021 in International Application No. PCT/KR2020/019151 (with English Translation).

*Primary Examiner* — Victor A Mandala
(74) *Attorney, Agent, or Firm* — H.C. Park & Associates, PLC

(57) ABSTRACT

A display apparatus including a circuit board, a plurality of light emitting devices mounted on the circuit board, a transparent substrate disposed on the light emitting devices, and a light absorbing layer disposed between the transparent substrate and the light emitting devices, in which the light absorbing layer covers upper regions of the light emitting devices and a region between the light emitting devices.

17 Claims, 60 Drawing Sheets

(56) References Cited

U.S. PATENT DOCUMENTS

| | | |
|---|---|---|
| 2019/0198485 A1 | 6/2019 | Chae et al. |
| 2019/0229097 A1* | 7/2019 | Takeya .................. H01L 25/167 |
| 2020/0373469 A1* | 11/2020 | Chen .................. H01L 25/0753 |
| 2021/0111162 A1* | 4/2021 | Takeya .................... H01L 33/38 |

* cited by examiner

LIGHT EMITTING DEVICE AND LED DISPLAY APPARATUS HAVING THE SAME

CROSS REFERENCE TO RELATED APPLICATION

This application claims the benefit of U.S. Provisional Patent Application No. 62/954,407 filed on Dec. 28, 2019, and U.S. Provisional Patent Application No. 63/000,087 filed on Mar. 26, 2020, which is hereby incorporated by reference for all purposes as if fully set forth herein.

BACKGROUND

Field

Exemplary embodiments of the invention relate generally to an LED display apparatus implementing an image using a light emitting diode.

Discussion of the Background

As an inorganic light source, light emitting diodes have been used in various fields including displays, vehicular lamps, general lighting, and the like. With various advantages of light emitting diodes over conventional light sources, such as longer lifespan, lower power consumption, and rapid response, light emitting diodes have been replacing conventional light sources.

Light emitting diodes have been generally used as backlight light sources in display apparatuses. However, LED displays that directly display images using the light emitting diodes have been recently developed.

In general, a display apparatus realizes various colors through mixture of blue, green, and red light. To display various images, a display apparatus includes a plurality of pixels each including sub-pixels corresponding to blue, green, and red light, respectively. In this manner, a color of a certain pixel is determined based on the colors of the sub-pixels so that images can be displayed through combination of such pixels.

Since LEDs can emit various colors depending upon materials thereof, it is possible to provide a display apparatus by arranging individual LED chips emitting blue, green, and red light on a two-dimensional plane. Furthermore, a technology for mounting a light emitting device having a stacked structure in which blue, green, and red LEDs are stacked on a circuit board has been introduced in recent years to reduce a mounting process time.

FIG. 1 is an exemplary schematic cross-sectional view of a conventional LED display apparatus.

Referring to FIG. 1, light emitting devices 100p are mounted on a circuit board 200p, and a transparent substrate 300p covers the light emitting devices 100p for protection. Each of the light emitting devices 100p may be a light emitting device having a single light emitting stack structure or a light emitting device having a stacked structure of a plurality of light emitting stacks. Light emitted from the light emitting devices 100p is emitted to the outside through the transparent substrate 300p.

However, the conventional LED display apparatus has a drawback in that a viewing angle of light emitted from the light emitting devices 100p is large, and that optical interference between adjacent light emitting devices occurs. The large viewing angle and the optical interference between the light emitting devices reduce clarity of a displayed image.

FIG. 2 is another exemplary schematic cross-sectional view of a conventional LED display apparatus.

Referring to FIG. 2, sidewalls 150p surround the light emitting devices 100p. The sidewall 150p is formed of a black material such as black epoxy that absorbs light so as to prevent optical interference between the light emitting devices 100p. The black material may be formed by, for example, bonding the light emitting devices 100p, filling a liquid black material between the light emitting devices 100p using a squeezer, and curing the liquid black material.

However, since the light emitting devices 100p are exposed to the outside, there is a drawback in that the light emitting devices 100p are easily damaged, and an excessive amount of light is absorbed by the black material. Furthermore, while the black material is filled between the light emitting devices 100p to form the sidewalls 150p, the light emitting devices 100p having weak adhesion may be peeled off from the circuit board 200p, resulting in a device failure.

The above information disclosed in this Background section is only for understanding of the background of the inventive concepts, and, therefore, it may contain information that does not constitute prior art.

SUMMARY

Display apparatuses constructed according to exemplary embodiments of the invention are capable of protecting light emitting devices and reducing optical interference between the light emitting devices.

Exemplary embodiments also provide a light emitting device suitable for a display apparatus.

Additional features of the inventive concepts will be set forth in the description which follows, and in part will be apparent from the description, or may be learned by practice of the inventive concepts.

A display apparatus including a circuit board, a plurality of light emitting devices mounted on the circuit board, a transparent substrate disposed on the light emitting devices, and a light absorbing layer disposed between the transparent substrate and the light emitting devices, in which the light absorbing layer covers upper regions of the light emitting devices and a region between the light emitting devices.

The light absorbing layer may include at least one of PDMA and black EMC.

The light absorbing layer may contact a lower surface of the transparent substrate.

Each of the light emitting devices may include a single light emitting stack.

The display apparatus may further include an adhesive layer disposed between the light emitting devices and the light absorbing layer.

Each of the light emitting devices may include a first light emitting stack, a second light emitting stack, and a third light emitting stack stacked in the vertical direction.

The light emitting device may further include a growth substrate of the third light emitting stack, and the light absorbing layer may contact the growth substrate.

The light absorbing layer may contact the third light emitting stack.

Each of the light emitting devices may further include first, second, third, and fourth connection electrodes electrically connected to the first, second, and third light emitting stacks, and the first, second, third, and fourth connection electrodes may electrically connect the first, second, and third light emitting stacks to the circuit board.

The display apparatus may further include bonding metal layers disposed on upper surfaces of the first, second, third, and fourth connection electrodes, respectively, in which the bonding metal layers may be eutectic bonded to the circuit board.

Each of the first, second, third, and fourth connection electrodes may include a groove on the upper surface thereof, respectively, and the bonding metal layers may cover the grooves of the first, second, third, and fourth connection electrodes, respectively.

The first, second, third, and fourth connection electrodes may include Cu, and the bonding metal layers include Au.

The display apparatus may further include a first pad electrically connecting the first connection electrode to the first light emitting stack, a second pad electrically connecting the second connection electrode to the second light emitting stack, a third pad electrically connecting the third connection electrode to the third light emitting stack, and a fourth pad electrically connecting the fourth connection electrode to the first, second, and third light emitting stacks, in which the first, second, and third connection electrodes may be disposed within a lower region of the third light emitting stack.

The first, second, third, and fourth connection electrodes may be located within lower regions of the first, second, and third light emitting stacks.

Each of the first, second, third, and fourth pads may extend outward from the lower region of the third light emitting stack, and the first, second, third, and fourth connection electrodes may be connected to the first, second, third, and fourth pads at locations spaced apart from the lower region of the third light emitting stack in the lateral direction.

Each of the first, second, and third light emitting stacks may include a first conductivity type semiconductor layer and a second conductivity type semiconductor layer, the first, second, and third connection electrodes may be electrically connected to the second conductivity type semiconductor layers of the first, second, and third light emitting stacks, respectively, and the fourth connection electrode may be electrically connected to the first conductivity type semiconductor layers of the first, second, and third light emitting stacks.

The display apparatus may further include a first upper contact electrode in ohmic contact with the first conductivity type semiconductor layer of the first light emitting stack, in which the first conductivity type semiconductor layer of the first light emitting stack may have a recessed region, and the first upper contact electrode may be disposed in the recessed region.

A unit pixel according to another exemplary embodiment includes a transparent substrate, a plurality of light emitting devices arranged on the transparent substrate, a light absorbing layer disposed between the transparent substrate and the plurality of light emitting devices, an adhesive layer bonding the light emitting devices to the light absorbing layer, a step adjustment layer covering the light emitting device and adhered to the adhesive layer, connection layers disposed on the step adjustment layer, and electrically connected to the light emitting devices, in which the light absorbing layer covers lower regions of the light emitting devices and a region between the light emitting devices.

The plurality of light emitting devices may include at least three light emitting devices emitting light of different colors from one another, and the at least three light emitting devices may be linearly arranged along a line.

A pixel module according to still another exemplary embodiment includes a circuit board, and a plurality of unit pixels disposed on the circuit board, each of the unit pixels including a transparent substrate, a plurality of light emitting devices arranged under the transparent substrate, a light absorbing layer disposed between the transparent substrate and the plurality of light emitting devices, an adhesive layer bonding the light emitting devices to the light absorbing layer, a step adjustment layer covering the light emitting device and adhered to the adhesive layer, and connection layers disposed under the step adjustment layer, and electrically connected to the light emitting devices, in which the light absorbing layer covers upper regions of the light emitting devices and a region between the light emitting devices.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
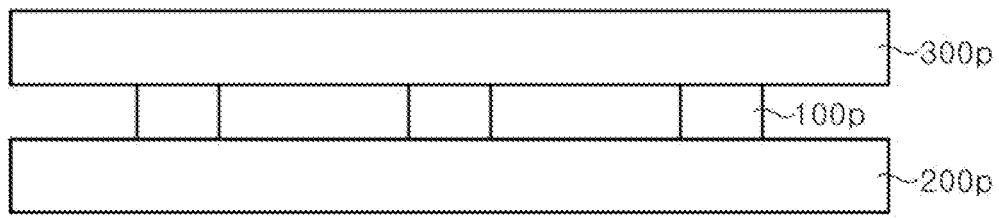
FIG. 1 is an exemplary schematic cross-sectional view of a conventional display apparatus.
Figure 2:
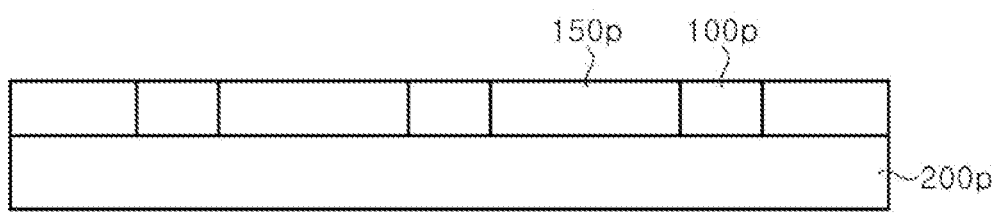
FIG. 2 is another exemplary schematic cross-sectional view of a conventional display apparatus.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments will be described in detail with reference to the accompanying drawings. As used herein, a light emitting device may include micro-LEDs, which has a light emitting area of 10,000 µm' or less as known in the art. In other exemplary embodiments, the micro-LED may have a light emitting area of 4,000 µm$^2$ or less, and further, 2,500 µm$^2$ or less.

Figure 3:
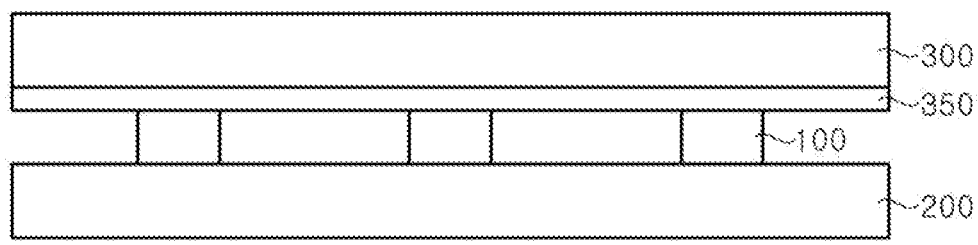
FIG. 3 is a schematic cross-sectional view of a display apparatus according to an exemplary embodiment.

FIG. 3 is a schematic cross-sectional view of a display apparatus according to an exemplary embodiment.

Referring to FIG. 3, the display apparatus includes a circuit board 200, light emitting devices 100, a transparent substrate 300, and a light absorbing layer 350.

The circuit board 200 may include a circuit for passive matrix driving or active matrix driving. In an exemplary embodiment, the circuit board 200 may include interconnection lines and resistors therein. In another exemplary embodiment, the circuit board 200 may include interconnection lines, transistors, and capacitors. The circuit board 200 may also have pads disposed on an upper surface thereof to allow electrical connection to the circuit therein.

The light emitting devices 100 are mounted on the circuit board 200. The light emitting device 100 may be bonded to pads of the circuit board 200. The light emitting devices 100 may be arranged on the circuit board 200 at regular intervals. A region between the light emitting devices 100 may be filled with a material that transmits light or may be filled with air. Since the region between the light emitting devices 100 is filled with a light-transmitting material or air, rather than a light absorbing layer such as a black material, light loss may be prevented. Moreover, since air or light-transmitting material has a relatively low refractive index compared to that of the light emitting device, total internal reflection in the light emitting device may be increased to enhance light emission in an upward direction. A specific structure of the light emitting device 100 will be described in more detail later.

The transparent substrate 300 covers the light emitting devices 100. The transparent substrate 300 transmits light emitted from the light emitting devices 100. The transparent substrate 300 may protect the light emitting devices 100 from an external environment.

The light absorbing layer 350 is disposed between the light emitting devices 100 and the transparent substrate 300. The light absorbing layer 350 may be formed of, for example, PDMA black epoxy molding compound (EMC), or the like. For example, the light absorbing layer 350 may be applied on the transparent substrate 300 and cured, and may be disposed on the light emitting devices 100 along with the transparent substrate 300. A thickness of the light absorbing layer 350 may be selected in consideration of a light absorption rate of the light absorbing layer 350.

An amount of light absorbed by the light absorbing layer 350 may be changed according to a length of an optical path in the light absorbing layer 350. More particularly, as the length of the optical path increases, the amount of light absorbed by the light absorbing layer 350 may be increased. Accordingly, light perpendicularly incident from the light emitting device 100 toward the light absorbing layer 350 has a short optical path within the light absorbing layer 350 so that the amount of light absorbed by the light absorbing layer 350 is small, and thus, may pass through the light absorbing layer 350 and the transparent substrate 300, and may be emitted to the outside.

However, light incident from the light emitting device 100 to the light absorbing layer 350 with an incidence angle increases the length of the optical path in the light absorbing layer 350. As such, as the incidence angle increases, the length of the optical path in the light absorbing layer 350, as well as the amount of light absorbed by the light absorbing layer 350 may be increased. As such, optical interference may be prevented since most of light causing optical interference between adjacent light emitting devices 100 is absorbed by the light absorbing layer 350.

Hereinafter, the light emitting device 100 according to an exemplary embodiment will be described.

Figure 4A:
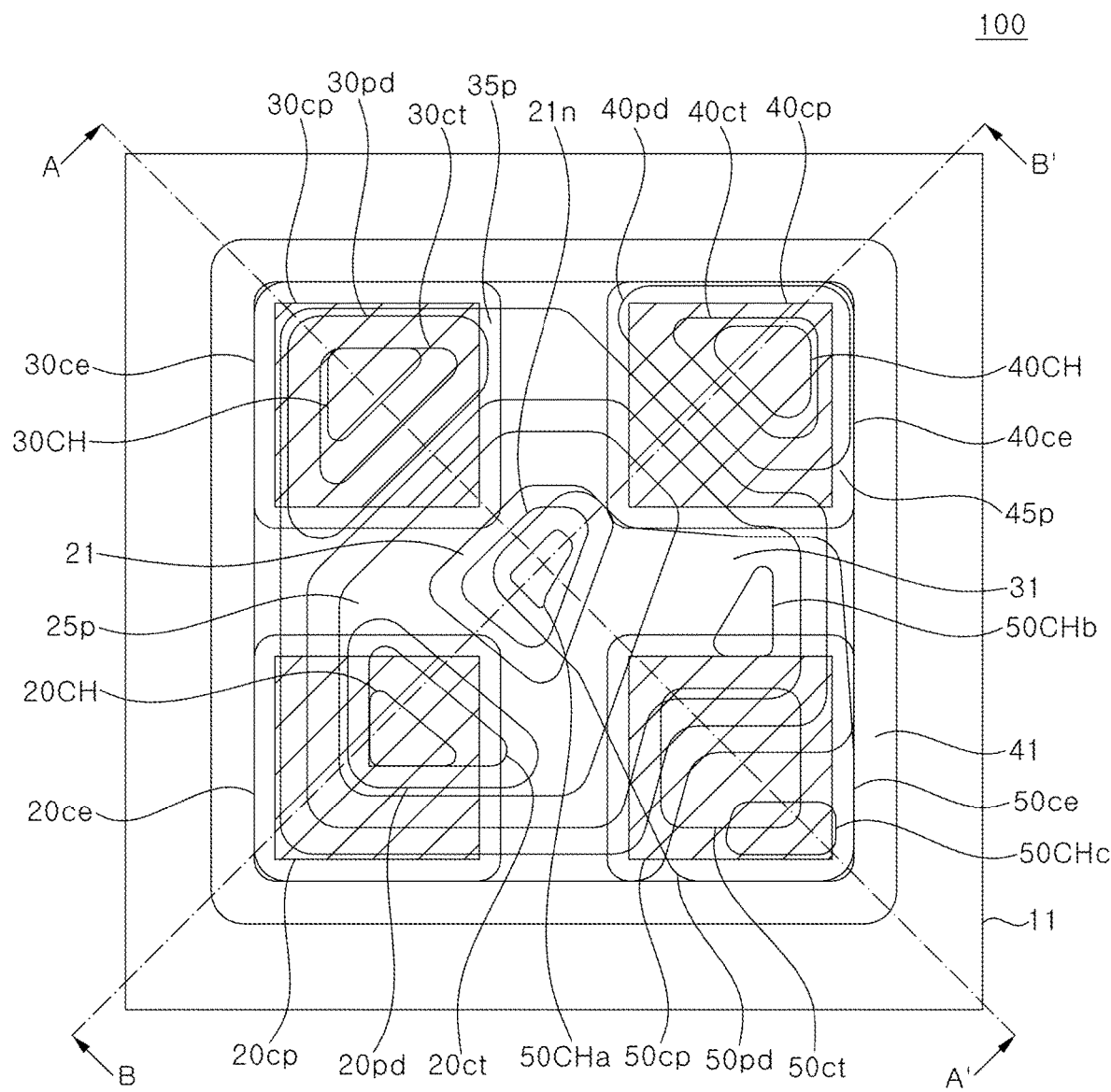
FIG. 4A is a schematic plan view of a light emitting device according to an exemplary embodiment.
Figure 4B:
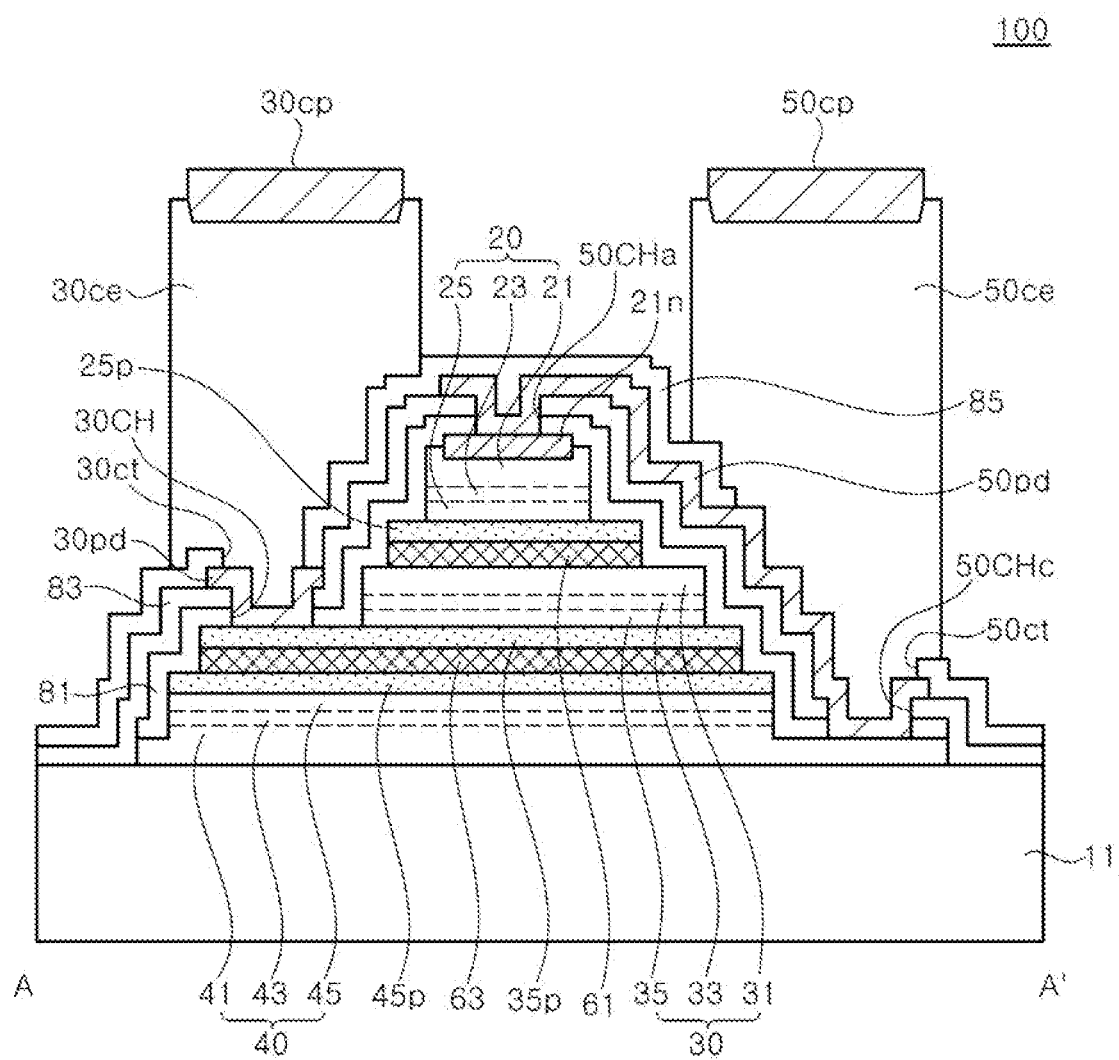
FIGS. 4B and 4C are schematic cross-sectional views taken along lines A-A' and B-B' of FIG. 4A, respectively.
Figure 4C:
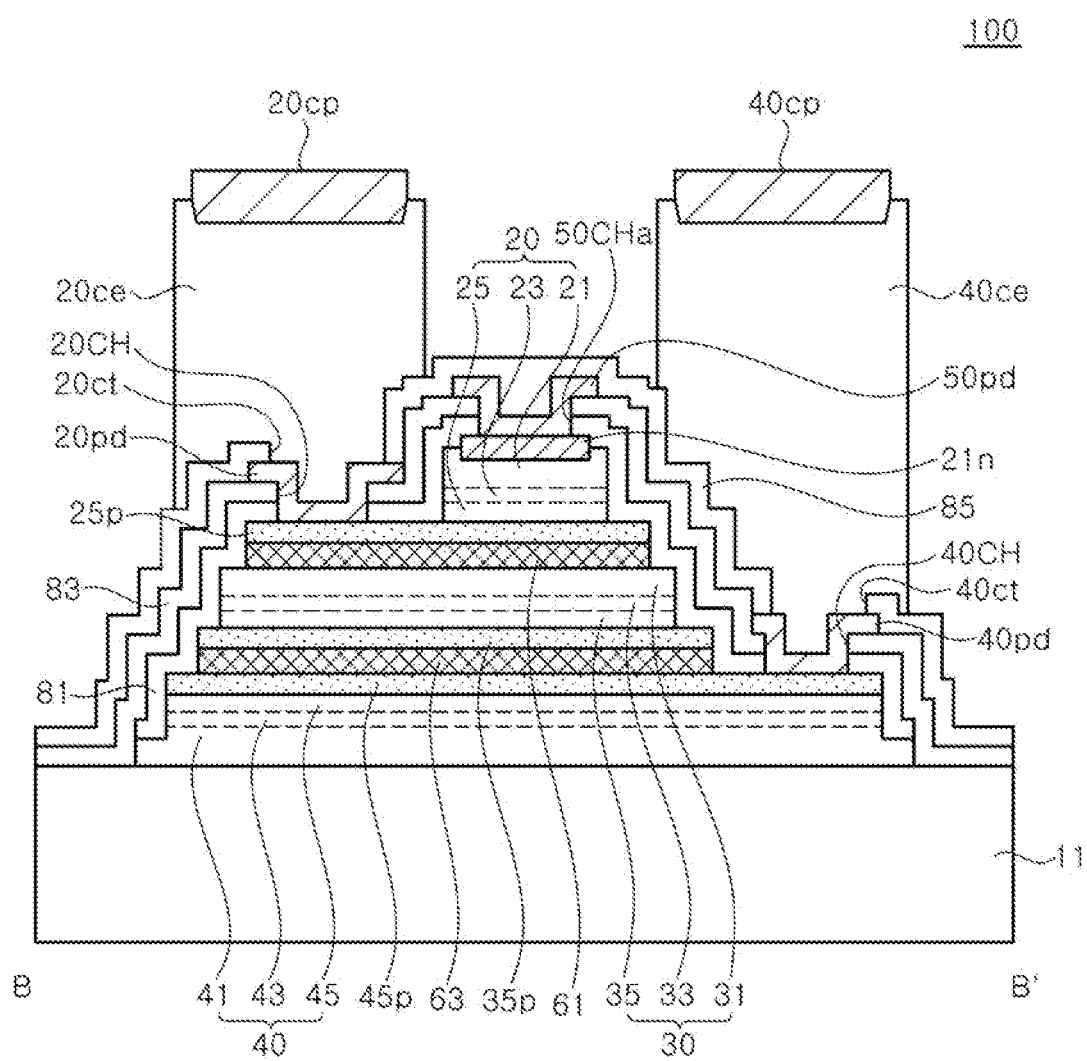

FIG. 4A is a schematic plan view of a light emitting device according to an exemplary embodiment, and FIGS. 4B and 4C are schematic cross-sectional views taken along lines A-A' and B-B' of FIG. 4A, respectively.

Referring to FIGS. 4A, 4B, and 4C, a light emitting device 100 includes a light emitting stack structure, a first connection electrode 20ce, a second connection electrode 30ce, a third connection electrode 40ce, and a fourth connection electrode 50ce formed on the light emitting stack structure, and bonding metal layers 20cp, 30cp, 40cp, and 50cp may be disposed on the connection electrodes 20ce, 30ce, 40ce, and 50ce, respectively.

The light emitting device 100 may include a light emitting stack structure, which may include a first LED sub-unit, a second LED sub-unit, and a third LED sub-unit disposed on a substrate 11. The first LED sub-unit may include a first light emitting stack 20, the second LED sub-unit may include a second light emitting stack 30, and the third LED sub-unit may include a third light emitting stack 40. The light emitting stack structure is exemplarily shown as including three light emitting stacks 20, 30, and 40, but the inventive concepts are not limited to a specific number of light emitting stacks. For example, in some exemplary embodiments, the light emitting stack structure may include two or more number of light emitting stacks. Hereinafter, the light emitting device 100 will exemplarily described as including three light emitting stacks 20, 30, and 40 according to an exemplary embodiment.

The substrate 11 may include a light-transmitting insulating material to transmit light. However, in some exemplary embodiments, the substrate 11 may be formed to be translucent or partially transparent to transmit only light of a specific wavelength or only a portion of light of a specific wavelength. The substrate 11 may be a growth substrate to epitaxially grow the third light emitting stack 40 thereon, such as a sapphire substrate. However, the substrate 11 is not limited to the sapphire substrate, and may include other various transparent insulating materials. For example, the substrate 11 may include glass, quartz, silicon, an organic polymer, or an organic-inorganic composite material, such as silicon carbide (SiC), gallium nitride (GaN), indium gallium nitride (InGaN), aluminum gallium nitride (AlGaN), aluminum nitride (AlN), gallium oxide ($Ga_2O_3$), or a silicon substrate. The substrate 11 may include irregularities on an upper surface thereof, and for example, may be a patterned sapphire substrate. The irregularities on the upper surface of the substrate 11 may increase extraction efficiency of light generated in the third light emitting stack 40 which is in contact with the substrate 11. The irregularities of the substrate 11 may be included to selectively increase luminous intensity of the third light emitting stack 40 as compared to those of the first light emitting stack 20 and the second light emitting stack 30. In another exemplary embodiment, the substrate 11 may be omitted.

The first, second, and third light emitting stacks 20, 30, and 40 are configured to emit light toward the substrate 11. Accordingly, light emitted from the first light emitting stack 20 may pass through the second and third light emitting stacks 30 and 40. According to an exemplary embodiment, the first, second, and third light emitting stacks 20, 30, and 40 may emit light having different peak wavelengths from one another. In an exemplary embodiment, a light emitting stack disposed further away from the substrate 11 emits light having a longer wavelength than that of light emitted from a light emitting stack disposed closer to the substrate 11, and thus, loss of light may be reduced. For example, the first light emitting stack 20 may emit red light, the second light emitting stack 30 may emit green light, and the third light emitting stack 40 may emit blue light.

In another exemplary embodiment, to adjust a color mixing ratio of the first, second, and third light emitting stacks 20, 30, and 40, the second light emitting stack 30 may emit light of a shorter wavelength than that of the third light emitting stack 40. Accordingly, luminous intensity of the second light emitting stack 30 may be reduced, while the luminous intensity of the third light emitting stack 40 may not be reduced, and thus, luminous intensity ratios of light emitted from the first, second, and third light emitting stacks may be substantially changed. For example, the first light emitting stack 20 may be configured to emit red light, the second light emitting stack 30 may be configured to emit blue light, and the third light emitting stack 40 may be configured to emit green light. As such, luminous intensity of blue light may be relatively reduced, and luminous intensity of green light may be relatively increased, and thus, luminous intensity ratios of red, green, and blue light may be easily adjusted to approach 3:6:1. Moreover, light emitting areas of the first, second, and third light emitting stacks 20, 30, and 40 may be about 10,000 $\mu m^2$ or less, and further, 4,000 $\mu m^2$ or less, furthermore, 2,500 $\mu m^2$ or less. In addition, as the light emitting stack is disposed closer to the substrate 11, the emitting area may become larger. As such, when the third light emitting stack 40 that emits green light is disposed closest to the substrate 11, the luminous intensity of green light may be further increased.

Hereinafter, although the second light emitting stack 30 is exemplarily described as emitting light of a shorter wavelength than that of the third light emitting stack 40, it should be noted that the second light emitting stack 30 in some exemplary embodiments emits light of a longer wavelength than that of the third light emitting stack 40, such as green light.

The first light emitting stack 20 includes a first conductivity type semiconductor layer 21, an active layer 23, and a second conductivity type semiconductor layer 25. According to an exemplary embodiment, the first light emitting stack 20 may include a semiconductor material such as AlGaAs, GaAsP, AlGaInP, and GaP that emits red light, but the inventive concepts are not limited thereto.

A first upper contact electrode 21n may be disposed on the first conductivity type semiconductor layer 21 and be in ohmic contact with the first conductivity type semiconductor layer 21. A first lower contact electrode 25p may be disposed under the second conductivity type semiconductor layer 25. According to an exemplary embodiment, a portion of the first conductivity type semiconductor layer 21 may be patterned and recessed, and the first upper contact electrode 21n may be disposed in the recessed region of the first conductivity type semiconductor layer 21 to increase an ohmic contact level. The first upper contact electrode 21n may have a single-layer structure or a multiple-layer structure, and may include Al, Ti, Cr, Ni, Au, Ag, Sn, W, Cu, or an alloy thereof, such as Au—Te alloy or Au—Ge alloy, but the inventive concepts are not limited thereto. In an exemplary embodiment, the first upper contact electrode 21n may have a thickness of about 100 nm, and may include metal having high reflectivity to increase light emission efficiency in a downward direction toward the substrate 11.

The second light emitting stack 30 includes a first conductivity type semiconductor layer 31, an active layer 33, and a second conductivity type semiconductor layer 35. According to an exemplary embodiment, the second light emitting stack 30 may include a semiconductor material, such as GaN, InGaN, ZnSe that emits blue light, but the inventive concepts are not limited thereto. A second lower contact electrode 35p is disposed under the second conductivity type semiconductor layer 35 of the second light emitting stack 30.

The third light emitting stack 40 includes a first conductivity type semiconductor layer 41, an active layer 43, and a second conductivity type semiconductor layer 45. According to an exemplary embodiment, the third light emitting stack 40 may include a semiconductor material, such as GaN, InGaN, GaP, AlGaInP, AlGaP, or the like that emits green light. A third lower contact electrode 45p is disposed on the second conductivity type semiconductor layer 45 of the third light emitting stack 40.

According to an exemplary embodiment, each of the first conductivity type semiconductor layers 21, 31, and 41 and the second conductivity type semiconductor layers 25, 35, and 45 of the first, second, and third light emitting stacks 20, 30, and 40 may have a single-layer structure or a multiple-layer structure, and in some exemplary embodiments, may include a superlattice layer. Moreover, the active layers 23, 33, and 43 of the first, second, and third light emitting stacks 20, 30, and 40 may have a single-quantum well structure or a multiple-quantum well structure.

Each of the first, second, and third lower contact electrodes 25p, 35p, and 45p may include a transparent conductive material that transmits light. For example, the lower contact electrodes 25p, 35p, and 45p may include transparent conductive oxide (TCO) such as SnO, $InO_2$, ZnO, ITO, ITZO, or the like, without being limited thereto.

A first adhesive layer 61 is disposed between the first light emitting stack 20 and the second light emitting stack 30, and a second adhesive layer 63 is disposed between the second light emitting stack 30 and the third light emitting stack 40. The first and second adhesive layers 61 and 63 may include a non-conductive material that transmits light. For example, the first and second adhesive layers 61 and 63 may include an optically clear adhesive (OCA), for example, epoxy, polyimide, SUB, spin-on-glass (SOG), benzocyclobutene (BCB), but the inventive concepts are not limited thereto.

According to the illustrated exemplary embodiment, a first insulation layer 81, a second insulation layer 83, and a third insulation layer 85 are disposed on at least portions of side surfaces of the first, second, and third light emitting stacks 20, 30, and 40. At least one of the first, second, and third insulation layers 81, 83, and 85 may include various organic or inorganic insulating materials, such as polyimide, $SiO_2$, $SiN_x$, $Al_2O_3$, or the like. For example, at least one of the first, second, and third insulation layers 81, 83, and 85 may include a distributed Bragg reflector (DBR). As another example, at least one of the first, second, and third insulation layers 81, 83, and 85 may include a black organic polymer. In some exemplary embodiments, an electrically floating metal reflection layer may be disposed on the first, second, and third insulation layers 81, 83, and 85 and reflect light emitted from the light emitting stacks 20, 30, and 40 toward the substrate 11. In some exemplary embodiments, at least one of the first, second, and third insulation layers 81, 83, and 85 may have a single-layer structure or a multiple-layer structure formed of two or more insulation layers having different refractive indices.

According to an exemplary embodiment, each of the first, second, and third light emitting stacks 20, 30, and 40 may be driven independently. More particularly, a common voltage may be applied to one of the first and second conductivity type semiconductor layers of each of the light emitting stacks, and an individual emission signal may be applied to the remaining one of the first and second conductivity type semiconductor layers of each of the light emitting stacks. For example, according to an exemplary embodiment, the first conductivity type semiconductor layers 21, 31, and 41 of each of the light emitting stacks 20, 30, and 40 may be n-type, and the second conductivity type semiconductor layers 25, 35, and 45 of each of the light emitting stacks 20, 30, and 40 may be p-type. In this case, the third light emitting stack 40 may have a stacked sequence that is opposite to those of the first light emitting stack 20 and the second light emitting stack 30, and thus, the p-type semiconductor layer 45 may be disposed on the active layer 43 to simplify processes of manufacturing the light emitting device 100. Hereinafter, the first conductivity type and the second conductivity type semiconductor layers will exemplarily be described as n-type and p-type, respectively. However, in some exemplary embodiments, the n-type and p-type may be reversed.

Each of the first, second, and third lower contact electrodes 25p, 35p, and 45p that are connected to the p-type semiconductor layers 25, 35, and 45 of the light emitting stacks, respectively, may be electrically connected to the first, second, and third connection electrodes 20ce, 30ce, and 40ce to receive corresponding light emission signals, respectively. Meanwhile, the n-type semiconductor layers 21, 31, and 41 of the light emitting stacks may be commonly electrically connected to the fourth connection electrode 50ce. As such, the light emitting device 100 may have a common n-type light emitting stack structure, in which the n-type semiconductor layers 21, 31, and 41 of the first, second, and third light emitting stacks 20, 30, and 40 are commonly connected, and may be driven independently from one another. Since the light emitting device 100 has the common n-type light emitting structure, sources of voltages applied to the first, second, and third light emitting stacks 20, 30, and 40 may be set to be different from one another.

The light emitting device 100 according to the illustrated exemplary embodiment has the common n-type structure, but the inventive concepts are not limited thereto. For example, in some exemplary embodiments, the first conductivity type semiconductor layers 21, 31, and 41 of each of the light emitting stacks may be p-type, and the second conductivity type semiconductor layer 25, 35, and 45 of each of the light emitting stacks may be n-type, and thus, a common p-type light emitting stack structure may be formed. In addition, in some exemplary embodiments, the stacked sequence of each of the light emitting stacks is not limited to that shown in the drawing, but may be variously modified. Hereinafter, the light emitting device 100 will exemplarily be described as having the common n-type light emitting stack structure.

According to the illustrated exemplary embodiment, the light emitting device 100 includes a first pad 20pd, a second pad 30pd, a third pad 40pd, and a fourth pad 50pd. The first pad 20pd is electrically connected to the first lower contact electrode 25p through a first contact hole 20CH defined through the first and second insulation layers 81 and 83. The first connection electrode 20ce is electrically connected to the first pad 20pd through a first through hole 20ct defined through the third insulation layer 85. The second pad 30pd is electrically connected to the second lower contact electrode 35p through a second contact hole 30CH defined through the first and second insulation layers 81 and 83. The second connection electrode 30ce is electrically connected to the second pad 30pd through a second through hole 30ct defined through the second insulation layer 83.

The third pad 40pd is electrically connected to the third lower contact electrode 45p through a third contact hole 40CH defined through the first and second insulation layers 81 and 83. The third connection electrode 40ce is electrically connected to the third pad 40pd through a third through hole 40ct defined through the second insulation layer 83. The fourth pad 50pd is electrically connected to the first conductivity type semiconductor layers 21, 31, and 41 of the first, second, and third light emitting stacks 20, 30, and 40 through a first sub-contact hole 50CHa, a second sub-contact hole 50CHb, and a third sub-contact hole 50CHc defined on the first conductivity type semiconductor layers 21, 31, and 41 of the first, second, and third light emitting stacks 20, 30, and 40. In particular, the first sub-contact hole 50CHa may expose the first upper contact electrode 21n, and the fourth pad 50pd may be connected to the first upper contact electrode 21n through the first sub-contact hole 50CHa. In this manner, the fourth pad 50pd may be electrically connected to the first conductivity type semiconductor layers 21, 31, and 41 through the sub-contact holes 50CHa, 50CHb, 50CHc, so that processes of manufacturing the light emitting device 100 may be simplified. The fourth connection electrode 50ce is electrically connected to the fourth pad 50pd through a fourth through hole 50ct defined through the second insulation layer 83.

In the illustrated exemplary embodiment, although each of the connection electrodes 20ce, 30ce, 40ce, and 50ce are shown and described as directly contacting the pads 20pd, 30pd, 40pd, and 50pd, in some exemplary embodiments, the connection electrodes 20ce, 30ce, 40ce, and 50ce may not be directly connected to the pads 20pd, 30pd, 40pd, and 50pd, and other connectors may be interposed therebetween.

The first, second, third, and fourth pads 20*pd*, 30*pd*, 40*pd*, and 50*pd* are spaced apart and insulated from one another. According to an exemplary embodiment, each of the first, second, third, and fourth pads 20*pd*, 30*pd*, 40*pd*, and 50*pd* may cover at least portions of side surfaces of the first, second, and third light emitting stacks 20, 30, and 40. In this manner, heat generated from the first, second, and third light emitting stacks 20, 30, and 40 may be easily dissipated.

According to the illustrated exemplary embodiment, each of the connection electrodes 20*ce*, 30*ce*, 40*ce*, and 50*ce* may have a substantially elongated shape that protrudes upward from the substrate 11. The connection electrodes 20*ce*, 30*ce*, 40*ce*, and 50*ce* may include metal, such as Cu, Ni, Ti, Sb, Zn, Mo, Co, Sn, Ag, or an alloy thereof, but the inventive concepts are not limited thereto. For example, each of the connection electrodes 20*ce*, 30*ce*, 40*ce*, and 50*ce* may include two or more metals or a plurality of different metal layers to reduce stress from the elongated shape of the connection electrodes 20*ce*, 30*ce*, 40*ce*, and 50*ce*. The connection electrodes 20*ce*, 30*ce*, 40*ce*, and 50*ce* may be formed of, for example, Cu which is advantageous in terms of deposition using plating and costs. Cu forms a natural oxide film, which can be removed by flux in a solder paste with a surface mounting technology using the solder paste. However, in the surface mounting technology using the solder paste, when a distance between the connection electrodes 20*ce*, 30*ce*, 40*ce*, and 50*ce* is less than about 50 μm, an electrical short may occur between the solder pastes. As such, the surface mounting technology may not be suitable for mounting the light emitting device 100.

As a method for bonding extremely small light emitting devices such as micro LEDs, eutectic bonding technology may be used. However, the natural oxide film on Cu may prevent the eutectic bonding and cause bonding failure.

As such, according to an exemplary embodiment, the bonding metal layers 20*cp*, 30*cp*, 40*cp*, and 50*cp* are disposed on the connection electrodes 20*ce*, 30*ce*, 40*ce*, and 50*ce*, respectively. Each of the connection electrodes 20*ce*, 30*ce*, 40*ce*, and 50*ce* may have a recessed region on an upper surface thereof, and the bonding metal layers 20*cp*, 30*cp*, 40*cp*, and 50*cp* may be disposed in the recessed regions of the connection electrodes 20*ce*, 30*ce*, 40*ce* and 50*ce* to protrude to the outside, respectively.

The bonding metal layers 20*cp*, 30*cp*, 40*cp*, and 50*cp* may be electrically connected to the connection electrodes 20*ce*, 30*ce*, 40*ce*, and 50*ce*, respectively, and further, may be formed of, for example, Au or Au/In, which can be bonded to a circuit board through eutectic bonding. In this case, a pad disposed on the circuit board may include, for example In or Sn. The bonding metal layers 20*cp*, 30*cp*, 40*cp*, and 50*cp* may be formed of In or Sn, however, it may be difficult to deposit In thick through plating technology, and it may be difficult to probe Sn to measure electrical characteristics of the light emitting device 100. Accordingly, by forming the bonding metal layers 20*cp*, 30*cp*, 40*cp*, and 50*cp* of Au, a bonding metal layer having a sufficient thickness may be formed, while facilitating the measurement of electrical characteristics of the light emitting device 100.

In some exemplary embodiments, a barrier layer may be interposed between the connection electrodes 20*ce*, 30*ce*, 40*ce*, and 50*ce* and the bonding metal layers 20*cp*, 30*cp*, 40*cp*, and 50*cp*. The barrier layer prevents the bonding metal layers 20*cp*, 30*cp*, 40*cp*, and 50*cp* from being mixed with the connection electrodes 20*ce*, 30*ce*, 40*ce*, and 50*ce*. This will be described in more detail later.

According to the illustrated exemplary embodiment, when the light emitting device 100 includes micro LEDs having a surface area of about 10,000 μm² or less, of about 4,000 μm², or less or about 2,500 μm² or less as known in the art, the connection electrodes 20*ce*, 30*ce*, 40*ce*, and 50*ce* may be overlapped with at least a portion of one of the first, second, and third light emitting stacks 20, 30, and 40 as shown in the drawing. More specifically, the connection electrodes 20*ce*, 30*ce*, 40*ce*, and 50*ce* may be overlapped with at least one step that is formed on the side surface of the light emitting stack structure. As such, since a lower surface of the connection electrode provides a larger contact area than an upper surface thereof, the connection electrode 20*ce*, 30*ce*, 40*ce*, and 50*ce* may be more stably formed on the light emitting stack structure than those of a conventional light emitting device.

In some exemplary embodiments, at least one of the connection electrodes 20*ce*, 30*ce*, 40*ce*, and 50*ce* may be overlapped with the side surface of each of the light emitting stacks 20, 30, and 40, and thus, the light emitting stacks 20, 30, and 40 may efficiently dissipate heat that is generated inside thereof. Further, when the connection electrodes 20*ce*, 30*ce*, 40*ce*, and 50*ce* include a reflective material such as metal, the connection electrodes 20*ce*, 30*ce*, 40*ce*, and 50*ce* may reflect light that is emitted from at least one or more of the light emitting stacks 20, 30, and 40, and thus, luminous efficiency may be improved.

Figure 5:
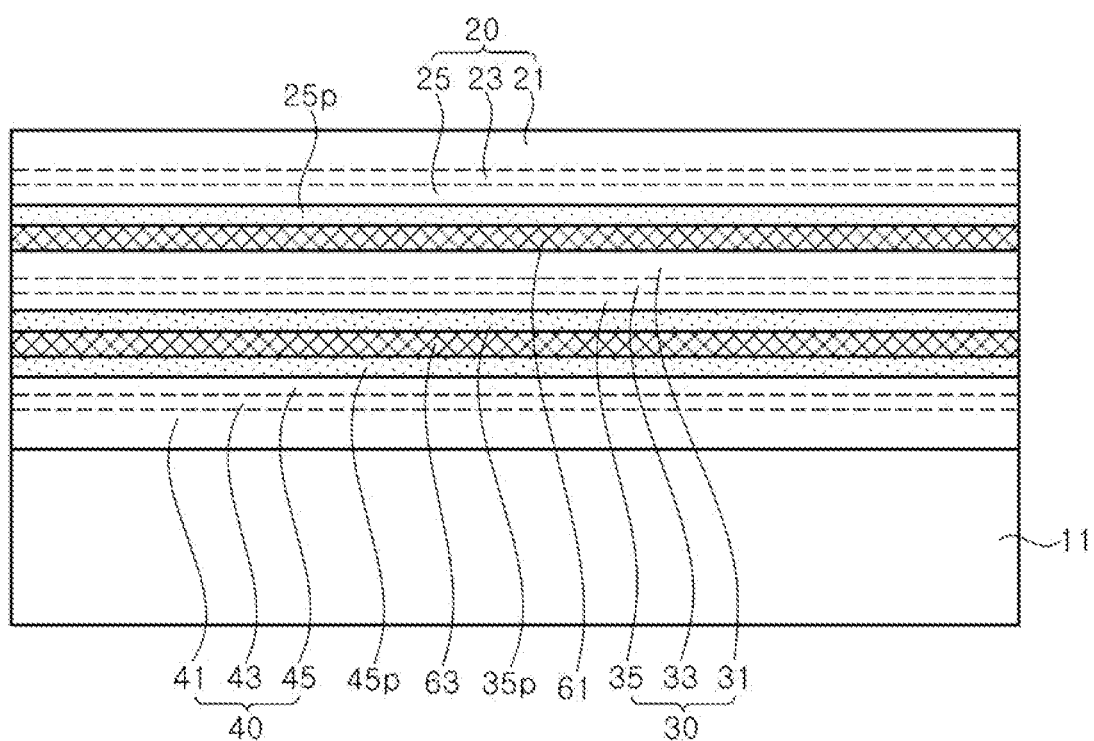
FIG. 5 is a schematic cross-sectional view of a light emitting stack structure according to an exemplary embodiment

FIG. 5 is a schematic cross-sectional view of a light emitting stack structure according to an exemplary embodiment. The above-described light emitting device 100 is formed by processing the light emitting stack structure.

Referring to FIG. 5, the light emitting stack structure includes a substrate 11, a first light emitting stack 20, a second light emitting stack 30, and a third light emitting stack 40. In addition, lower contact electrodes 25*p*, 35*p*, and 45*p* may be disposed on second conductivity type semiconductor layers 25, 35, and 45 of the light emitting stacks 20, 30, and 40, respectively.

A first conductivity type semiconductor layer 41, a third active layer 43, and a second conductivity type semiconductor layer 45 of the third light emitting stack 40 may be sequentially grown on a substrate 11 by, for example, a metal organic chemical vapor deposition (MOCVD) method or a molecular beam epitaxy (MBE) method. The third lower contact electrode 45*p* may be formed on the second conductivity type semiconductor layer 45 by, for example, a physical vapor deposition or chemical vapor deposition method, and may include transparent conductive oxide (TCO) such as SnO, $InO_2$, ZnO, ITO, ITZO, or the like. When the third light emitting stack 40 emits green light according to an exemplary embodiment, the substrate 11 may include $Al_2O_3$ (for example, a sapphire substrate), and the third lower contact electrode 45*p* may include transparent conductive oxide (TCO) such as tin oxide. The first and second light emitting stacks 20 and 30 may be similarly formed by sequentially growing a first conductivity type semiconductor layer, an active layer, and a second conductivity type semiconductor layer on a temporary substrate. Lower contact electrodes including transparent conductive oxide (TCO) may be formed by, for example, a physical vapor deposition or a chemical vapor deposition method on the second conductivity type semiconductor layer, respectively.

In an exemplary embodiment, the first light emitting stack 20 may be attached to the second light emitting stack 30 through a first adhesive layer 61, and the second light emitting stack 30 may be attached to the third light emitting stack 40 through a second adhesive layer 63. For example, after the third light emitting stack 40 is grown on the substrate 11, the second light emitting stack 30 grown on the temporary substrate may be attached to the third light emitting stack 40 through the second adhesive layer 63. The temporary substrate on the second light emitting stack 30 may then be removed. Subsequently, the first light emitting stack 20 grown on another temporary substrate may be attached on the second light emitting stack 30 through the first adhesive layer 61. The temporary substrate on the first light emitting stack 20 may then be removed from the first light emitting stack 20.

In another exemplary embodiment, the first and second light emitting stacks 20 and 30 may be bonded to each other with the first adhesive layer 61 interposed therebetween, and at least one of the temporary substrates of the first and second light emitting stacks 20 and 30 may be removed by a laser lift-off process, a chemical process, a mechanical process, or the like. The first and second light emitting stacks 20 and 30 may then be coupled to the third light emitting stack 40 with the second adhesive layer 63 interposed therebetween, and the remaining temporary substrate of the first and second light emitting stacks 20 and 30 may then be removed by the laser lift-off process, the chemical process, the mechanical process, or the like.

Since the first, second, and third light emitting stacks 20, 30, and 40, the first, second, and third lower contact electrodes 25p, 35p, and 45p, and the adhesive layers 61 and 63 are the same as those already described above, repeated detailed descriptions thereof will be omitted to avoid redundancy.

Hereinafter, a method of manufacturing the light emitting device 100 using the light emitting stack structure of FIG. 5 will be described in detail.

FIGS. 6A, 7A, 8A, 9A, 10A, 11A, 12A, 13A, 14A, 15A, 16A, and 17A are plan views illustrating a process of manufacturing a light emitting device according to an exemplary embodiment. FIGS. 6B, 7B, 8B, 9B, 10B, 11B, 12B, 13B, 14B, 15B, 16B, and 17B are schematic cross-sectional views taken along line A-A' of the corresponding plan views shown in FIGS. 6A, 7A, 8A, 9A, 10A, 11A, 12A, 13A, 14A, 15A, 16A, and 17A, respectively. FIGS. 6C, 7C, 8C, 9C, 10C, 11C, 12C, 13C, 14C, 15C, 16C, and 17C are schematic cross-sectional views taken along line B-B' of the corresponding plan views shown in FIGS. 6A, 7A, 8A, 9A, 10A, 11A, 12A, 13A, 14A, 15A, 16A, and 17A, respectively.

Figure 6A:
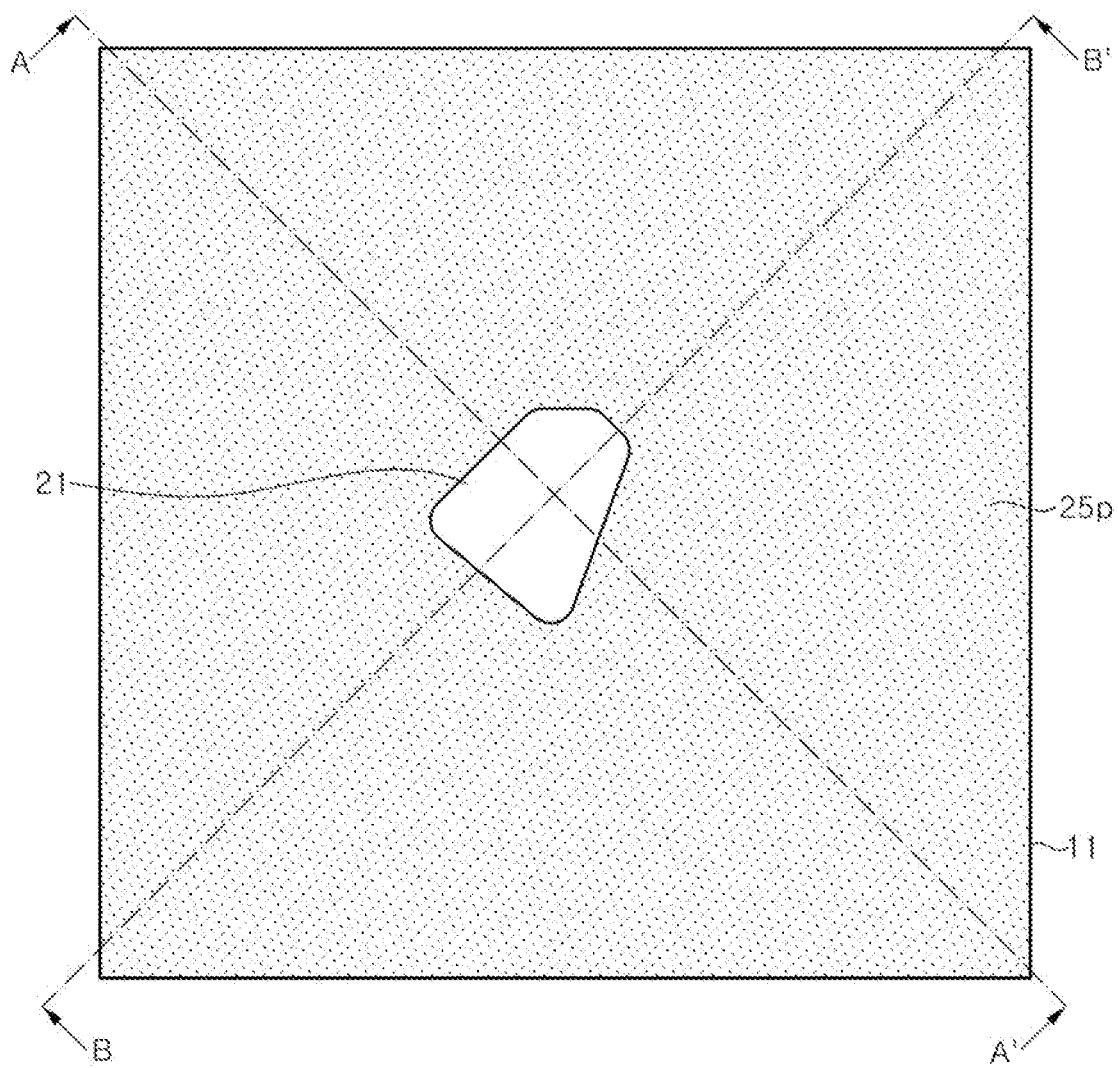
FIGS. 6A, 7A, 8A, 9A, 10A, 11A, 12A, 13A, 14A, 15A, 16A, and 17A are plan views illustrating a process of manufacturing a light emitting device according to an exemplary embodiment.
Figure 6B:
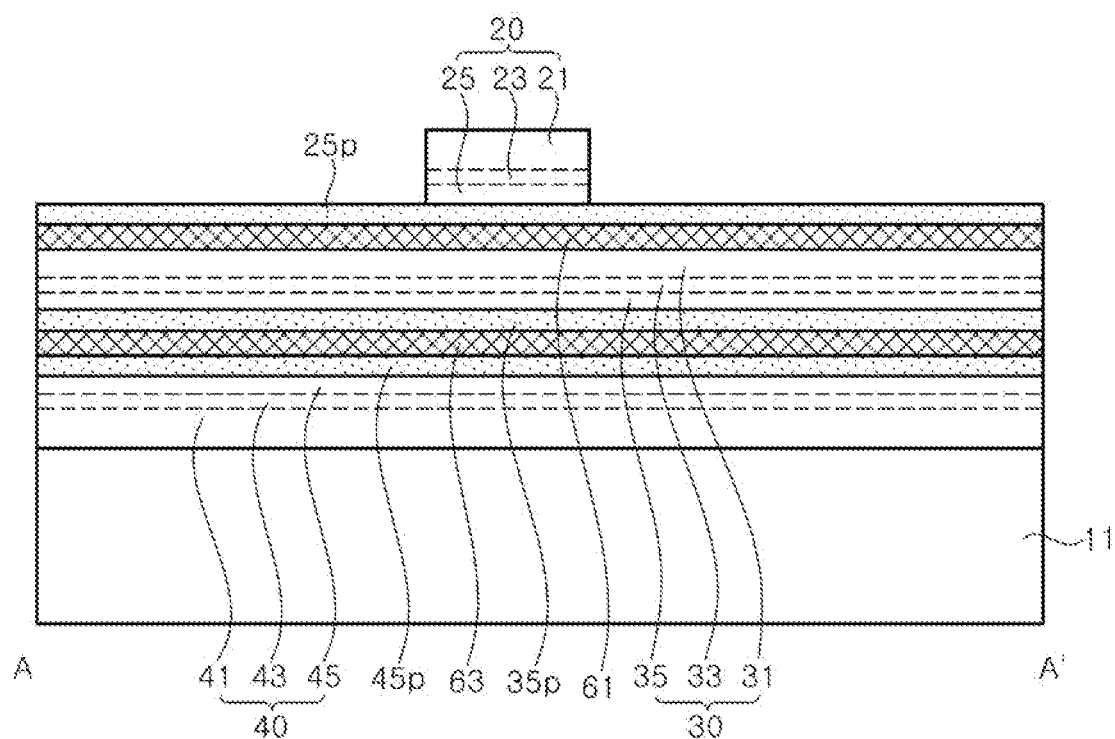
FIGS. 6B, 7B, 8B, 9B, 10B, 11B, 12B, 13B, 14B, 15B, 16B, and 17B are schematic cross-sectional views taken along line A-A' of FIGS. 6A, 7A, 8A, 9A, 10A, 11A, 12A, 13A, 14A, 15A, 16A, and 17A, respectively.
Figure 6C:
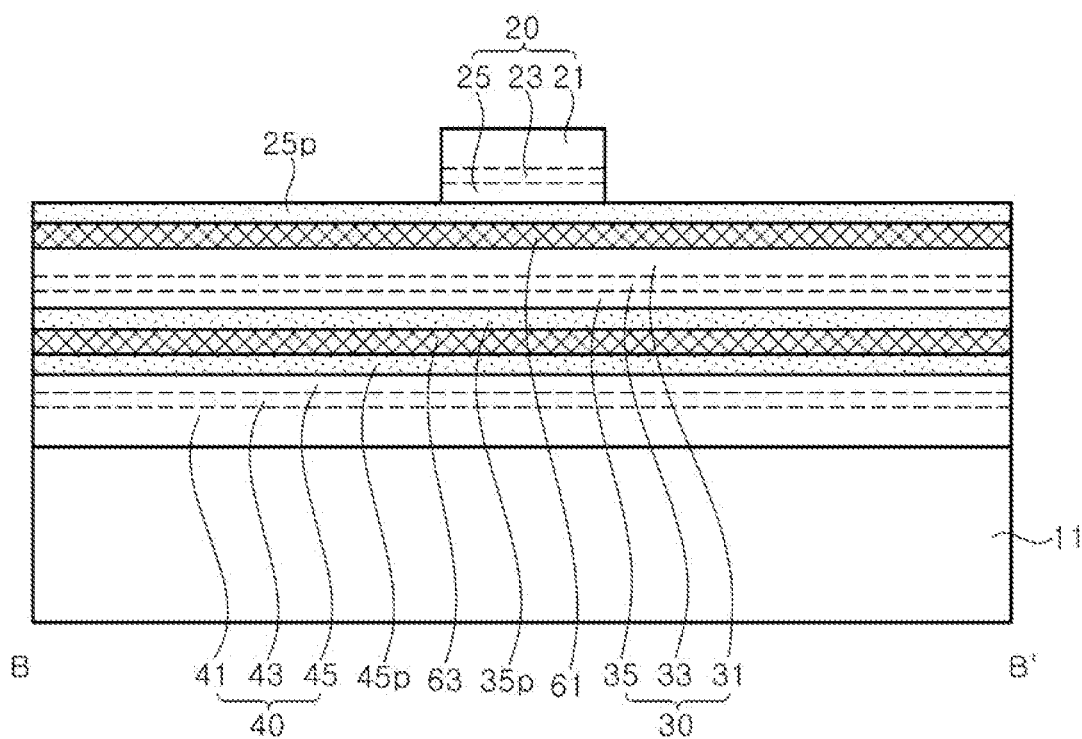
FIGS. 6C, 7C, 8C, 9C, 10C, 11C, 12C, 13C, 14C, 15C, 16C, and 17C are schematic cross-sectional views taken along line B-B' of FIGS. 6A, 7A, 8A, 9A, 10A, 11A, 12A, 13A, 14A, 15A, 16A, and 17A, respectively.

Referring to FIGS. 6A, 6B, and 6C, the first lower contact electrode 25p is exposed by patterning the first conductivity type semiconductor layer 21, the active layer 23, and the second conductivity type semiconductor layer 25. The first conductivity type semiconductor layer 21, the active layer 23, and the second conductivity type semiconductor layer 25 may be patterned using photolithography and etching processes. The photolithography process may be carried out using a first mask, and for example, the first conductivity type semiconductor layer 21, the active layer 23, and the second conductivity type semiconductor layer 25 may be etched using a dry etching technique. After patterning, the first light emitting stack 20 surrounded by the exposed lower contact electrode 25p may be formed. Although one first light emitting stack 20 is exemplarily shown in the drawings, the first light emitting stack 20 may be patterned in each of light emitting device regions of the substrate 11.

The first light emitting stack 20 may be disposed in a central portion of the light emitting device region, but the inventive concepts are not limited thereto. A planar shape of the first light emitting stack 20 may have an elongated shape along one diagonal direction, but the inventive concepts are not limited thereto.

According to an exemplary embodiment, the first lower contact electrode 25p may be a transparent electrode, and the second conductivity type semiconductor layer 25 may be a p-type semiconductor layer. The first conductivity type semiconductor layer 21 may be disposed on an upper surface of the first light emitting stack 20, and the first conductivity type semiconductor layer 21 may be an n-type semiconductor layer.

Figure 7A:
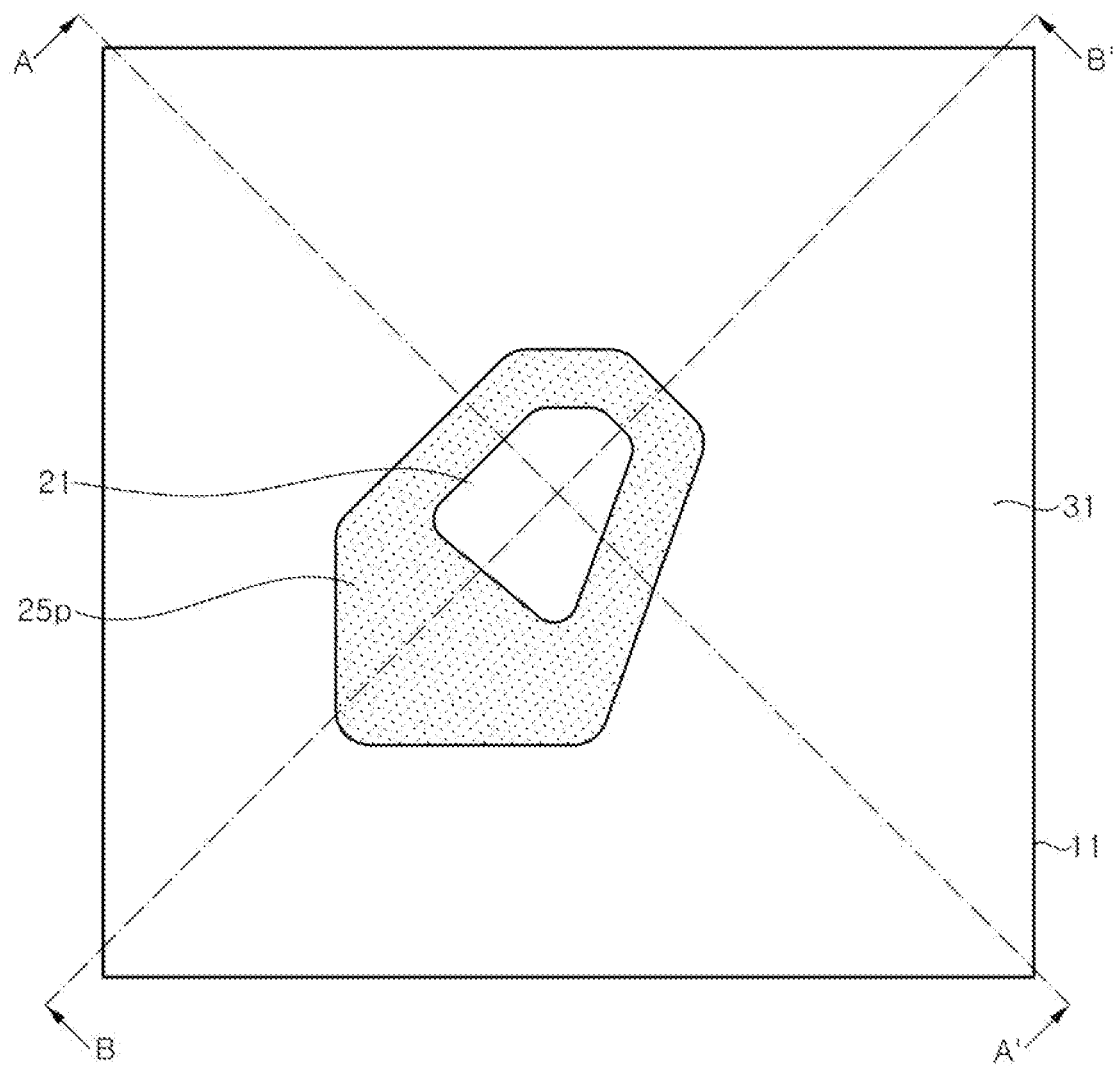
Figure 7B:
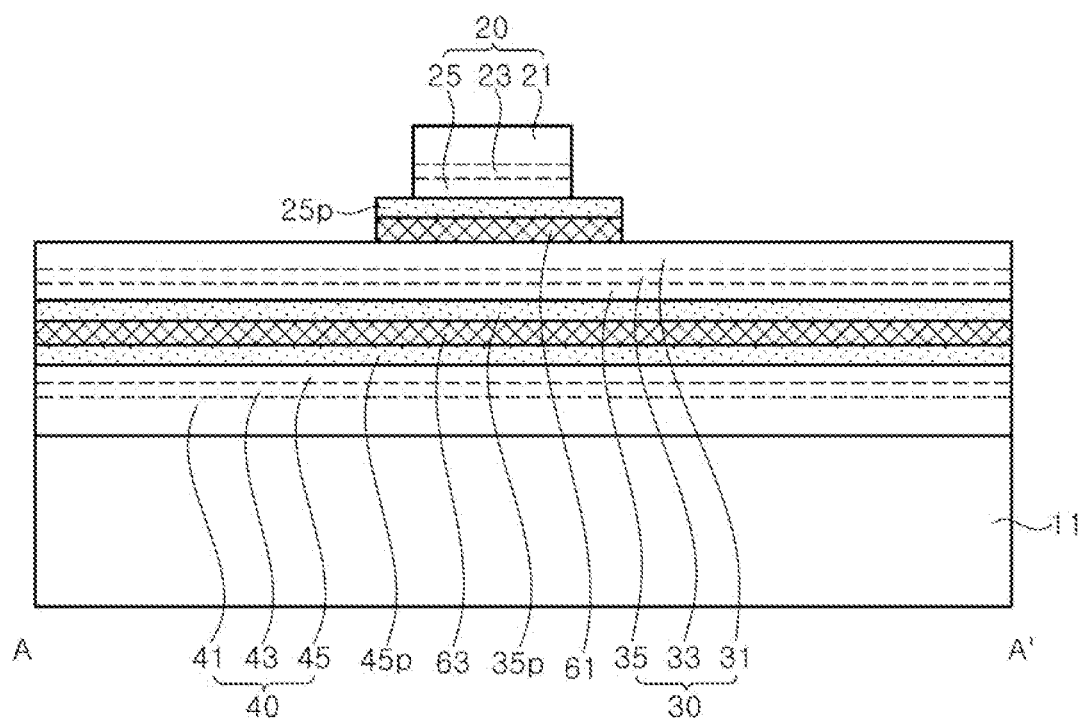
Figure 7C:
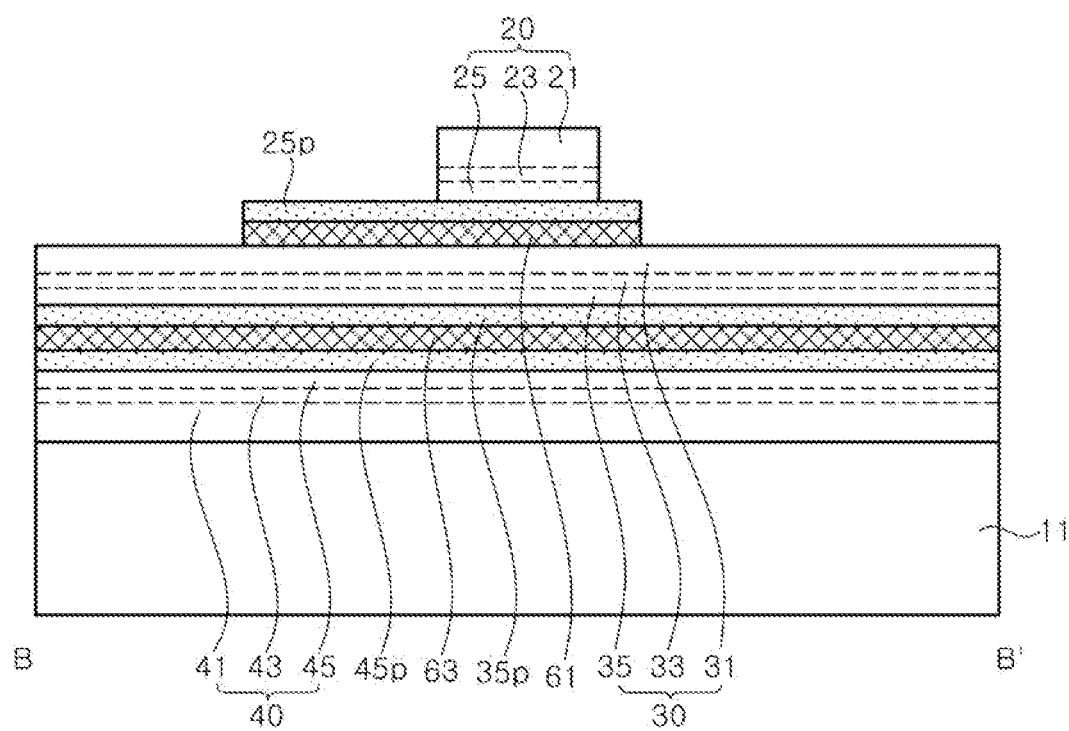

Referring to FIGS. 7A, 7B, and 7C, the first lower contact electrode 25p is patterned so that a portion of the first lower contact electrode 25p surrounds the first light emitting stack 20. The first lower contact electrode 25p may be patterned using a second mask. In this case, the first adhesive layer 61 may also be patterned together with the first lower contact electrode 25p. Accordingly, the first conductivity type semiconductor layer 31 may be exposed around the first lower contact electrode 25p.

Figure 8A:
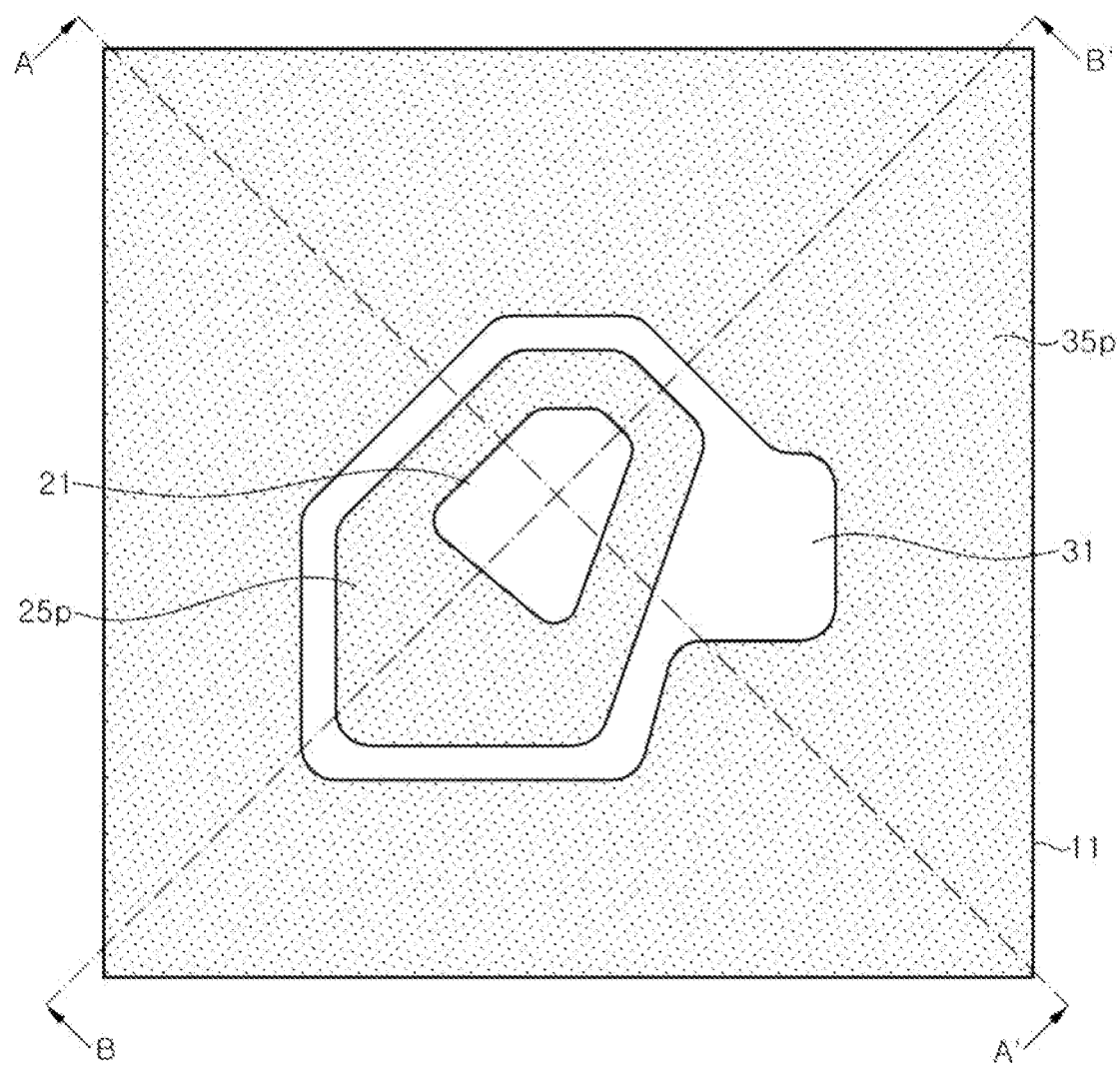
Figure 8B:
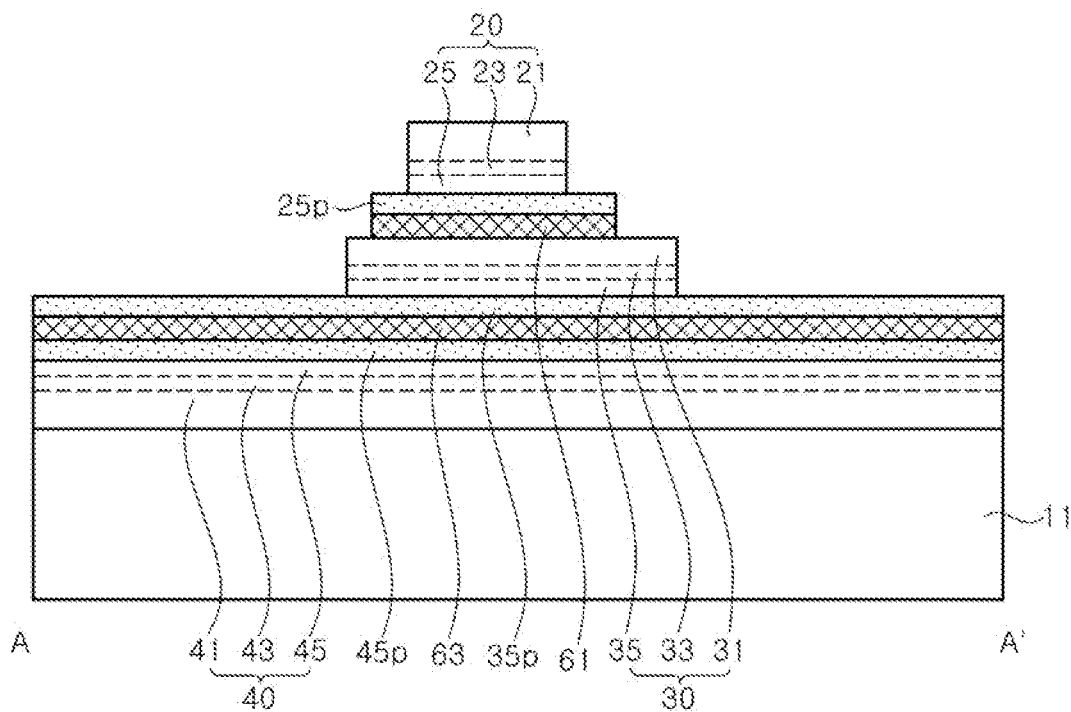
Figure 8C:
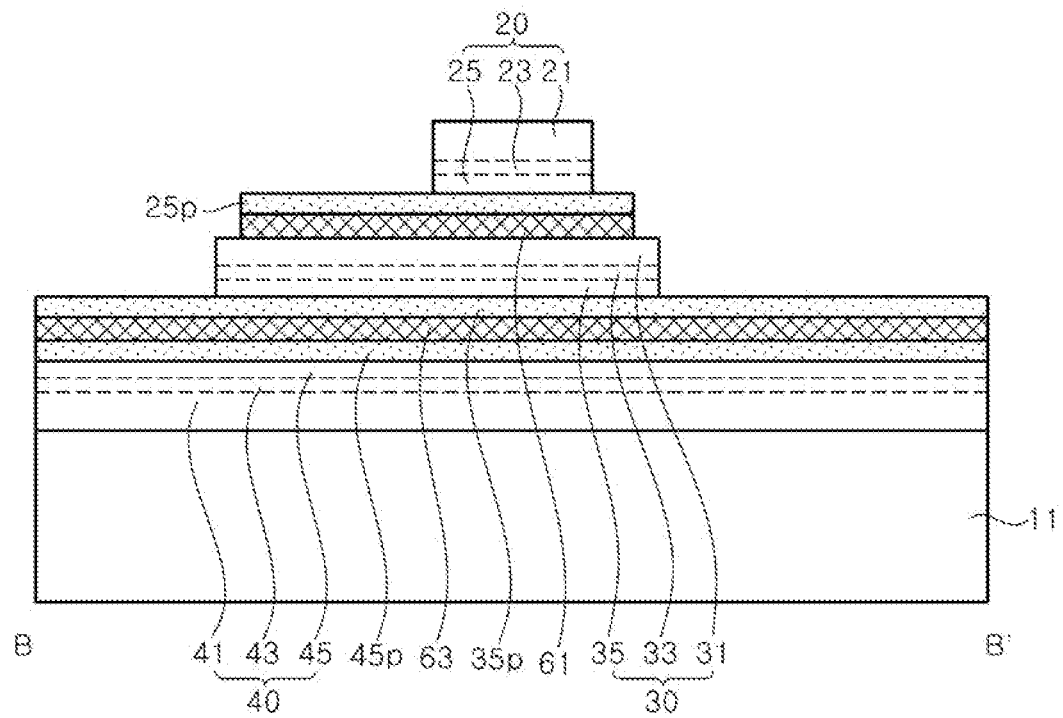

Referring to FIGS. 8A, 8B, and 8C, the second lower contact electrode 35p is exposed by patterning the first conductivity type semiconductor layer 31, the active layer 33, and the second conductivity type semiconductor layer 35. The first conductivity type semiconductor layer 31, the active layer 33, and the second conductivity type semiconductor layer 35 may be patterned using photolithography and etching processes. The photolithography process may be carried out using a third mask, and for example, the first conductivity type semiconductor layer 31, the active layer 33, and the second conductivity type semiconductor layer 35 may be etched using a dry etching technique. After patterning, the second light emitting stack 30 surrounded by the exposed second lower contact electrode 35p may be formed.

Figure 9A:
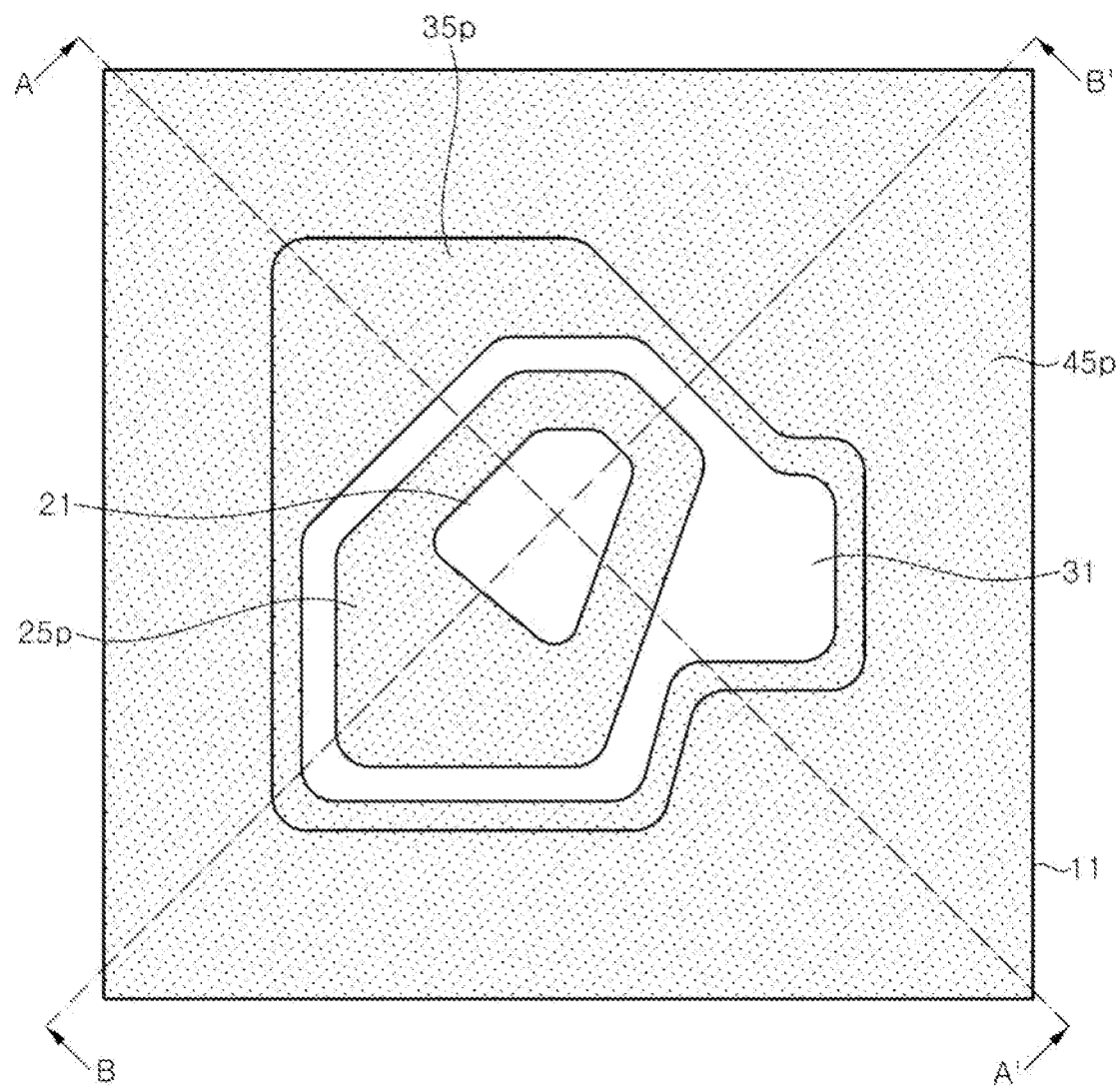
Figure 9B:
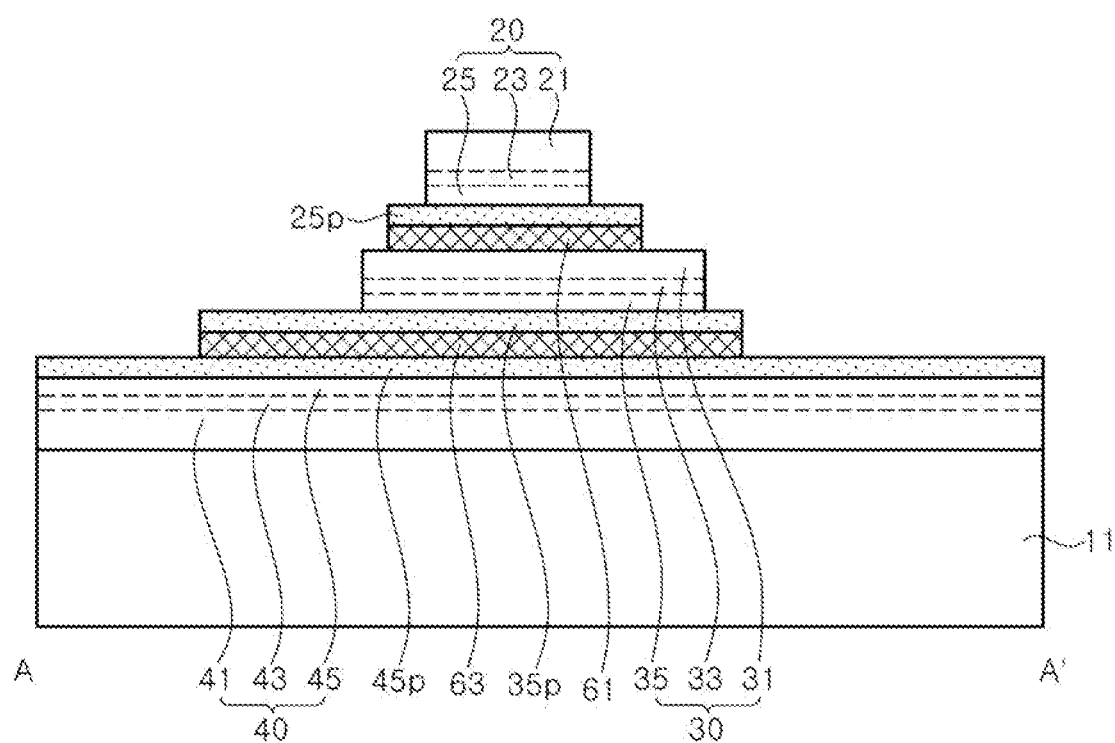
Figure 9C:
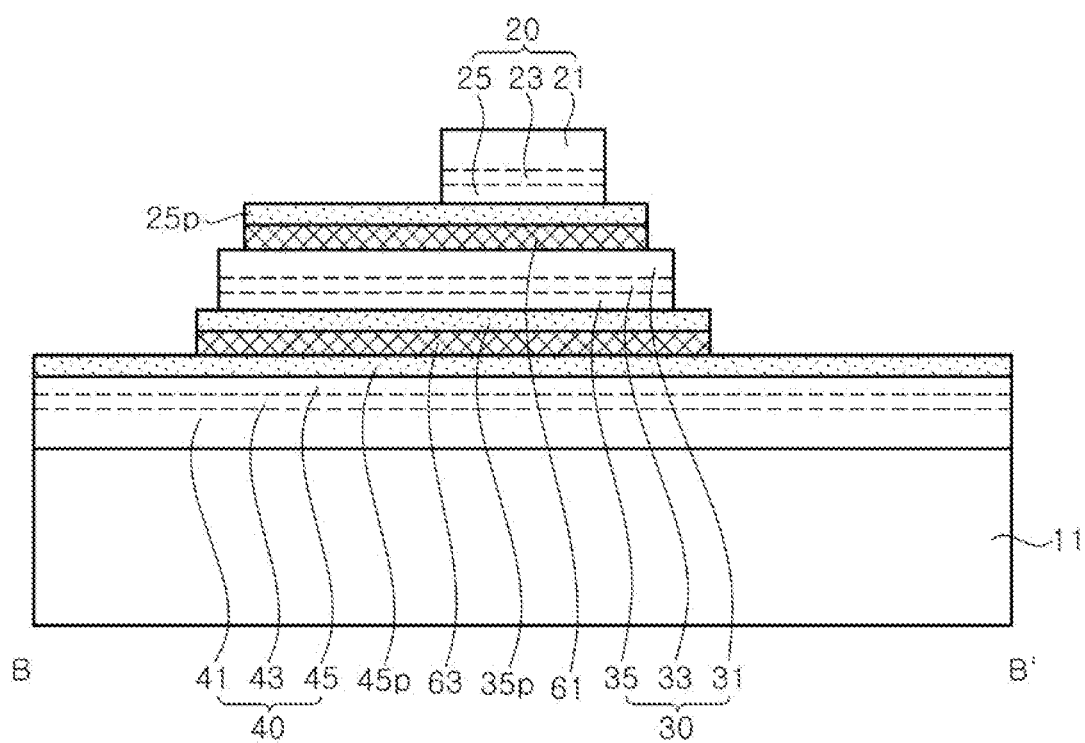

Referring to FIGS. 9A, 9B, and 9C, the second lower contact electrode 35p is patterned so that a portion of the second lower contact electrode 35p surrounds the second light emitting stack 30. The second lower contact electrode 35p may be patterned using a fourth mask. In this case, the second adhesive layer 63 may also be patterned together with the second lower contact electrode 35p. Accordingly, the third lower contact electrode 45p may be exposed around the second lower contact electrode 35p.

Figure 10A:
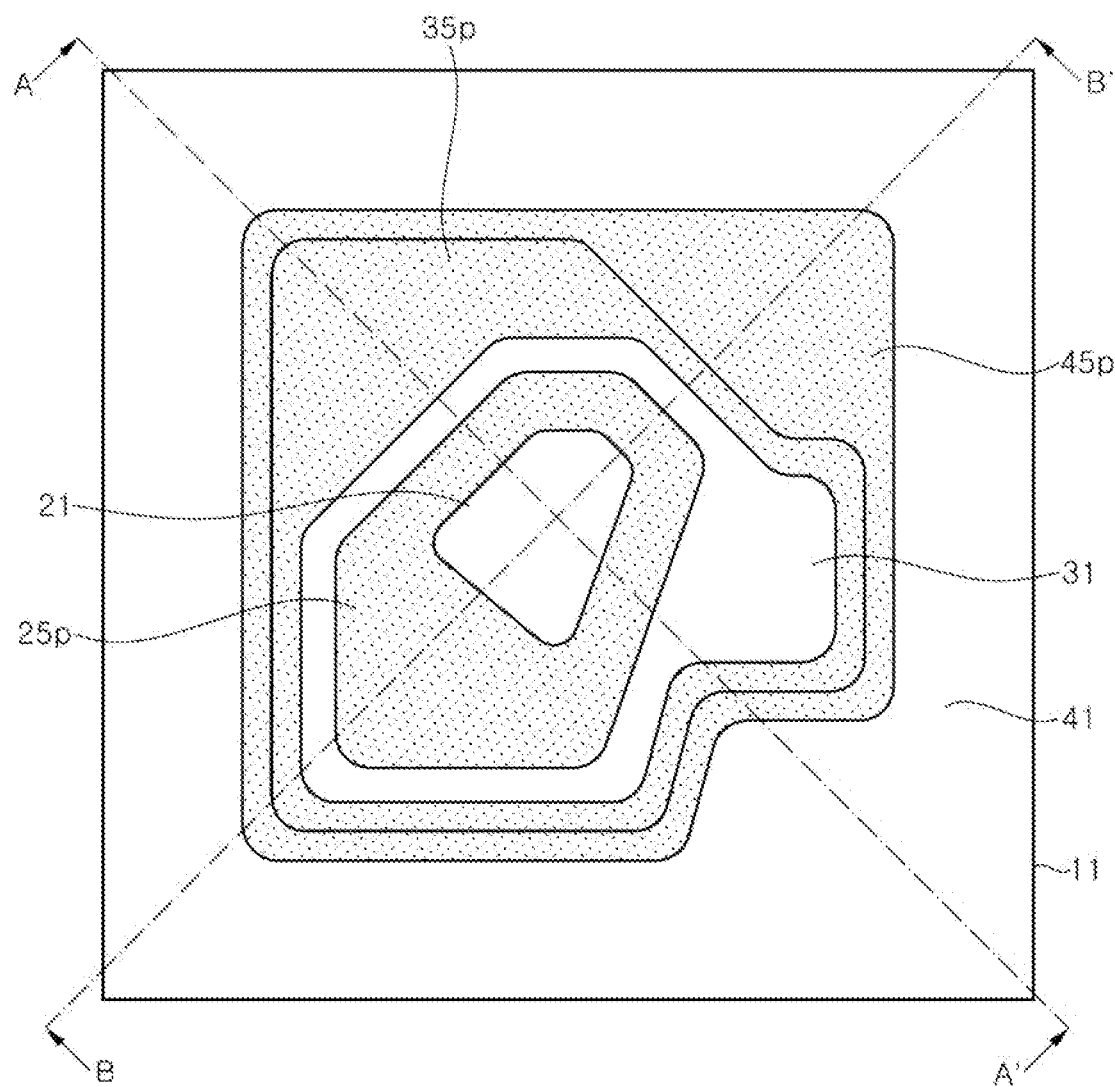
Figure 10B:
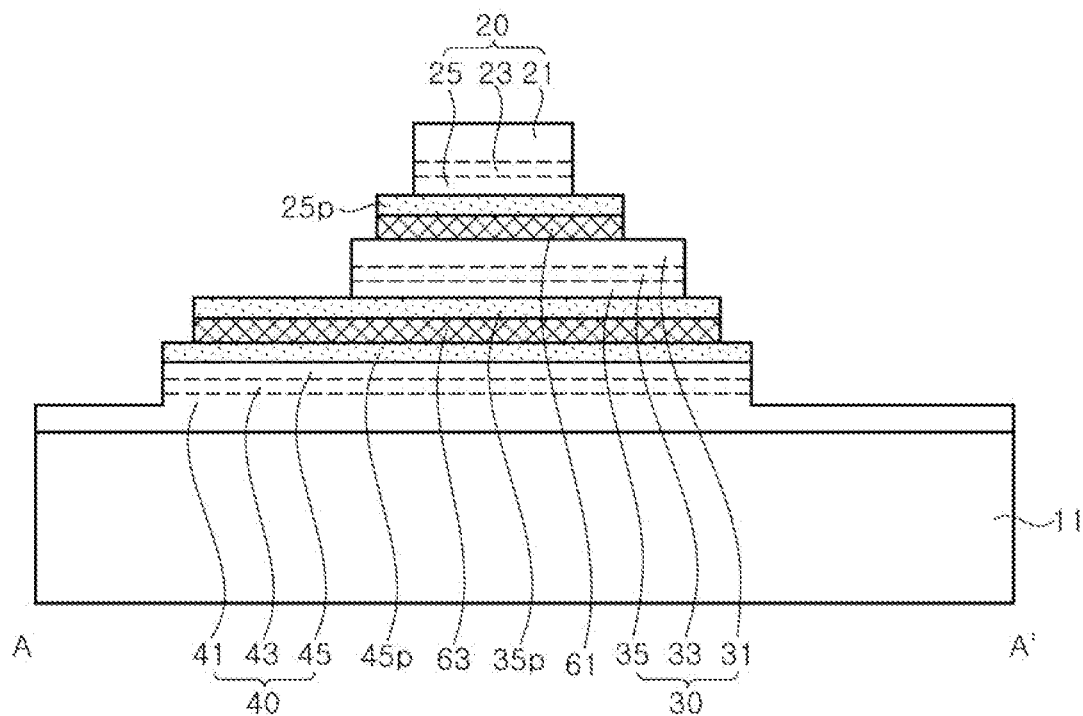
Figure 10C:
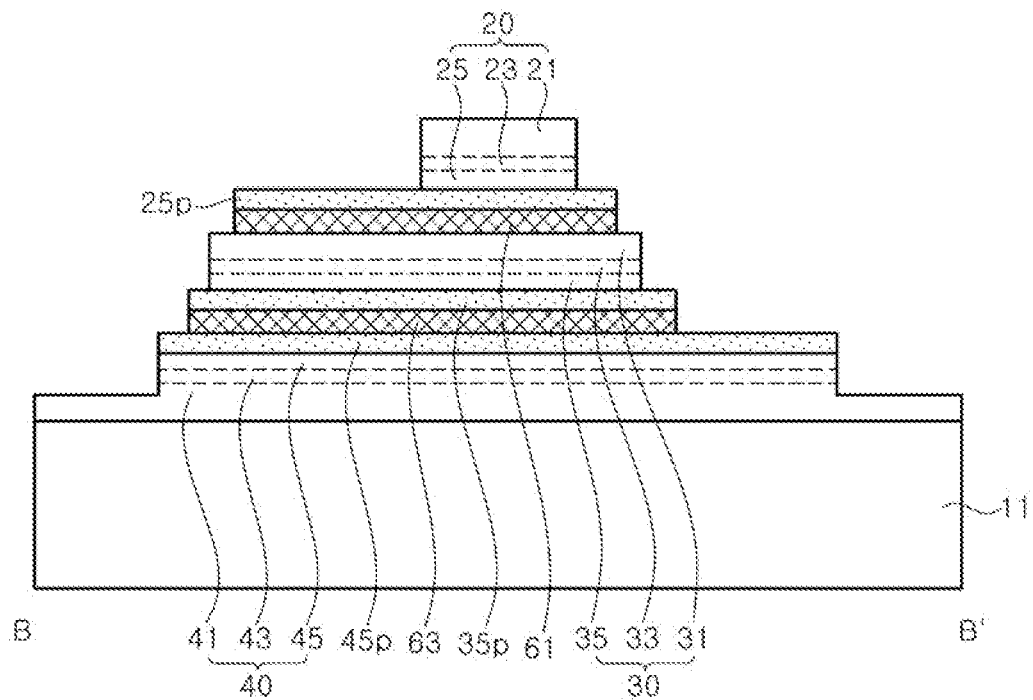

Referring to FIGS. 10A, 10B, and 10C, the third lower contact electrode 45p is patterned so that the third lower contact electrode 45p surrounds the second lower contact electrode 35p. The third lower contact electrode 45p may be patterned using a fifth mask. Further, the first conductivity type semiconductor layer 41 may be exposed by patterning the second conductivity type semiconductor layer 45 and the active layer 43. For example, the third lower contact electrode 45p may be etched using a wet etching technique, and the second conductivity type semiconductor layer 45 and the active layer 43 may be etched using a dry etching technique. Accordingly, the first conductivity type semiconductor layer 41 is exposed around the third lower contact electrode 45p.

According to the illustrated exemplary embodiment, the first light emitting stack 20 has the smallest area among the light emitting stacks 20, 30, and 40, and the third light emitting stack 40 may have the largest area among the light emitting stacks 20, 30, and 40. In this manner, luminance intensity of the third light emitting stack 40 may be relatively increased. However, the inventive concepts are not particularly limited to the relative sizes of the light emitting stacks 20, 30, and 40.

Figure 11A:
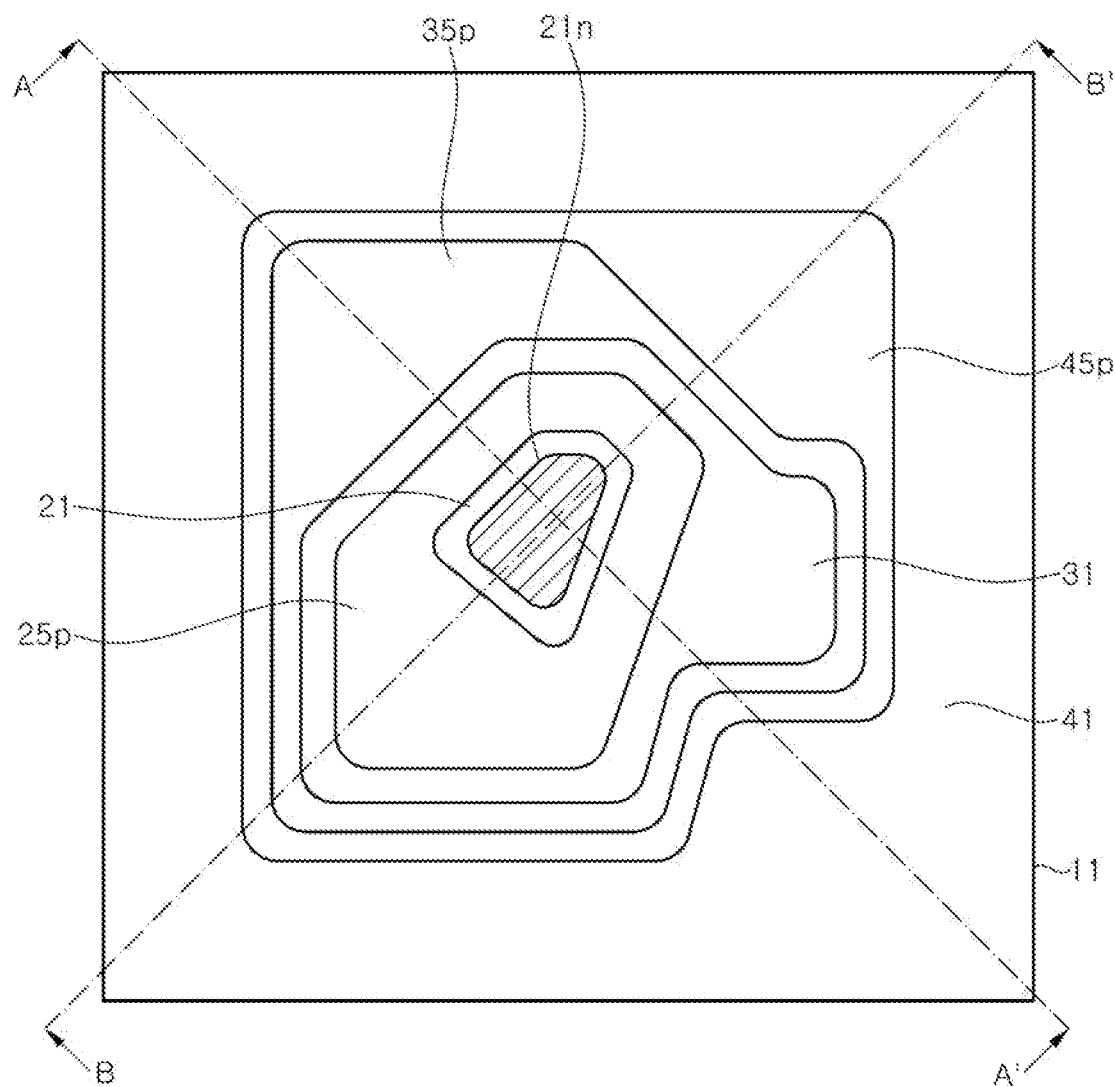
Figure 11B:
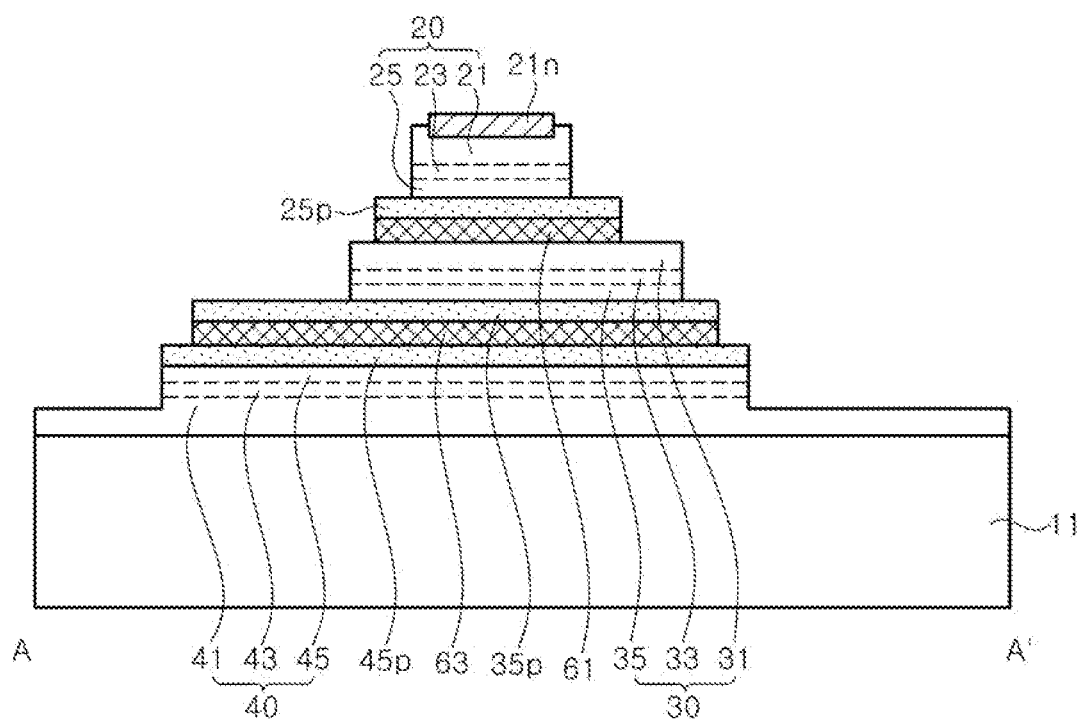
Figure 11C:
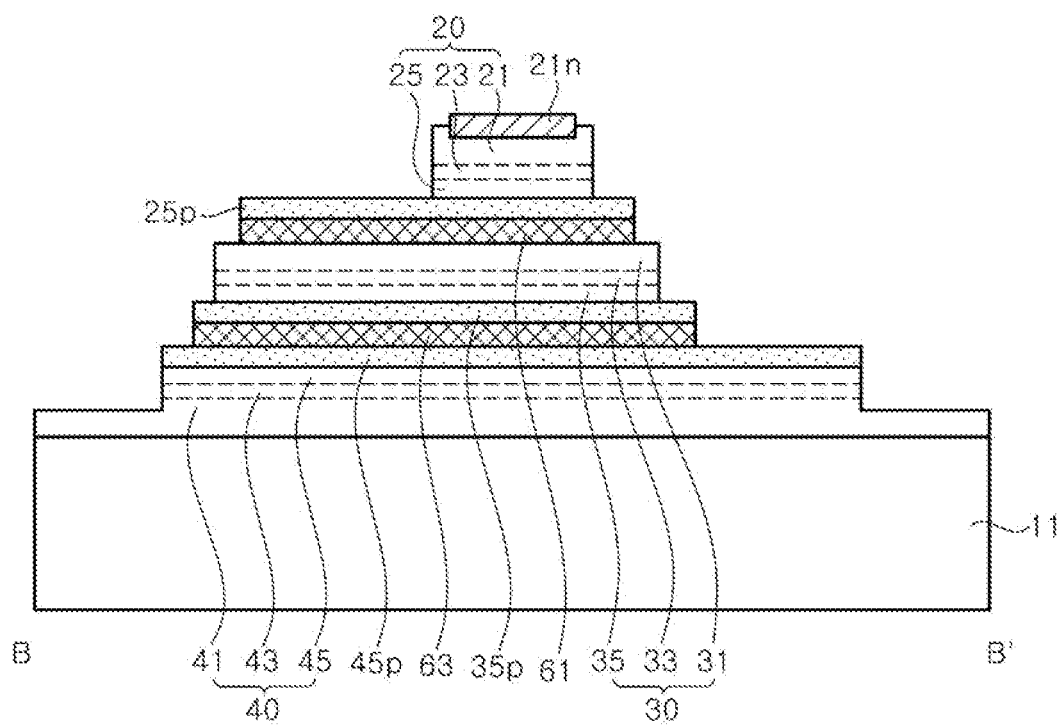

Referring to FIGS. 11A, 11B, and 11C, a portion of an upper surface of the first conductivity type semiconductor layer 21 of the first light emitting stack 20 may be patterned through wet etching to form a first upper contact electrode 21n. The first conductivity type semiconductor layer 21 may be, for example, an n$^{++}$ GaAs layer, and a portion of an upper surface of the n$^{++}$ GaAs layer may be recessed through wet etching.

A first upper contact electrode 21n is formed in the recessed region of the first conductivity type semiconductor layer 21. The first upper contact electrode 21n may be formed of, for example, AuGe/Ni/Au/Ti, which may have a thickness of, for example, 100 nm/25 nm/100 nm/10 nm. By partially removing the surface of the n$^{++}$ GaAs layer, and forming the first upper contact electrode 21n in the recessed region to contact the first conductivity type semiconductor layer 21, ohmic contact characteristics may be improved.

Figure 12A:
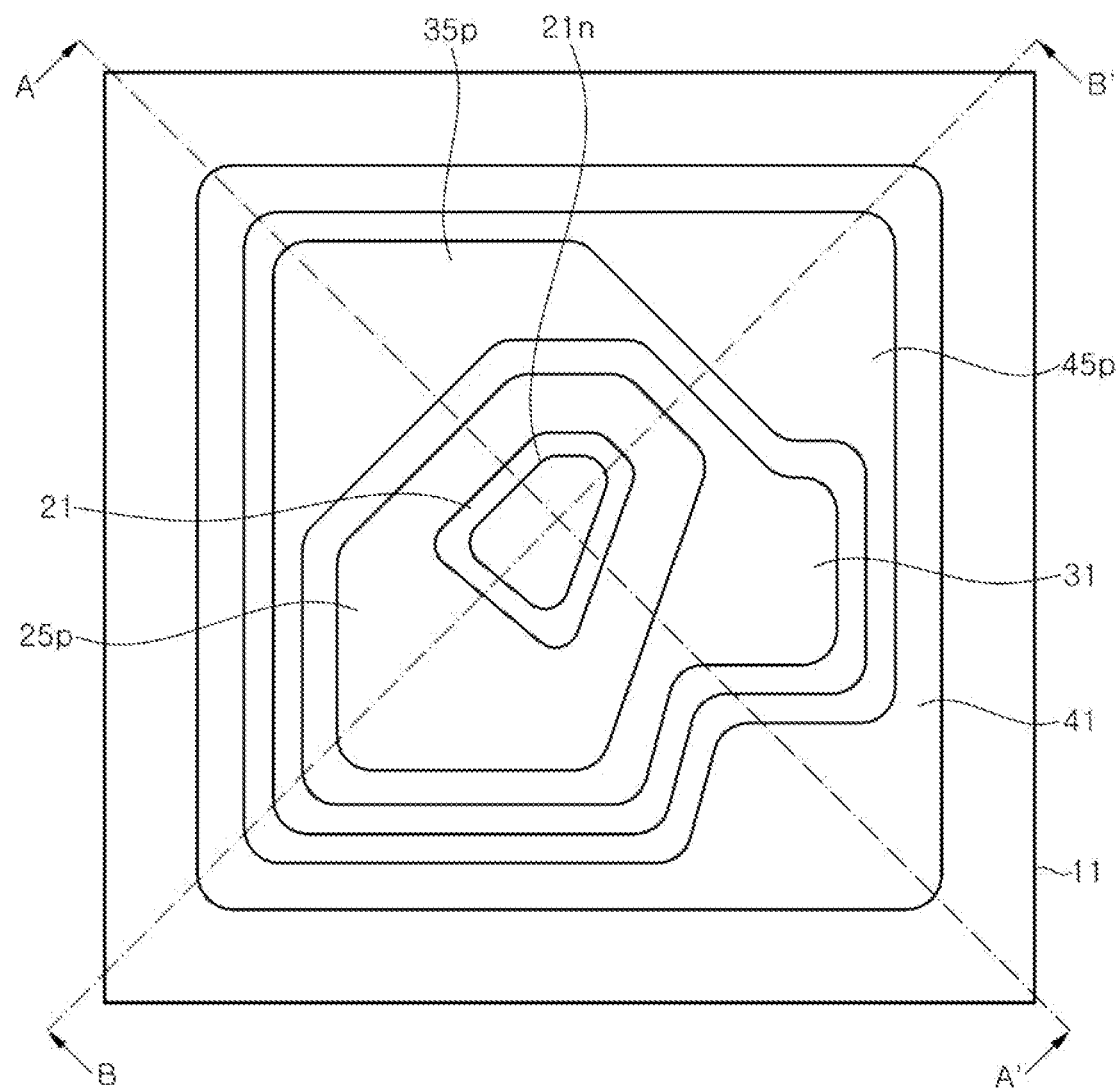
Figure 12B:
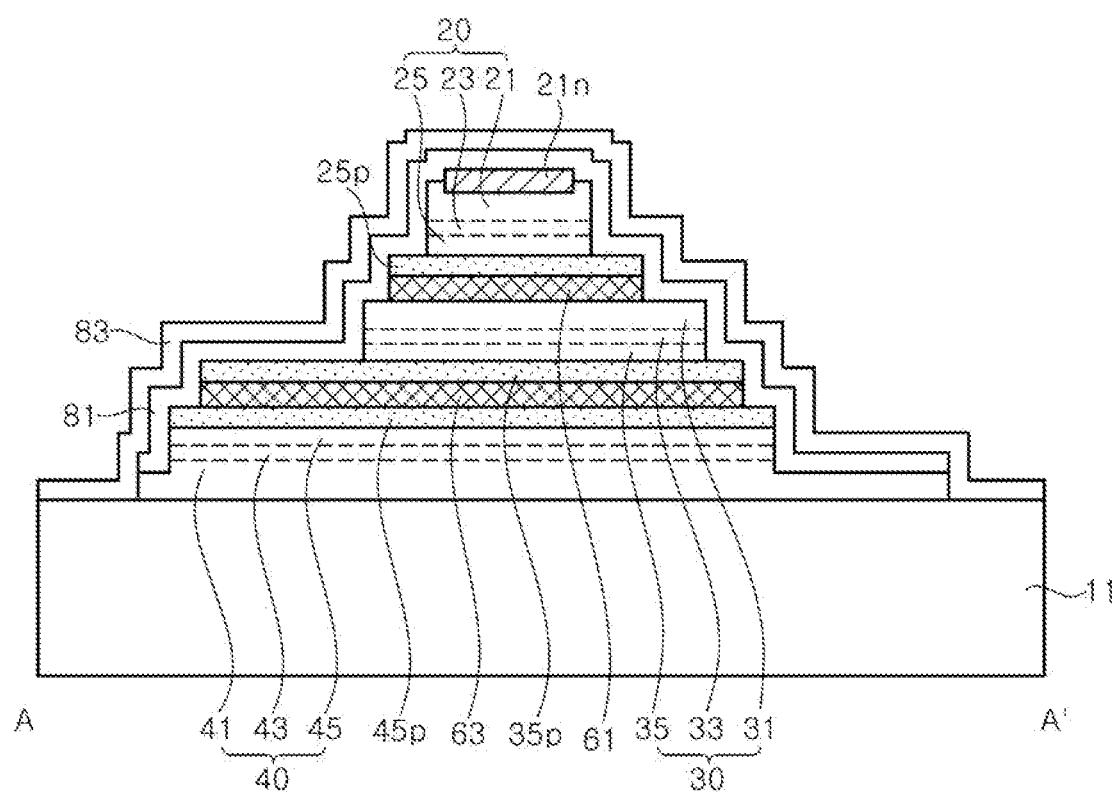
Figure 12C:
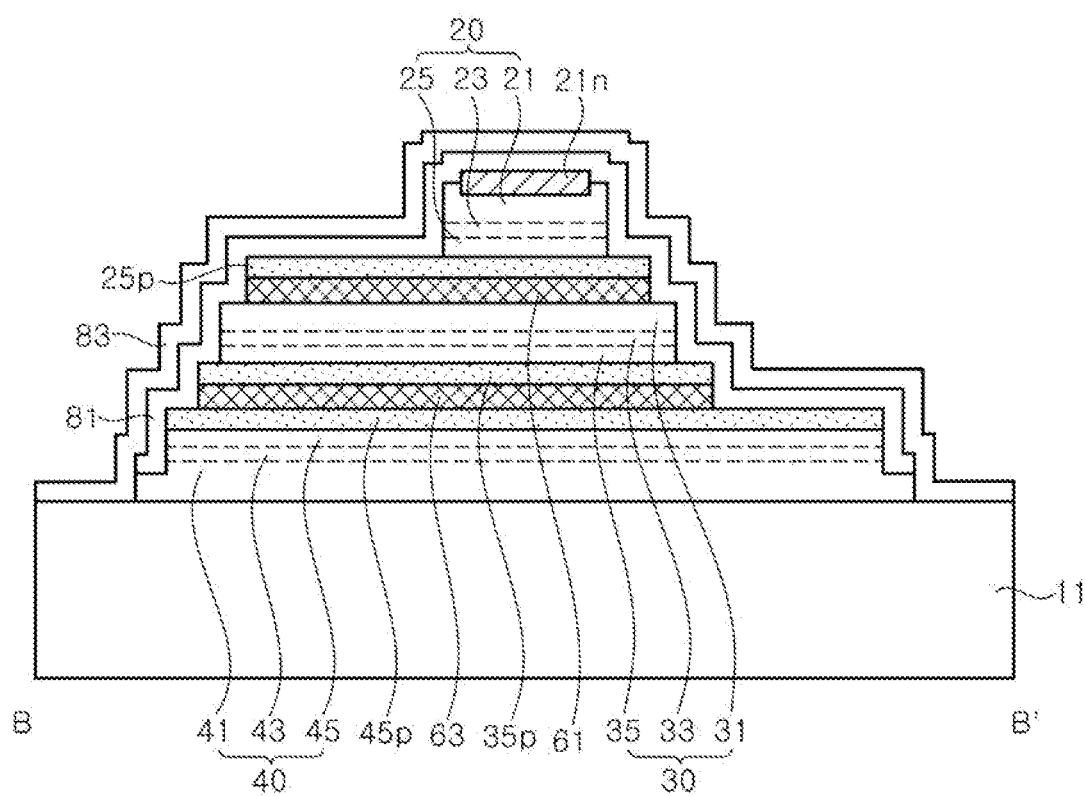

Referring to FIGS. 12A, 12B, and 12C, a first insulation layer 81 covering the light emitting stacks 20, 30, and 40 is formed. The first insulation layer 81 may also cover the first upper contact electrode 21n. The first insulation layer 81 may be formed of, for example, SiN$_x$, SiO$_2$, Al$_2$O$_3$, or the like to have a thickness of about 4000 Å.

Subsequently, the first insulation layer 81 and the first conductivity type semiconductor layer 41 may be patterned to form an isolation region for separating the light emitting device regions. Accordingly, an upper surface of the substrate 11 may be exposed around the first conductivity type semiconductor layer 41.

A second insulation layer 83 may then be formed on the first insulation layer 81. The second insulation layer 83 may cover a side surface of the first conductivity type semiconductor layer 41 to protect the first conductivity type semiconductor layer 41. The second insulation layer 83 may be formed of SiN$_x$, SiO$_2$, Al$_2$O$_3$, or the like.

Figure 13A:
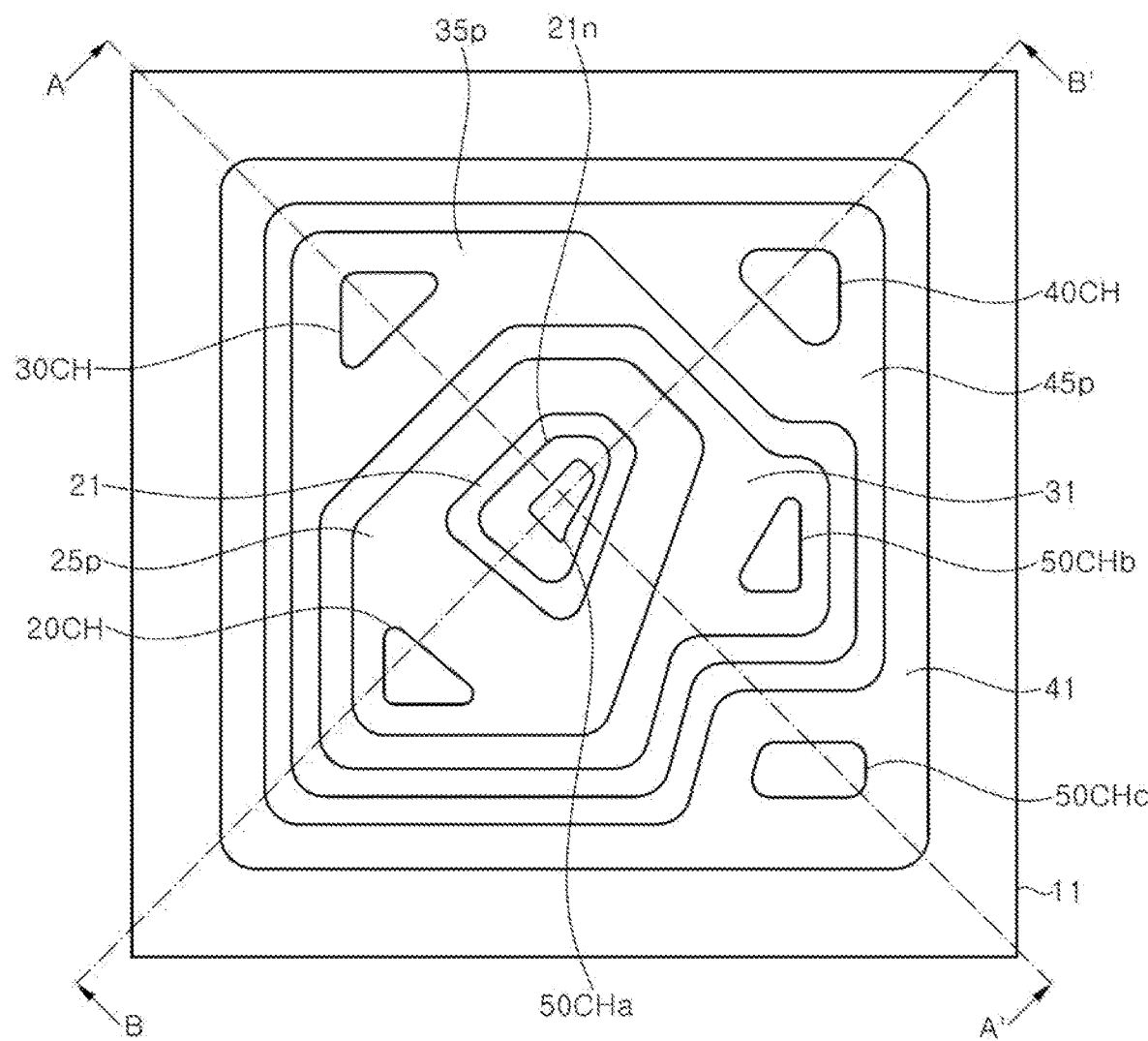
Figure 13B:
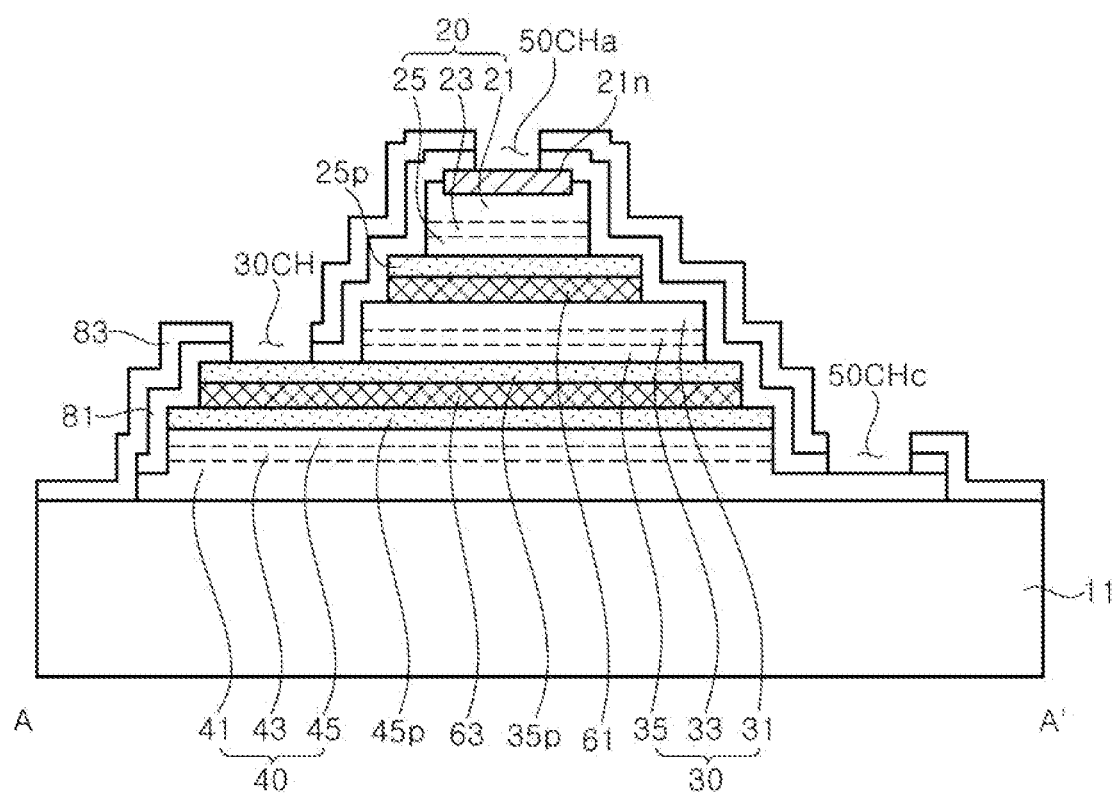
Figure 13C:
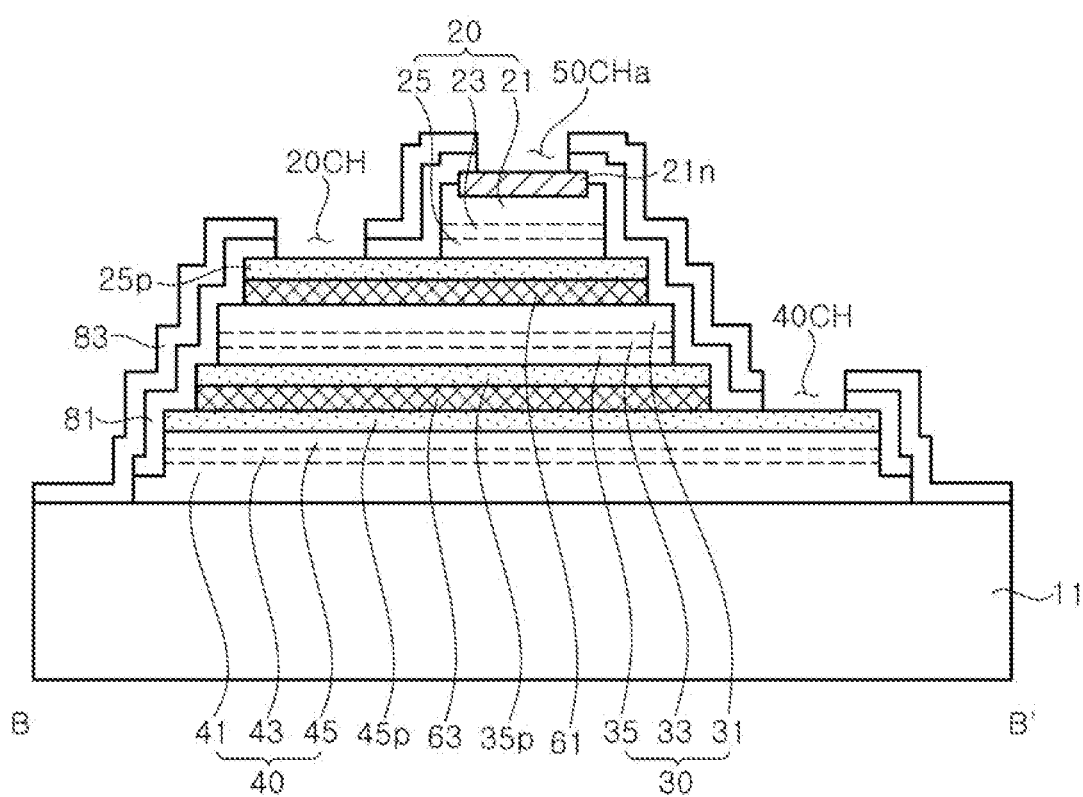

Referring to FIGS. 13A, 13B, and 13C, portions of the first and second insulation layers 81 and 83 may be removed to form first, second, third, and fourth contact holes 20CH, 30CH, 40CH, and 50CH. The first contact hole 20CH is defined on the first lower contact electrode 25p to expose a portion of the first lower contact electrode 25p. The second contact hole 30CH is defined on the second lower contact electrode 35p and expose the second lower contact electrode 35p. The third contact hole 40CH is defined on the third lower contact electrode 45p and expose the third lower contact electrode 45p.

The fourth contact hole 50CH provides a path for allowing electrical connection to the first conductive type semiconductor layers 21, 31, and 41 of the first, second, and third light emitting stacks 20, 30, and 40. The fourth contact hole 50CH may include a first sub-contact hole 50CHa, a second sub-contact hole 50CHb, and a third sub-contact hole 50CHc. The first sub-contact hole 50CHa is defined on the first conductivity type semiconductor layer 21 and may expose a portion of the first upper contact electrode 21n, the second sub-contact hole 50CHb is defined on the first conductivity type semiconductor layer 31 and may expose a portion of the first conductivity type semiconductor layer 31, and the third sub-contact hole 50CHc is defined on the first conductivity type semiconductor layer 41 and may expose a portion of the first conductivity type semiconductor layer 41.

Figure 14A:
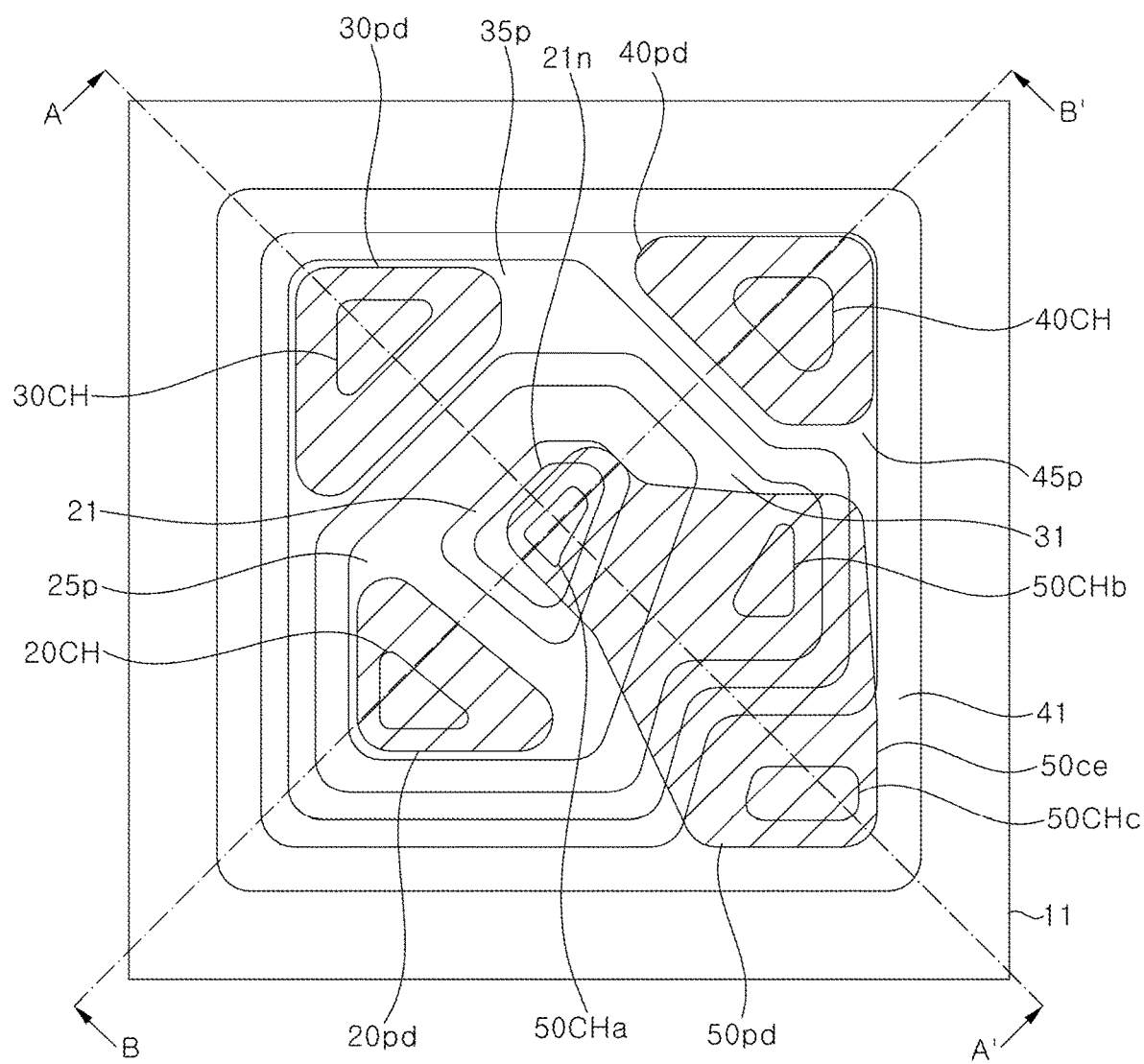
Figure 14B:
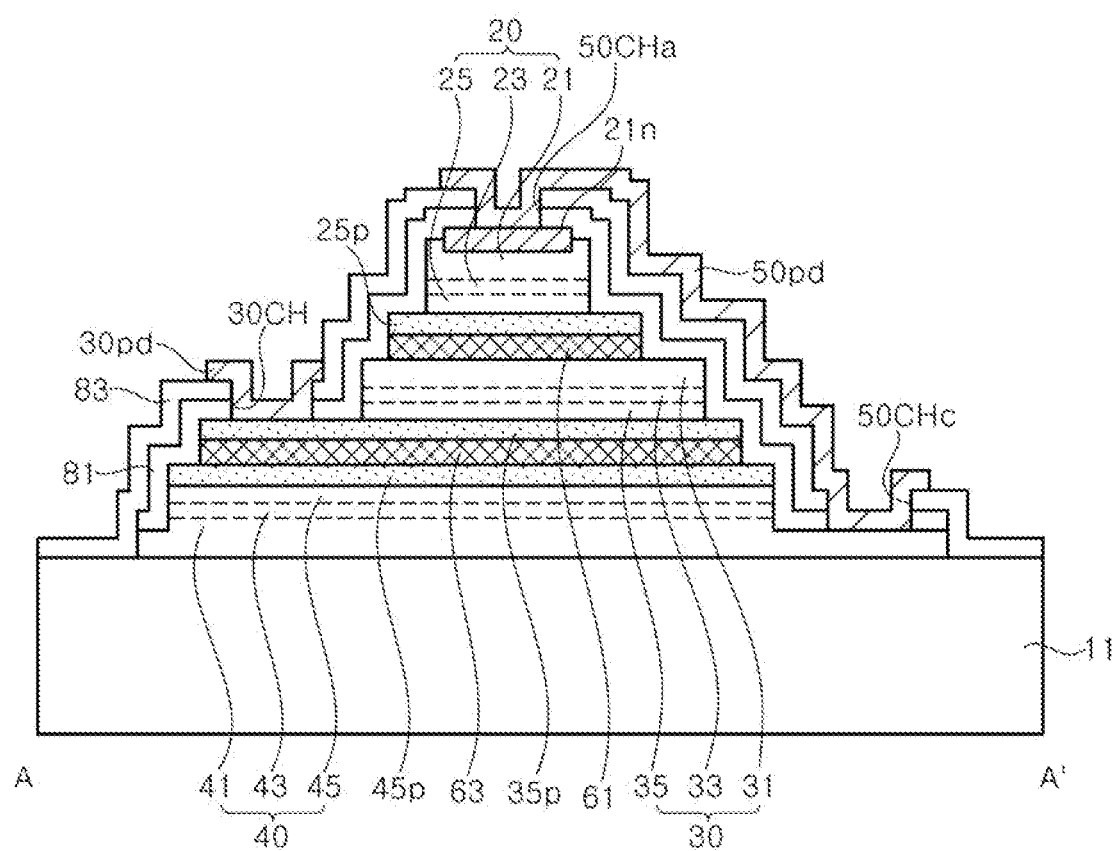
Figure 14C:
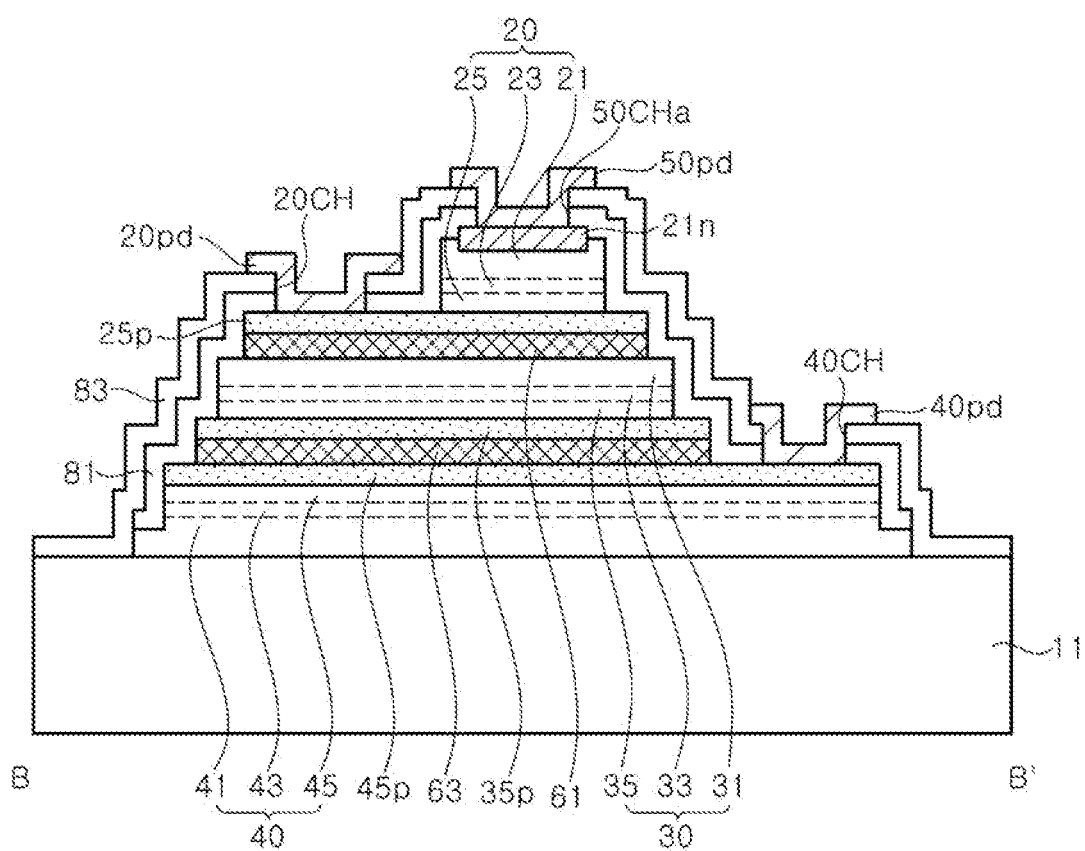

Referring to FIGS. 14A, 14B, and 14C, first, second, third, and fourth pads 20pd, 30pd, 40pd, and 50pd are formed on the first and second insulation layers 81 and 83. The first, second, third, and fourth pads 20pd, 30pd, 40pd, and 50pd may be formed by, for example, forming a conductive layer on a substantially entire surface of the substrate 11, and patterning the conductive layer using photolithography and etching processes.

The first pad 20pd may be formed to overlap with a region where the first contact hole 20CH is formed, and may be connected to the first lower contact electrode 25p through the first contact hole 20CH. The second pad 30pd may be formed to overlap with a region where the second contact hole 30CH is formed, and may be connected to the second lower contact electrode layer 35p through the second contact hole 30CH. The third pad 40pd may be formed to overlap with a region where the third contact hole 40CH is formed, and may be connected to the third lower contact electrode 45p through the third contact hole 40CH. The fourth pad 50pd may be formed to overlap with a region where the fourth contact hole 50CH is formed, particularly regions where the first, second, and third sub-contact holes 50CHa, 50CHb, and 50CHc are formed, and may be electrically connected to the first conductivity type semiconductor layers 21, 31, and 41 of the light emitting stacks 20, 30, and 40.

The first, second, third, and fourth pads 20pd, 30pd, 40pd, and 50pd may include Au, may be formed to have a stacked structure of Ti/Ni/Ti/Ni/Ti/Ni/Au/Ti, for example, which may have a thicknesses of, for example, about 100 nm/50 nm/100 nm/50 nm/100 nm/50 nm/3000 nm/10 nm.

Figure 15A:
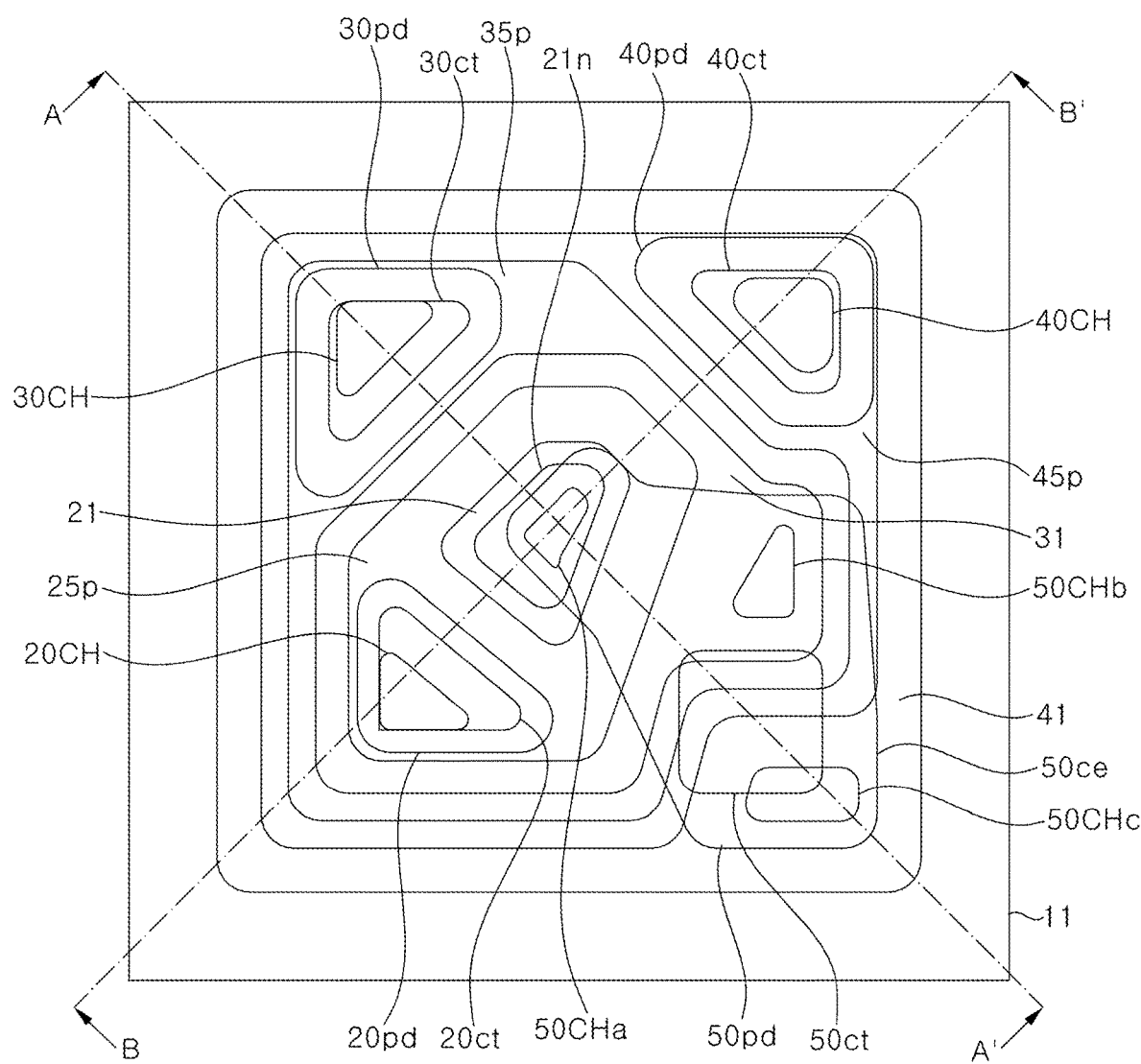
Figure 15B:
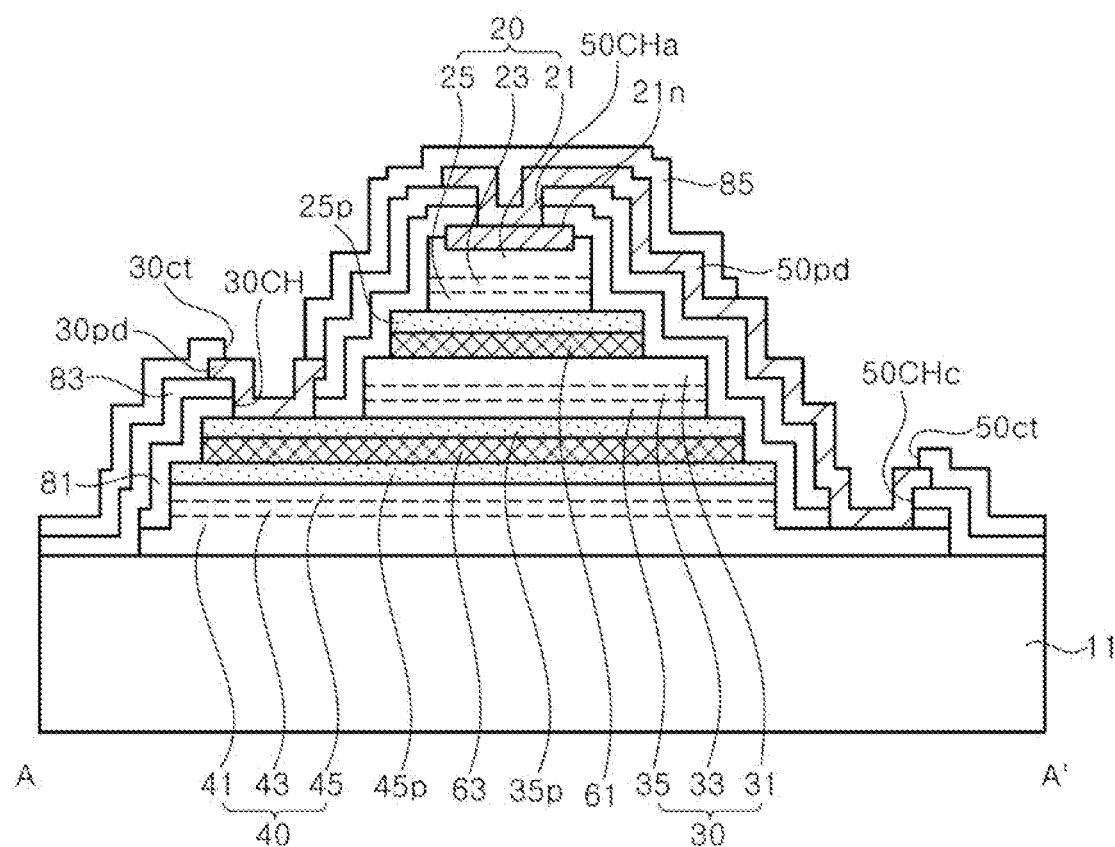
Figure 15C:
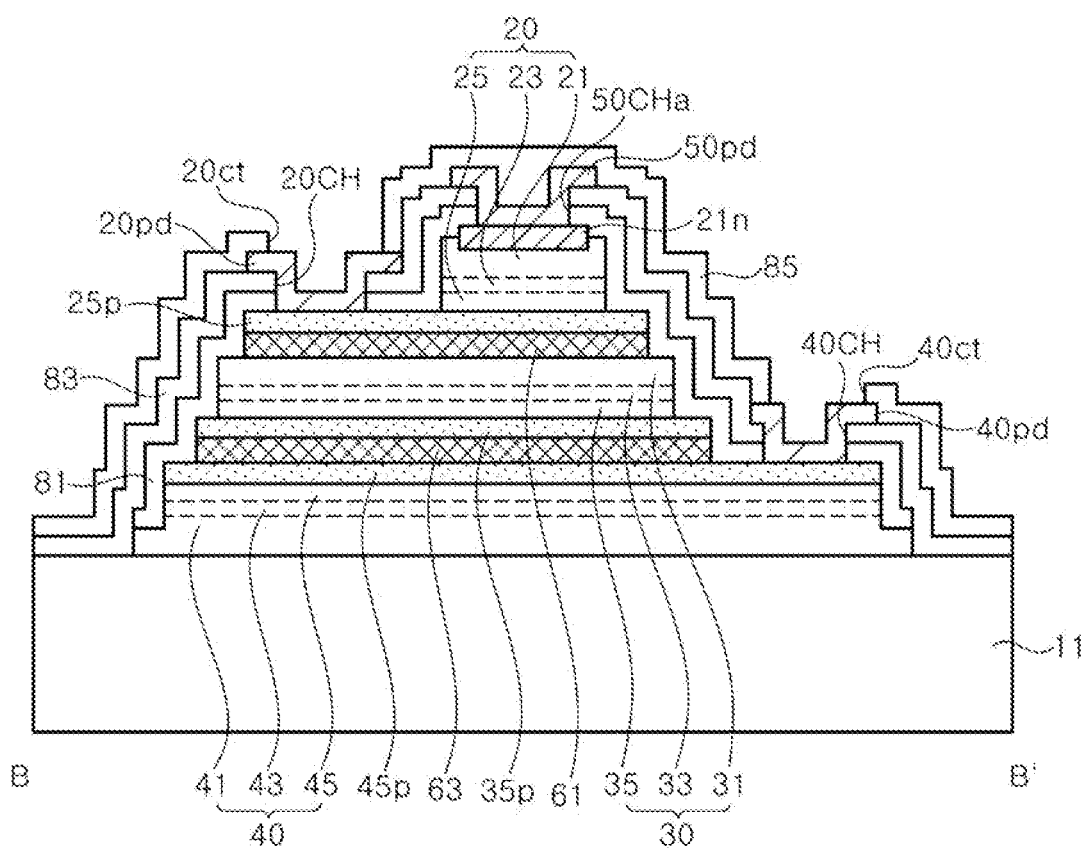

Referring to FIGS. 15A, 15B, and 15C, a third insulation layer 85 may be formed on the second insulation layer 83. The third insulation layer 85 may be formed of SiNx, SiO$_2$, Al$_2$O$_3$, or the like.

Subsequently, the third insulation layer 85 may be patterned and first, second, third, and fourth through holes 20ct, 30ct, 40ct, and 50ct exposing the first, second, third, and fourth pads 20pd, 30pd, 40pd, and 50pd may be formed.

The first through hole 20ct formed on the first pad 20pd exposes a portion of the first pad 20pd. The second through hole 30ct formed on the second pad 30pd exposes a portion of the second pad 30pd. The third through hole 40ct formed on the third pad 40pd exposes a portion of the third pad 40pd. The fourth through hole 50ct formed on the fourth pad 50pd exposes a portion of the fourth pad 50pd. In the illustrated exemplary embodiment, the first, second, third, and fourth through holes 20ct, 30ct, 40ct, and 50ct may be defined within regions where the first, second, third, and fourth pads 20pd, 30pd, 40pd, and 50pd are formed, respectively.

Figure 16A:
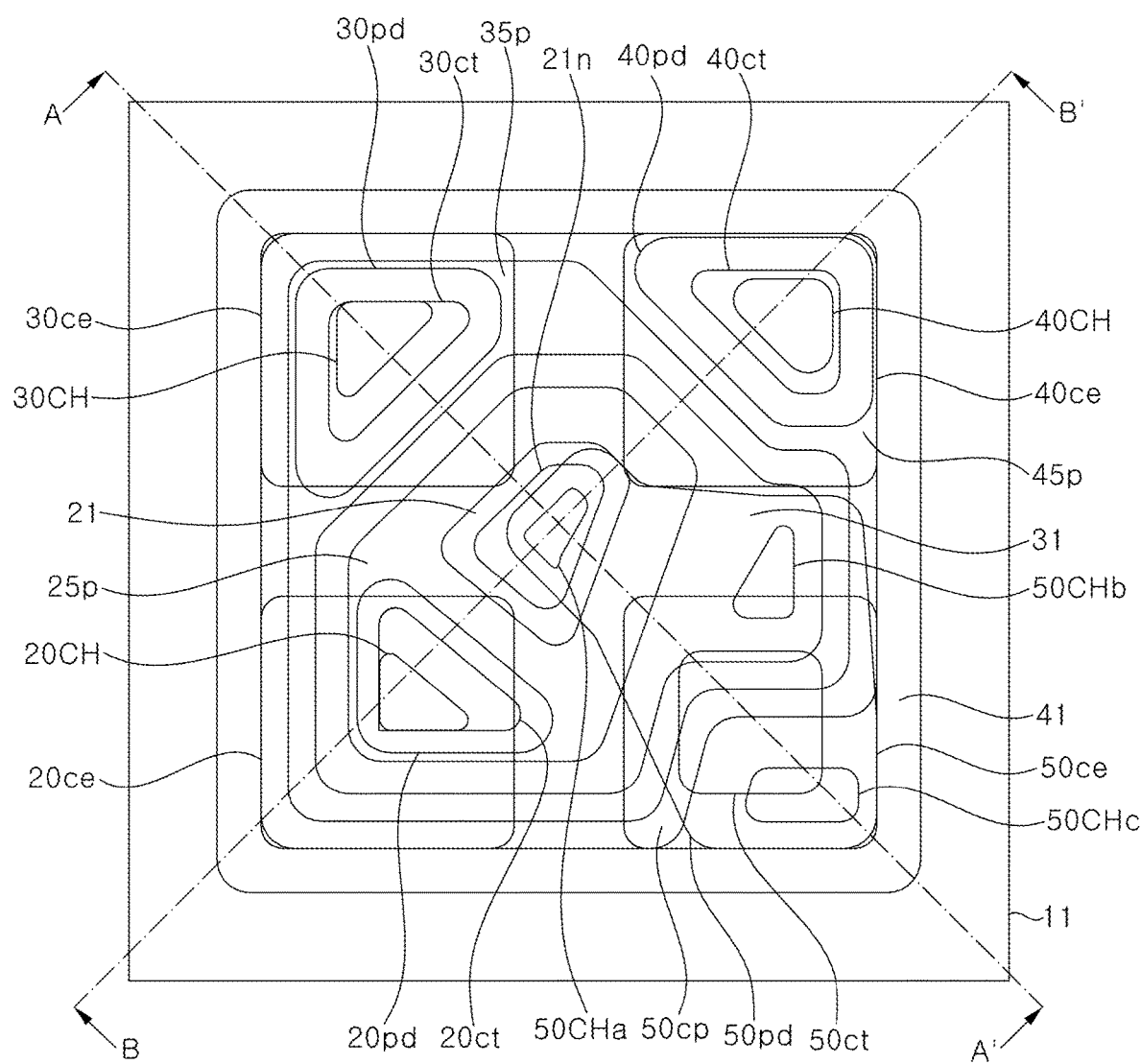
Figure 16B:
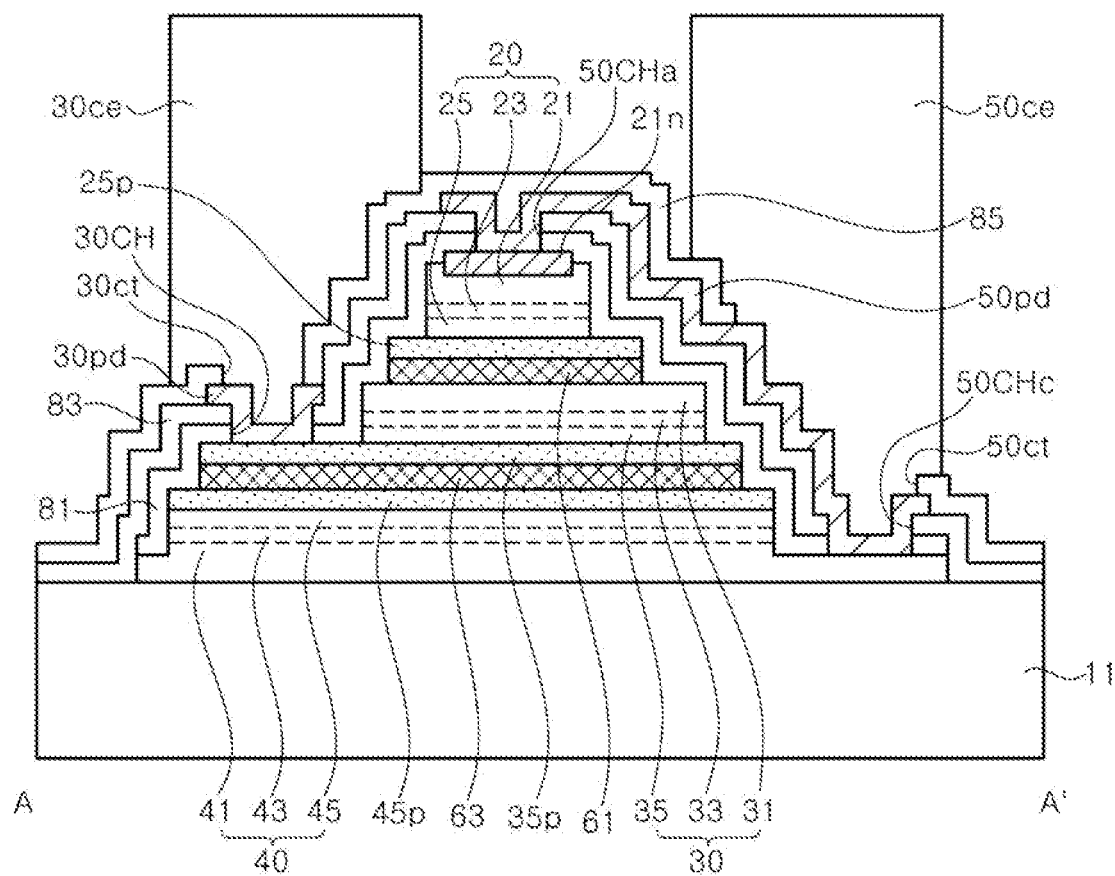
Figure 16C:
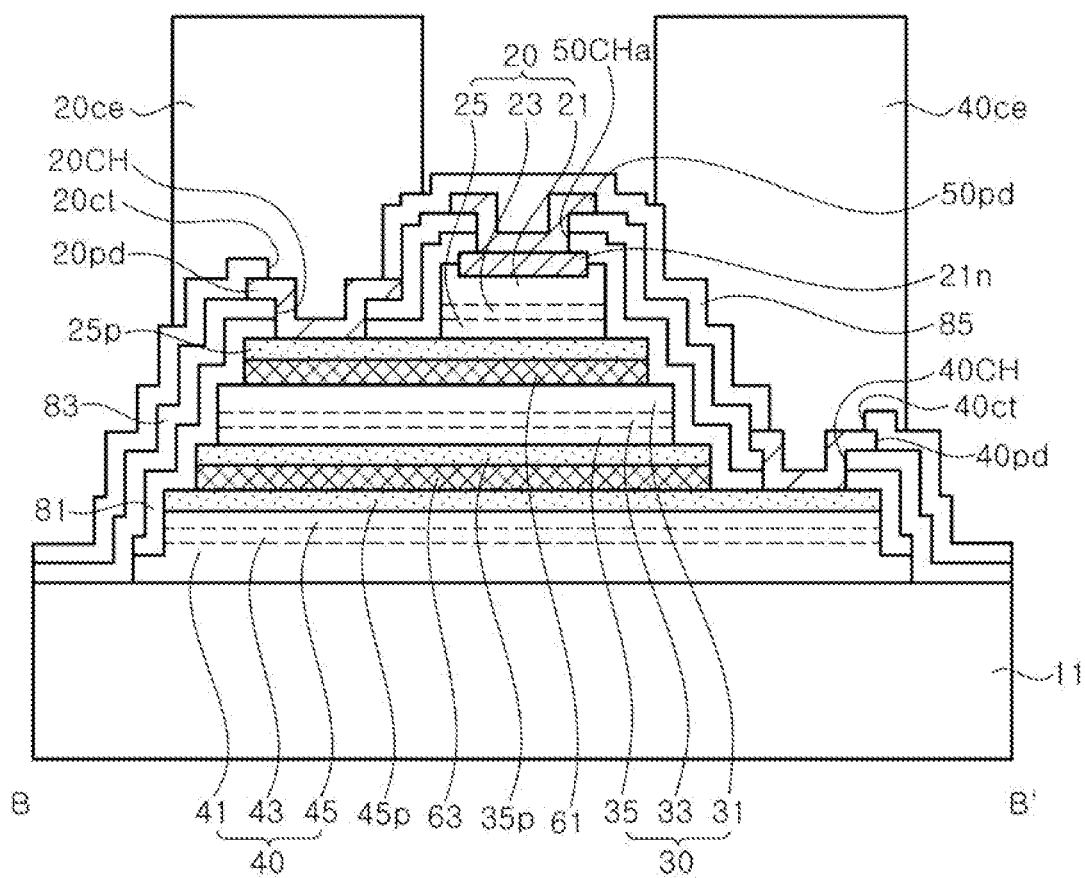

Referring to FIGS. 16A, 16B, and 16C, first, second, third, and fourth connection electrodes 20ce, 30ce, 40ce, and 50ce are formed on the third insulation layer 85 on which the first, second, third and fourth through holes 20ct, 30ct, 40ct, and 50ct are formed. The first connection electrode 20ce may be formed to overlap with a region where the first through hole 20ct is formed, and may be connected to the first pad 20pd through the first through hole 20ct. The second connection electrode 30ce may be formed to overlap with a region where the second through hole 30ct is formed, and may be connected to the second pad 30pd through the second through hole 30ct. The third connection electrode 40ce may be formed to overlap with a region where the third through hole 40ct is formed, and may be connected to the third pad 40pd through the third through hole 40ct. The fourth connection electrode 50ce may be formed to overlap with a region where the fourth through hole 50ct is formed, and may be connected to the fourth pad 50pd through the fourth through hole 50ct.

The first, second, third, and fourth connection electrodes 20ce, 30ce, 40ce, and 50ce may be spaced apart from one another and formed on the light emitting stack structure. The first, second, third, and fourth connection electrodes 20ce, 30ce, 40ce, and 50ce may be electrically connected to the first, second, third, and fourth pads 20pd, 30pd, 40pd, and 50pd, respectively, and transmit an external signal to each of the light emitting stacks 20, 30, and 40.

A method of forming the first, second, third, and fourth connection electrodes 20ce, 30ce, 40ce, and 50ce is not particularly limited. For example, according to an exemplary embodiment, a seed layer is deposited as a conductive surface on the light emitting stack structure, and a photoresist pattern may be formed so that the seed layer is exposed at a location where connection electrodes will be formed. According to an exemplary embodiment, the seed layer may be deposited to have a thickness of about 1000 Å, but the inventive concepts are not limited thereto. The seed layer may be formed of, for example, Ti/Cu. Subsequently, the seed layer may be plated with metal, such as Cu, Ni, Ti, Sb, Zn, Mo, Co, Sn, Ag or an alloy thereof. In particular, plating Cu may be easier with relatively low costs.

After plating is completed, a polishing process may be carried out to planarize an upper surface of the connection electrode. Then the photoresist pattern and the seed layer remaining between the connection electrodes may be removed.

According to the illustrated exemplary embodiment, each of the connection electrodes 20ce, 30ce, 40ce, and 50ce may have a substantially elongated shape to be spaced apart from the substrate 11. In another exemplary embodiment, the connection electrodes 20ce, 30ce, 40ce, and 50ce may include two or more metals or a plurality of different metal layers to reduce stress from the elongated shape of the connection electrodes 20ce, 30ce, 40ce, and 50ce. However, the inventive concepts are not limited to a specific shape of the connection electrodes 20ce, 30ce, 40ce, and 50ce, and in some exemplary embodiments, the connection electrode may have various shapes.

As described above, the connection electrodes 20ce, 30ce, 40ce, and 50ce may be overlapped with at least one step formed on a side surface of the light emitting stack structure. In this manner, a lower surface of the connection electrode may provide a larger contact area than the upper surface thereof to enhance the structure including the connection electrodes 20ce, 30ce, 40ce, and 50ce and the light emitting stack structure, so that the light emitting device 100 has a more stable structure capable of withstanding subsequent processes.

Figure 17A:
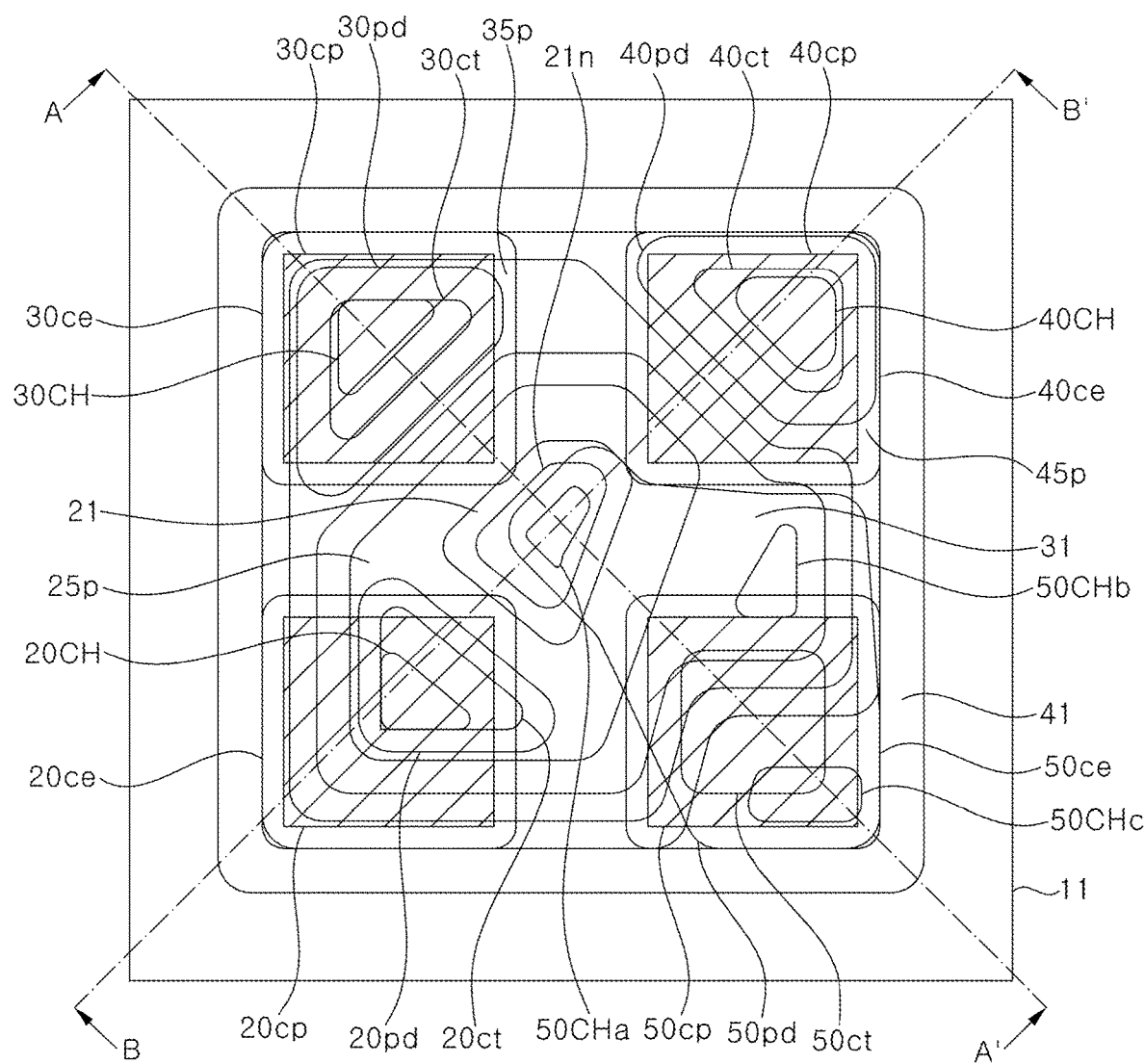
Figure 17B:
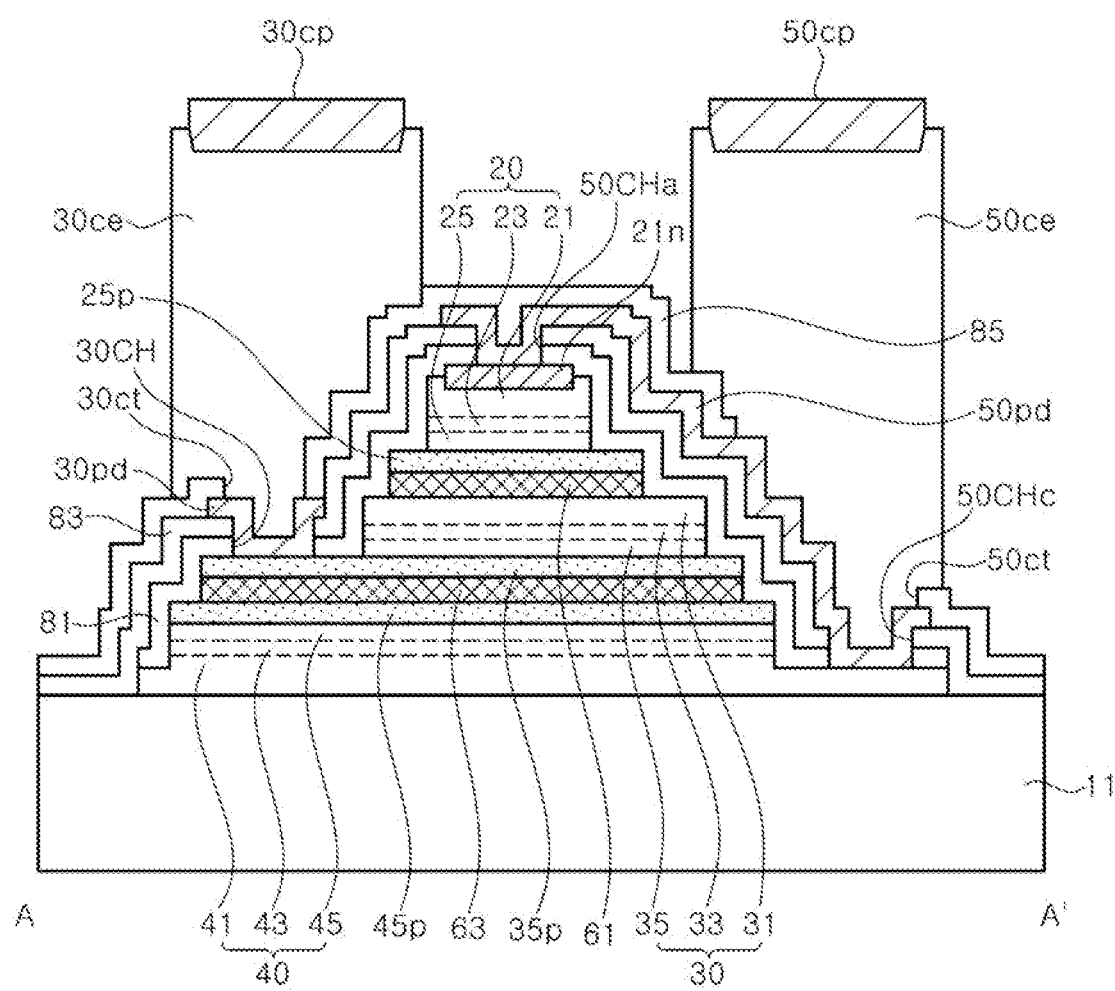
Figure 17C:
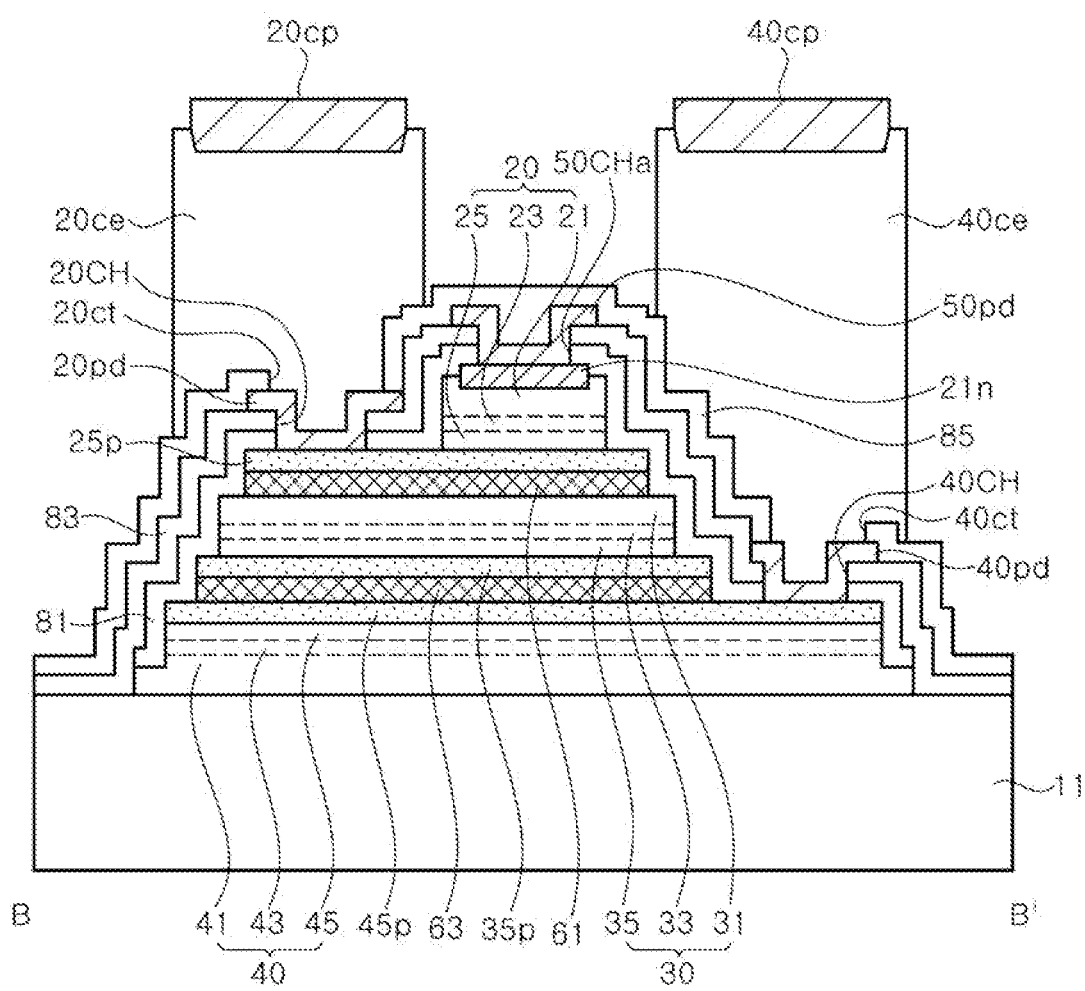

Referring to FIGS. 17A, 17B, and 17C, bonding metal layers 20cp, 30cp, 40cp, and 50cp are formed on the connection electrodes 20ce, 30ce, 40ce, and 50ce. The upper surfaces of the connection electrodes 20ce, 30ce, 40ce, and 50ce may be partially etched to be removed, and the bonding metal layers 20cp, 30cp, 40cp, and 50cp may be formed in the recessed region.

When the connection electrodes 20ce, 30ce, 40ce, and 50ce are formed of metals, while the metals may facilitate plating, however, the metals may not be suitable for bonding. Further, a natural oxide layer may be formed on the upper surfaces of the connection electrodes 20ce, 30ce, 40ce, and 50ce, which may cause contact failure. As such, the natural oxide film may be removed by partially removing the upper surfaces of the connection electrodes 20ce, 30ce, 40ce, 50ce, and the light emitting device 100 may be easily mounted on the circuit board using eutectic bonding technology by employing the bonding metal layers 20cp, 30cp, 40cp, and 50cp. A process of forming the bonding metal layers 20cp, 30cp, 40cp, and 50cp will be described in detail with reference to FIGS. 18A to 18D.

The light emitting device 100 may be provided by separating the substrate 11 for each light emitting device region. The substrate 11 may be separated using a laser scribing technique. In other exemplary embodiments, the substrate 11 may be removed from the third light emitting stack 40.

FIGS. 18A, 18B, 18C, and 18D are schematic cross-sectional views illustrating a method of forming a bonding metal layer according to an exemplary embodiment. Hereinafter, a method of forming a bonding metal layer 30cp on a connection electrode 30ce will be exemplarily described.

Figure 18A:
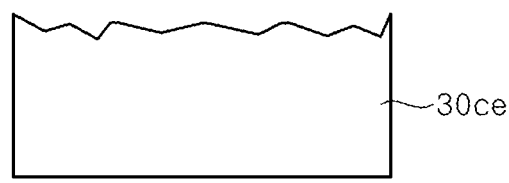
FIGS. 18A, 18B, 18C, and 18D are schematic cross-sectional views illustrating a method of forming a bonding metal layer according to an exemplary embodiment.

Referring to FIG. 18A, the connection electrode 30ce is formed through plating using a photoresist pattern. The connection electrode 30ce formed by plating may have a rough surface as illustrated. While the connection electrode 30ce is formed through plating, other connection electrodes 20ce, 40ce, and 50ce may also be formed together.

Figure 18B:

Referring to FIG. 18B, an upper surface of the connection electrode 30ce may be polished to planarize the upper surface thereof. While the surface of the connection electrode 30ce is polished, surfaces of the connection electrodes 20ce, 40ce, and 50ce may also be polished together.

Figure 18C:
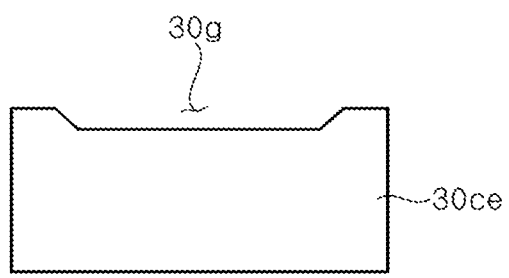

Referring to FIG. 18C, a groove 30g is formed by etching the surface of the connection electrode 30ce. In this manner, a natural oxide film formed on the surface of the connection electrode 30ce as well as contaminants thereon may be removed by the etching process. For example, a photoresist pattern covering an edge of the connection electrode 30ce may be formed, and an upper surface of the connection electrode 30ce is etched. When the connection electrode 30ce is formed of Cu, the connection electrode 30ce may be wet etched using a mixed solution of sulfuric acid, phosphoric, acid and hydrogen peroxide, a mixed solution of hydrochloric acid, ammonium persulfate, potassium chloride, phosphoric acid, and hydrogen peroxide, or the like. As such, the natural oxide film on the surface of the connection electrode 30ce may be removed, and surface roughness may be improved. The groove 30g may be formed to have a depth of, for example, 100 nm.

Figure 18D:
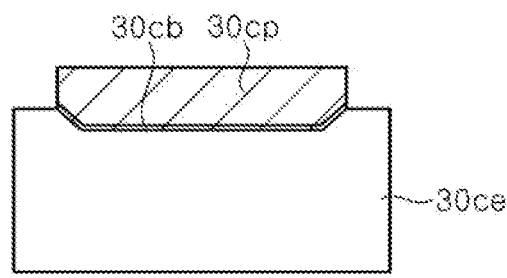

Referring to FIG. 18D, a barrier layer 30cb and a bonding metal layer 30cp may be formed using the photoresist pattern, and thereafter, the photoresist pattern may be removed. In particular, the barrier layer 30cb and the bonding metal layer 30cp may be formed using a lift-off technique.

The barrier layer 30cb may include, for example, a single layer or multiple layers including Ti, Ni, W, Cr, and Co. For example, the barrier layer 30cb may be formed of Ni, Ti, or Ti/Ni.

The bonding metal layer 30cp may be formed of Au. Au is suitable for probing, as well as being suitable for eutectic bonding with In or Sn.

The method of forming a bonding metal layer on the connection has been exemplarily described with reference to the connection electrode 30ce, however, the bonding metal layers 20cp, 40cp, 50cp may be formed on the other connection electrodes 20ce, 40ce, and 50ce by the same method, and the bonding metal layers 20cp, 30cp, 40cp, and 50cp may be formed together in the same process.

Figure 19A:
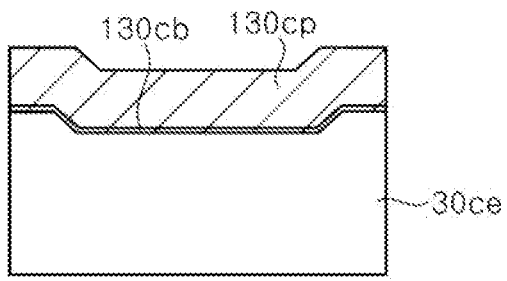
FIGS. 19A and 19B are cross-sectional views of a bonding metal layer according to exemplary embodiments.
Figure 19B:
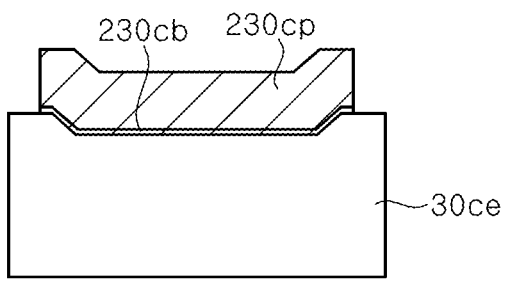

FIGS. 19A and 19B are cross-sectional views illustrating various exemplary embodiments of a bonding metal layer. Referring to FIG. 19A, a bonding metal layer 130cp according to an exemplary embodiment may cover an entire upper surface of the connection electrode 30ce. In particular, a barrier layer 30cb may cover the entire upper surface of the connection electrode 30ce, and the bonding metal layer 30cp may be disposed on the barrier layer 30cb. As such, the barrier layer 30cb may cover the upper surface of the connection electrode 30ce at the outside of a groove 30g as well as the inside of the groove 30g.

For example, after a portion of the upper surface of the connection electrode 30ce is exposed using a first photoresist pattern, the groove 30g is formed using a wet etching technique. Subsequently, the first photoresist pattern is removed, and the entire upper surface of the connection electrode 30ce is exposed using a second photoresist pattern. The barrier layer 130cb and the bonding metal layer 130cp may then be formed using the second photoresist pattern.

Referring to FIG. 19B, a barrier layer 230cb and a bonding metal layer 230cp according to an exemplary embodiment may cover the groove 30g of the connection electrode 30ce, and may also partially cover the upper surface of the connection electrode 30ce around the groove 30g. As such, an edge of the upper surface of the connection electrode 30ce may be exposed to the outside.

For example, after the portion of the upper surface of the connection electrode 30ce is exposed using the first photoresist pattern, the groove 30g is formed using a wet etching technique. Subsequently, the first photoresist pattern is removed, and the portion of upper surface of the connection electrode 30ce including the groove 30g is exposed using the second photoresist pattern. The barrier layer 230cb and the bonding metal layer 230cp may then be formed using the second photoresist pattern.

Although various exemplary embodiments of the bonding metal layer 30cp have been described above, the method of forming the bonding metal layer 30cp may be varied, and the inventive concepts are not limited thereto.

Figure 20A:
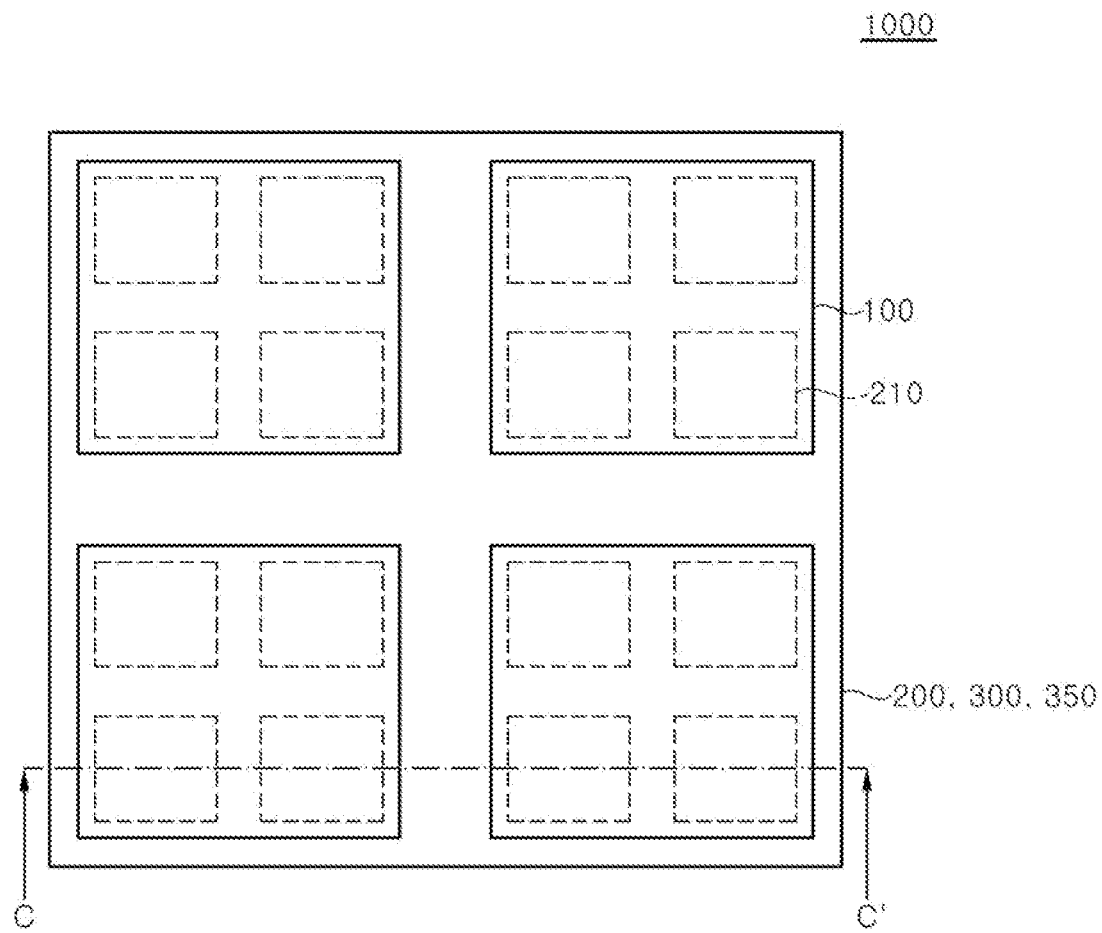
FIG. 20A is a schematic plan view of a display apparatus according to an exemplary embodiment.
Figure 20B:
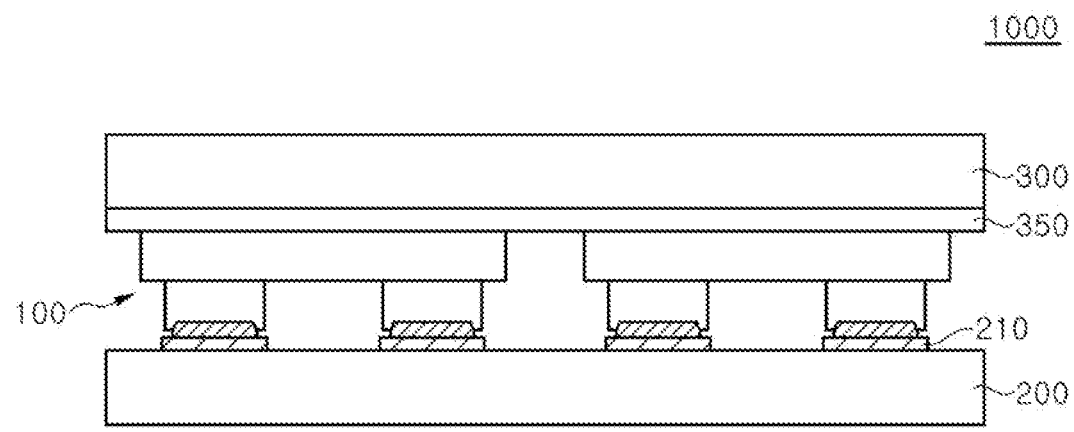
FIG. 20B is a schematic cross-sectional view taken along line C-C' of FIG. 20A.

FIG. 20A is a schematic plan view illustrating a display apparatus 1000 according to an exemplary embodiment, and FIG. 20B is a schematic cross-sectional view taken along line C-C' of FIG. 20A.

Referring to FIGS. 20A and 20B, the display apparatus 1000 may include a circuit board 200, light emitting devices 100, a transparent substrate 300, and a light absorbing layer 350. The light emitting devices 100 may be mounted on the circuit board 200 of a final apparatus, such as a display apparatus. The light emitting devices 100 may be individually mounted or mounted in a group on the circuit board 200. Further, the light emitting devices 100 may be packaged as a group so that a plurality of packages may be mounted on the circuit board 200.

The circuit board 200 may include bonding pads 210 for mounting the light emitting devices 100. The bonding pads 210 may be formed of a metal layer including In or Sn, for example. Bonding metal layers 20cp, 30cp, 40cp, and 50cp are bonded to the bonding pads 210 so that the light emitting device 100 is mounted on the circuit board 200. The bonding pad 210 and the bonding metal layers 20cp, 30cp, 40cp, and 50cp may be attached to one another through eutectic bonding. Since the transparent substrate 300 and the light absorbing layer 350 have been described with reference to FIG. 3, repeated detailed descriptions thereof will be omitted to avoid redundancy.

In the illustrated exemplary embodiment, although the light emitting device 100 includes the substrate 11, in some exemplary embodiments, the substrate 11 may be removed. For example, after the light emitting device 100 is bonded onto the circuit board 200, the substrate 11 may be removed from the third light emitting stack 40 using a technique, such as laser lift-off.

Figure 21A:
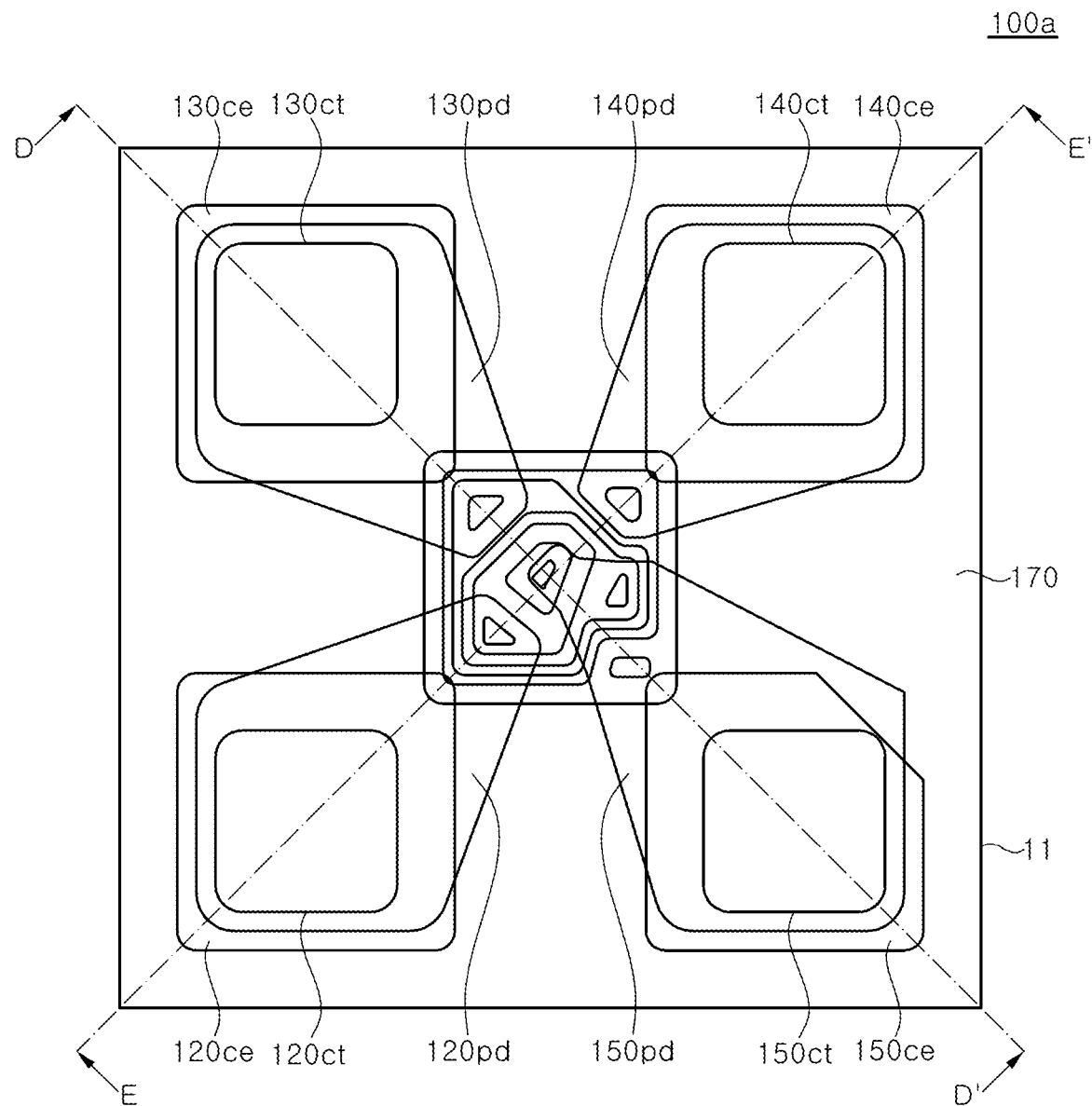
FIG. 21A is a schematic plan view of a light emitting device according to an exemplary embodiment.
Figure 21B:
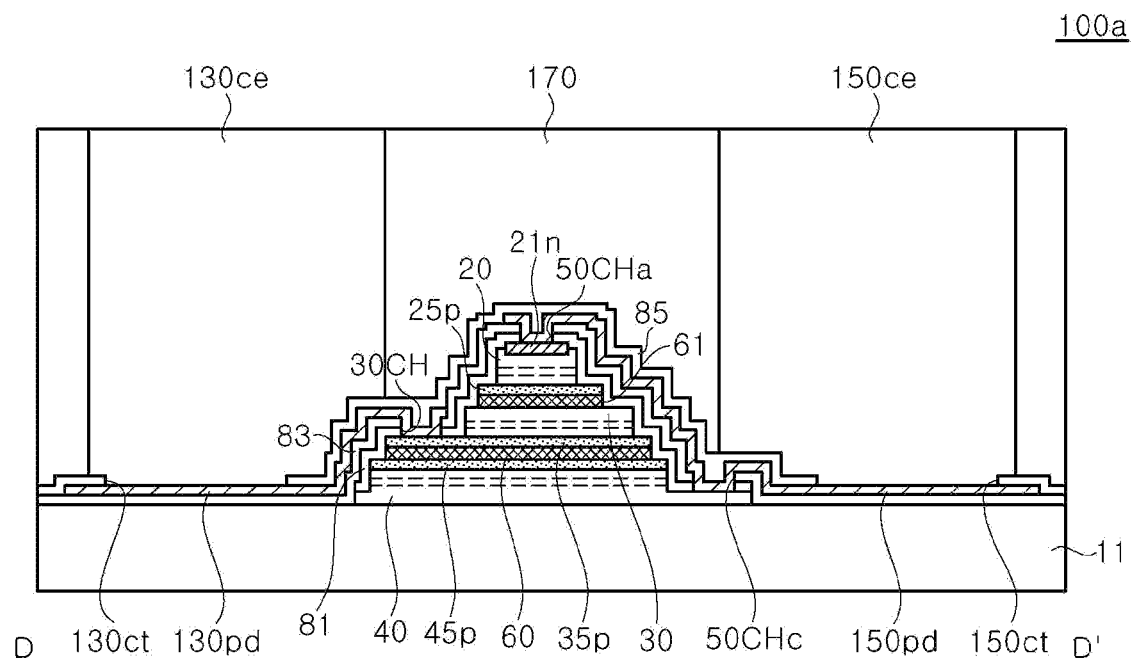
FIGS. 21B and 21C are schematic cross-sectional views taken along line D-D' and E-E' of FIG. 21A, respectively.
Figure 21C:
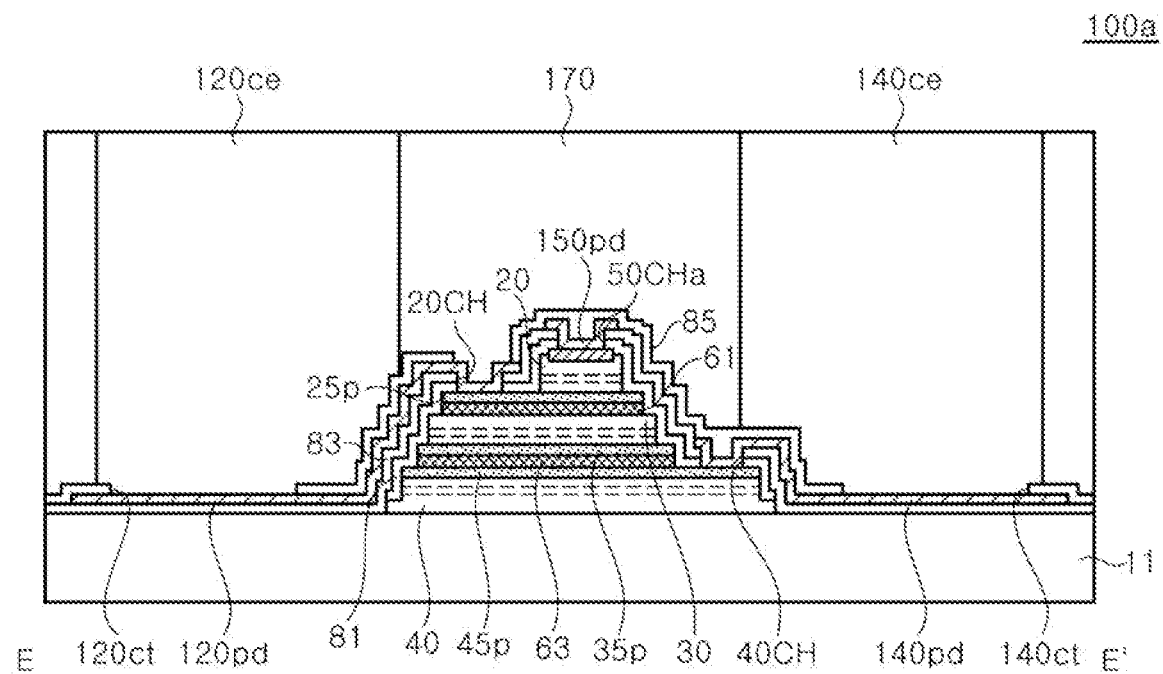

FIG. 21A is a schematic plan view of a light emitting device 100a according to an exemplary embodiment, and FIGS. 21B and 21C are schematic cross-sectional views taken along line D-D' and E-E' of FIG. 21A, respectively.

Referring to FIGS. 21A, 21B, and 21C, the light emitting device 100a is substantially similar to the light emitting device 100 described with reference to FIGS. 4A, 4B, and 4C, but locations of first, second, third, and fourth pads 20pd, 30pd, 40pd, and 50pd and connection electrodes 120ce, 130ce, 140ce, and 150ce of the light emitting device 100a are different from those of the light emitting device 100.

The first, second, third, and fourth pads 20pd, 30pd, 40pd, and 50pd according to the illustrated exemplary embodiment may extend toward an upper surface of the substrate 11 from a stacked structure of the first, second, and third light emitting stacks 20, 30, and 40. The upper surface of the substrate 11 may be covered with a second insulation layer 85, and the first, second, third and fourth pads 20pd, 30pd, 40pd and 50pd may be spaced apart from the substrate 11 by the second insulation layer 85. However, the inventive concepts are not limited thereto, and in some exemplary embodiments, the first, second, third, and fourth pads 20pd, 30pd, 40pd, and 50pd may contact the upper surface of the substrate 11.

The third insulation layer 85 may have openings 120ct, 130ct, 140ct, and 150ct exposing the first, second, third, and fourth pads 20pd, 30pd, 40pd, and 50pd, and the openings 120ct, 130ct, 140ct, and 150ct may be formed at locations spaced apart from the stacked structure of the first, second, and third light emitting stacks 20, 30, and 40 in the lateral direction.

The connection electrodes 120ce, 130ce, 140ce, 150ce are connected to the first, second, third, and fourth pads 20pd, 30pd, 40pd, and 50pd through the openings 120ct, 130ct, 140ct, and 150ct, respectively. Bonding metal layers 120cp, 130cp, 140cp, and 150cp may be formed on upper surfaces of the connection electrodes 120ce, 130ce, 140ce, and 150ce, respectively, as described with reference to FIGS. 4A, 4B, and 4C.

A region between the connection electrodes 120ce, 130ce, 140ce, and 150ce may be filled with a light absorbing material 170. The light absorbing material 170 may be formed of, for example, PDMA or black EMC.

According to the illustrated exemplary embodiment, the light emitting device 100a may employ the first, second, and third light emitting stacks 20, 30, and 40 having a smaller size than those in the light emitting device 100 described above. By reducing the sizes of the first, second, and third light emitting stacks 20, 30, and 40, current densities in the first, second, and third light emitting stacks 20, 30, and 40 may be increased. As such, the first, second, and third light emitting stacks 20, 30, and 40 may be driven under a current density condition having excellent light extraction efficiency, and thus, luminous efficiency of the light emitting device may be improved.

FIGS. 22A, 23A, 24A, and 25A are plan views illustrating a method of manufacturing a light emitting device according to an exemplary embodiment, FIGS. 22B, 23B, 24B, and 25B are schematic cross-sectional views taken along line D-D' of FIGS. 22A, 23A, 24A, and 25A, respectively, and FIGS. 22C, 23C, 24C, and 25C are schematic cross-sectional views taken along line E-E' of FIGS. 22A, 23A, 24A, and 25A, respectively.

The manufacturing method according to the illustrated exemplary embodiment may be carried out using the first to third light emitting stack structures shown in FIG. 5, and may be subjected to the same process described with reference to FIGS. 6A, 6B, 6C, 7A, 7B, 7C, 8A, 8B, 8C, 9A, 9B, 9C, 10A, 10B, 10C, 11A, 11B, 11C, 12A, 12B, 12C, 13A, 13B, and 13C. However, in the illustrated exemplary embodiment, the first, second, and third light emitting stacks 20, 30, and 40 may be formed to have a relatively small external size that those in the light emitting device 100, especially an area thereof.

Figure 22A:
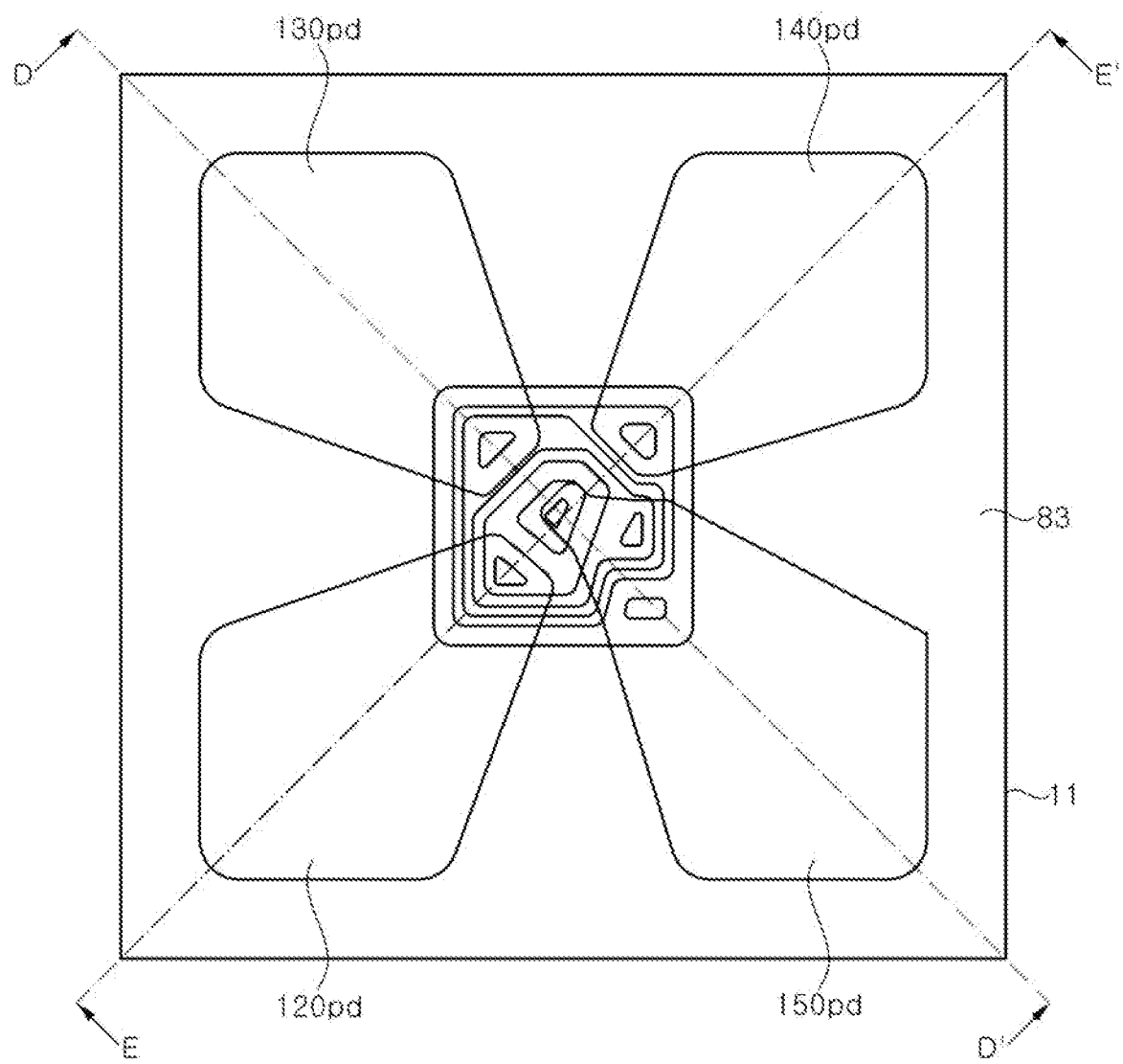
FIGS. 22A, 23A, 24A, and 25A are plan views illustrating a method of manufacturing a light emitting device according to an exemplary embodiment.
Figure 22B:
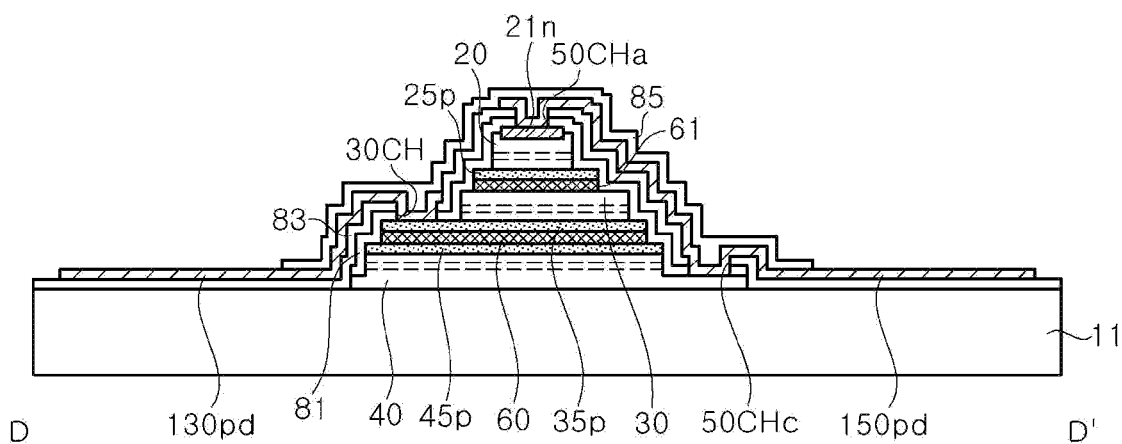
FIGS. 22B, 23B, 24B, and 25B are schematic cross-sectional views taken along line D-D' of FIGS. 22A, 23A, 24A, and 25A, respectively.
Figure 22C:
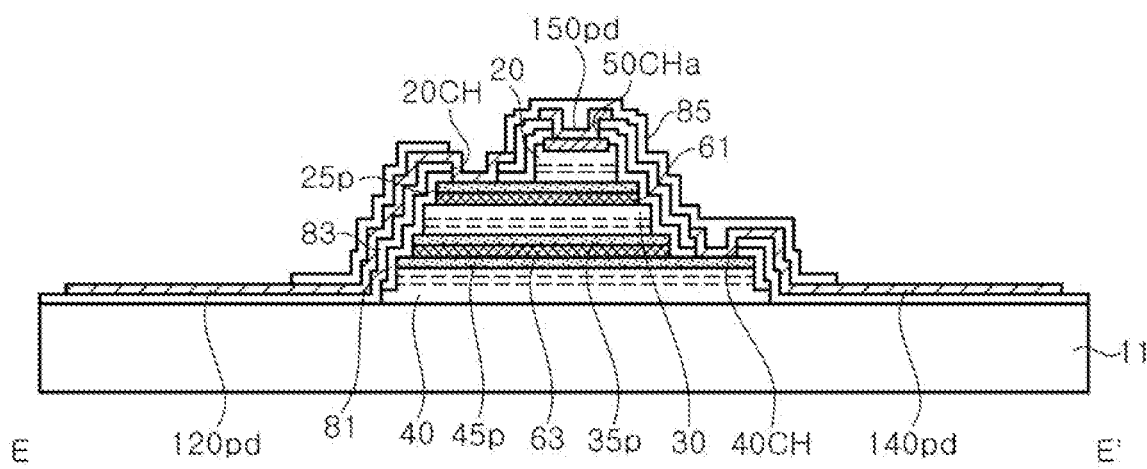
FIGS. 22C, 23C, 24C, and 25C are schematic cross-sectional views taken along line E-E' of FIGS. 22A, 23A, 24A, and 25A, respectively.

Referring to FIGS. 22A, 22B, and 22C, first, second, third, and fourth pads 120*pd*, 130*pd*, 140*pd*, and 150*pd* are formed on the first and second insulation layers 81 and 83. The first, second, third, and fourth pads 120*pd*, 130*pd*, 140*pd* and 150*pd* may be formed by, for example, forming a conductive layer on a substantially entire surface of the substrate 11, and patterning the conductive layer using photolithography and etching processes.

The first pad 120*pd* may be formed to overlap with a region where a first contact hole 20CH is formed, and may be connected to a first lower contact electrode 25*p* through the first contact hole 20CH. The second pad 130*pd* may be formed to overlap with a region where a second contact hole 30CH is formed, and may be connected to a second lower contact electrode layer 35*p* through the second contact hole 30CH. The third pad 140*pd* may be formed to overlap with a region where a third contact hole 40CH is formed, and may be connected to a third lower contact electrode 45*p* through the third contact hole 40CH. The fourth pad 150*pd* may be formed to overlap with a region where a fourth contact hole 50CH is formed, particularly regions where first, second, and third sub-contact holes 50CHa, 50CHb (see FIG. 4A), and 50CHc are formed, and may be electrically connected to the first conductivity type semiconductor layers 21, 31, and 41 of the light emitting stacks 20, 30, and 40.

The first, second, third and fourth pads 120*pd*, 130*pd*, 140*pd*, and 150*pd* may be formed of the same material and the same layer structure as the first, second, third, and fourth pads 20*pd*, 30*pd*, 40*pd*, and 50*pd* described above. However, the first, second, third, and fourth pads 20*pd*, 30*pd*, 40*pd*, and 50*pd* are disposed within the upper region of the third light emitting stack 40, whereas the first, second, third, and fourth pads 120*pd*, 130*pd*, 140*pd*, and 150*pd* extend outward from the upper region of the third light emitting stack 40.

Figure 23A:
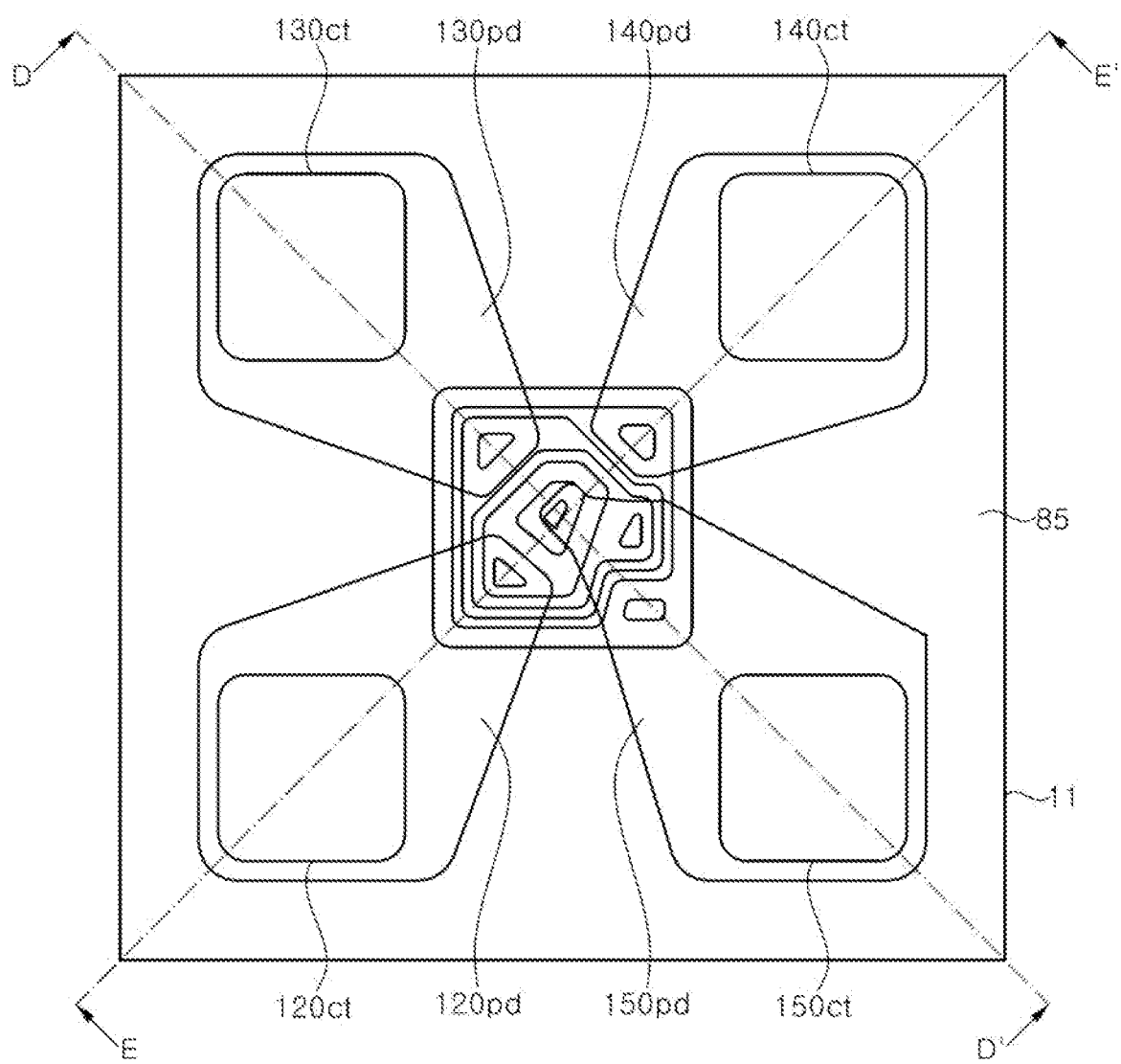
Figure 23B:
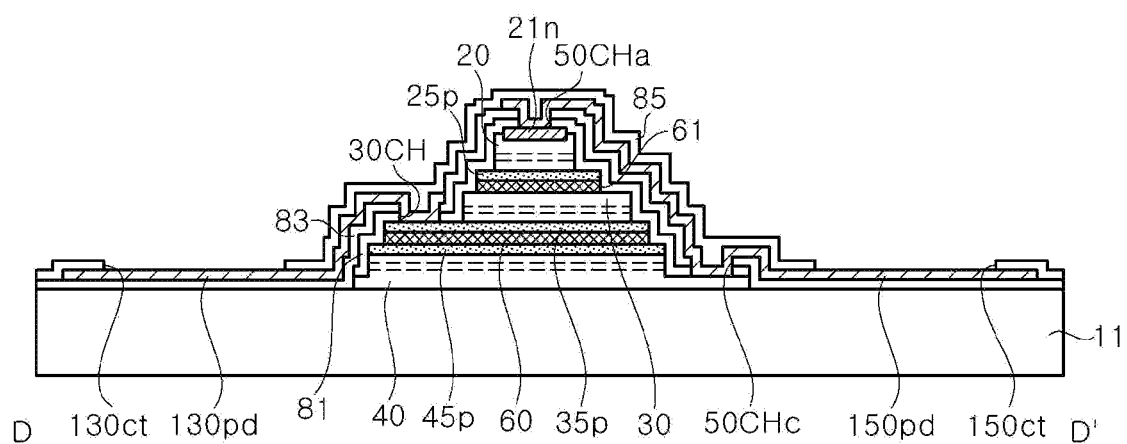
Figure 23C:
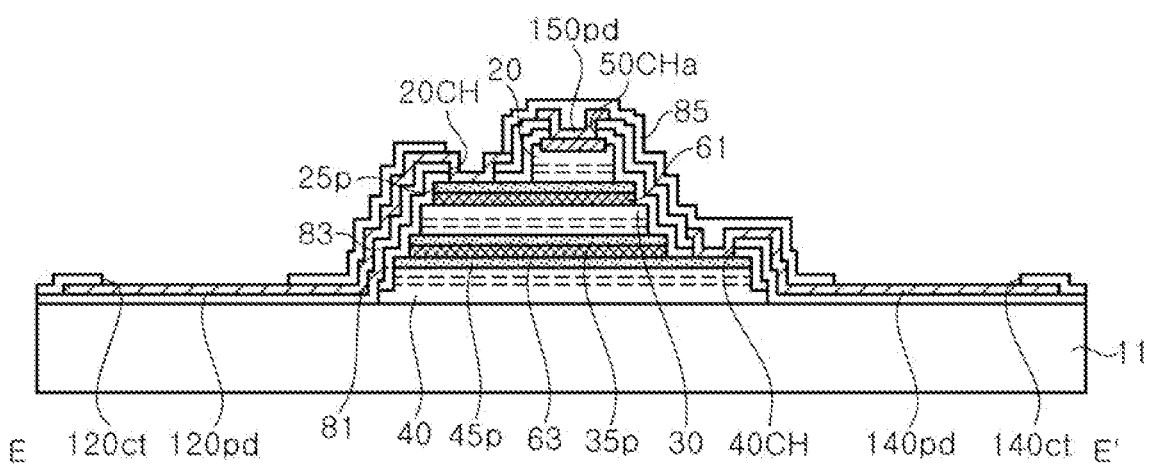

Referring to FIGS. 23A, 23B, and 23C, a third insulation layer 85 may be formed on the second insulation layer 83. The third insulation layer 85 may be formed of SiNx, SiO$_2$, Al$_2$O$_3$, or the like.

The third insulation layer 85 may then be patterned to form first, second, third, and fourth through holes 120*ct*, 130*ct*, 140*ct*, and 150*ct* exposing the first, second, third, and fourth pads 120*pd*, 130*pd*, 140*pd*, and 150*pd*, respectively.

The first through hole 120*ct* formed on the first pad 120*pd* exposes a portion of the first pad 120*pd*. The second through hole 130*ct* formed on the second pad 130*pd* exposes a portion of the second pad 130*pd*. The third through hole 140*ct* formed on the third pad 140*pd* exposes a portion of the third pad 140*pd*. The fourth through hole 150*ct* formed on the fourth pad 150*pd* exposes a portion of the fourth pad 150*pd*. In the illustrated exemplary embodiment, the first, second, third, and fourth through holes 120*ct*, 130*ct*, 140*ct*, and 150*ct* may be defined in regions in which the first, second, third, and fourth pads 120*pd*, 130*pd*, 140*pd*, and 150*pd* are to be formed, respectively. The first, second, third, and fourth through holes 120*ct*, 130*ct*, 140*ct*, and 150*ct* may also be disposed to be spaced apart from the third light emitting stack 40 in the lateral direction.

Figure 24A:
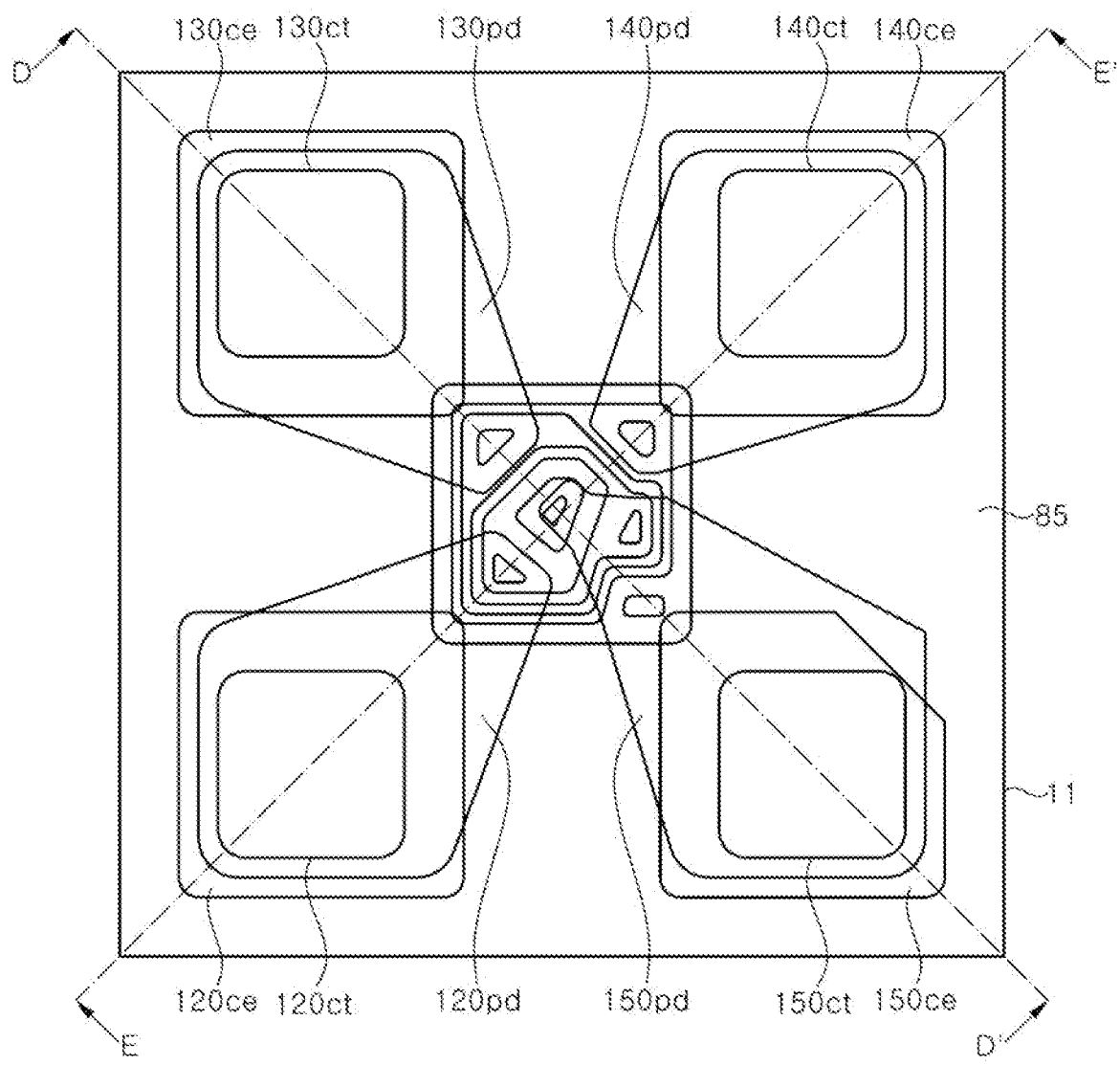
Figure 24B:
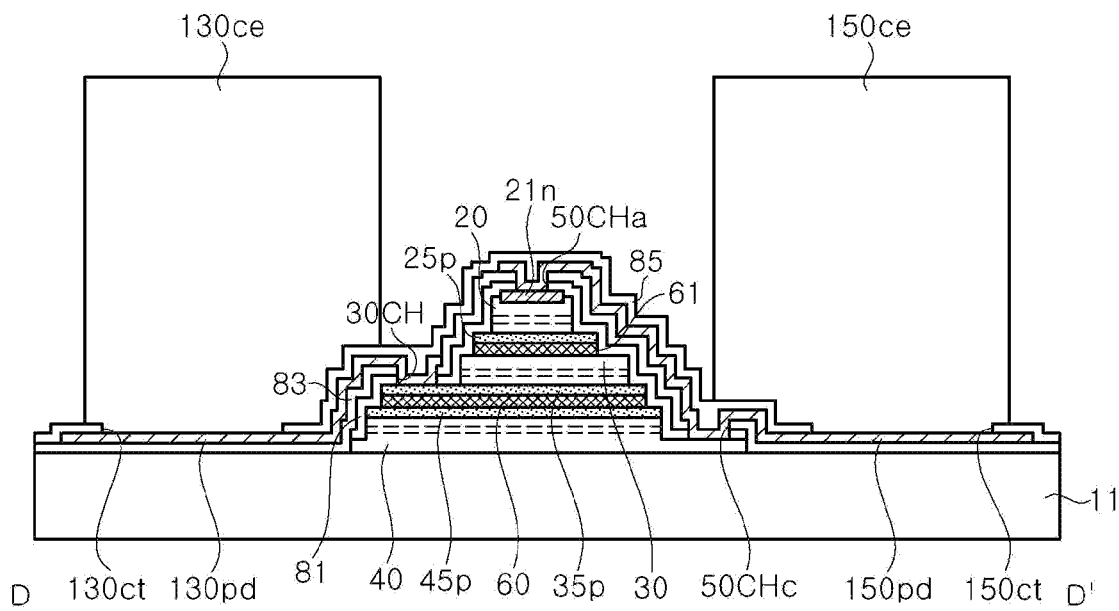
Figure 24C:
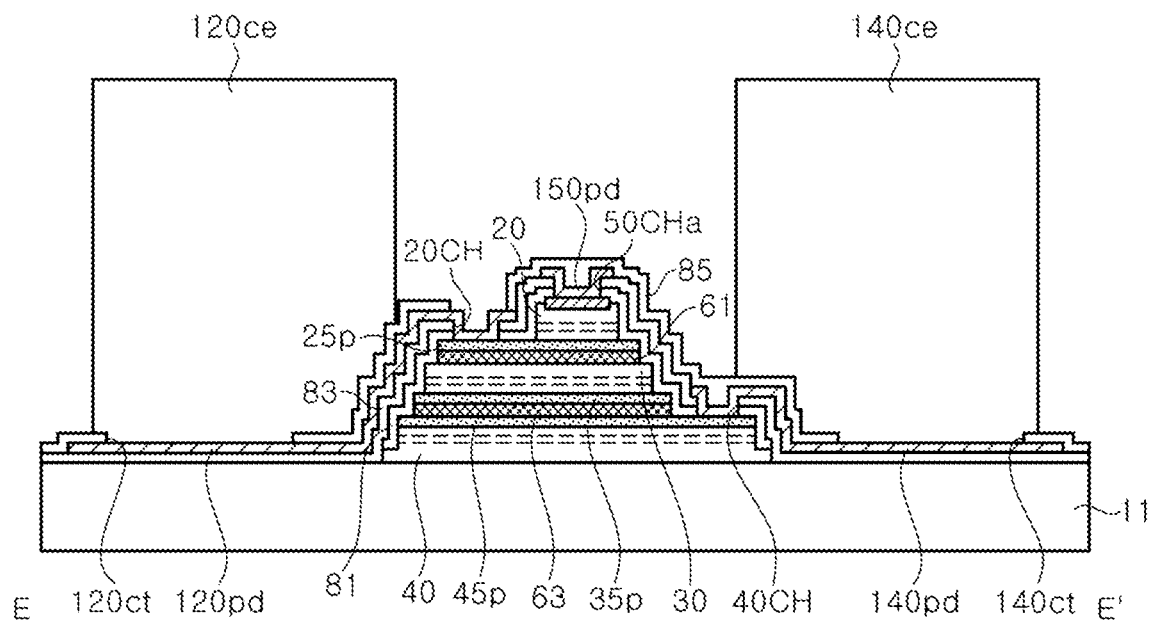

Referring to FIGS. 24A, 24B, and 24C, first, second, third, and fourth connection electrodes 120*ce*, 130*ce*, 140*ce*, 150*ce* are formed on the third insulation layer 85, in which the first, second, third, and fourth through holes 120*ct*, 130*ct*, 140*ct*, 150*ct* are formed. The first connection electrode 120*ce* is formed to overlap with a region in which the first through hole 120*ct* is formed, and may be connected to the first pad 120*pd* through the first through hole 120*ct*. The second connection electrode 130*ce* is formed to overlap with a region in which the second through hole 130*ct* is formed, and may be connected to the second pad 130*pd* through the second through hole 130*ct*. The third connection electrode 140*ce* is formed to overlap with a region in which the third through hole 140*ct* is formed, and may be connected to the third pad 140*pd* through the third through hole 140*ct*. The fourth connection electrode 150*ce* is formed to overlap with a region in which the fourth through hole 150*ct* is formed, and may be connected to the fourth pad 150*pd* through the fourth through hole 150*ct*.

The first, second, third, and fourth connection electrodes 120*ce*, 130*ce*, 140*ce*, and 150*ce* may be spaced apart from one another, and at least some of the connection electrodes may be formed to be spaced apart from the light emitting stack structure in the lateral direction. The first, second, third, and fourth connection electrodes 120*ce*, 130*ce*, 140*ce*, and 150*ce* may be electrically connected to the first, second, third, and fourth pads 120*pd*, 130*pd*, 140*pd*, and 150*pd*, respectively, to transmit an external signal to each of the light emitting stack 20, 30, and 40.

Since a method of forming the first, second, third, and fourth connection electrodes 120*ce*, 130*ce*, 140*ce*, and 150*ce* is similar to that described above, repeated detailed descriptions thereof will be omitted to avoid redundancy. In addition, although not shown in the drawing, bonding metal layers 20*cp*, 30*cp*, 40*cp*, and 50*cp* described above may be formed on the first, second, third, and fourth connection electrodes 120*ce*, 130*ce*, 140*ce*, and 150*ce*, respectively.

According to the illustrated exemplary embodiment, each of the connection electrodes 120*ce*, 130*ce*, 140*ce*, and 150*ce* may have a substantially elongated shape to be spaced apart from the substrate 11. In another exemplary embodiment, the connection electrodes 120*ce*, 130*ce*, 140*ce*, and 150*ce* may include two or more metals or a plurality of different metal layers to reduce stress from the elongated shape of the connection electrodes 120*ce*, 130*ce*, 140*ce*, and 150*ce*. However, the inventive concepts are not limited to a specific shape of the connection electrodes 120*ce*, 130*ce*, 140*ce*, and 150*ce*, and in some exemplary embodiments, the connection electrode may have various shapes.

The connection electrodes 120*ce*, 130*ce*, 140*ce*, and 150*ce* are generally disposed to be spaced apart from the light emitting stack structure in the lateral direction. However, some of the connection electrodes 120*ce*, 130*ce*, 140*ce*, and 150*ce* may be disposed on the light emitting stack structure, for example, on a partial region of the third light emitting stack 40.

Figure 25A:
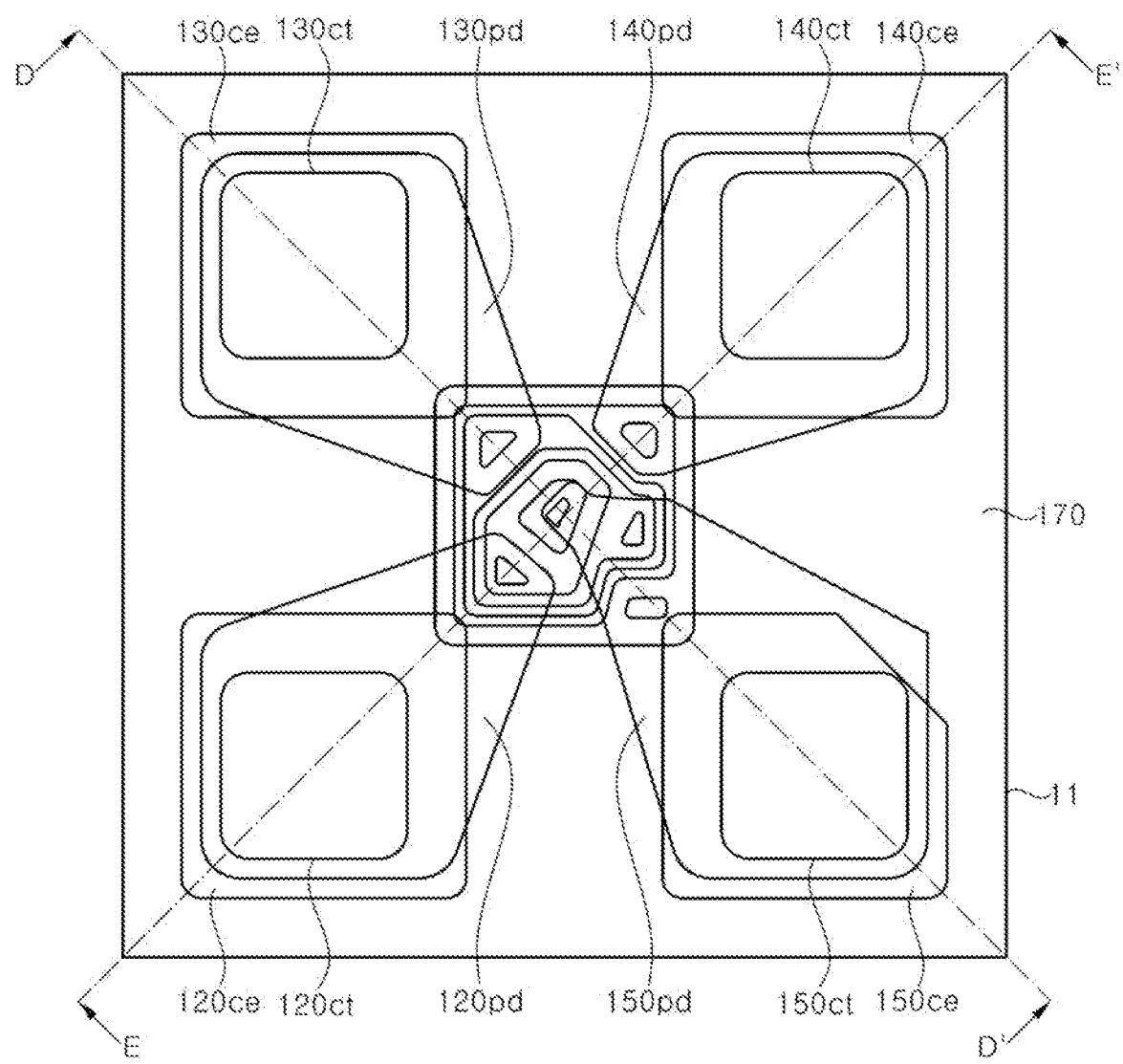
Figure 25B:
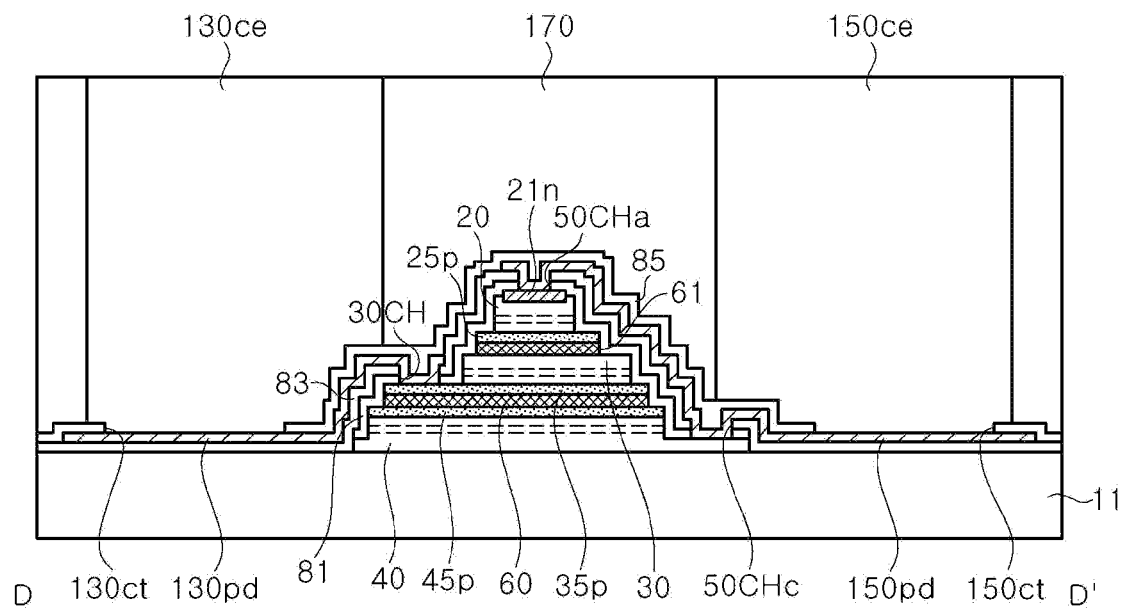
Figure 25C:
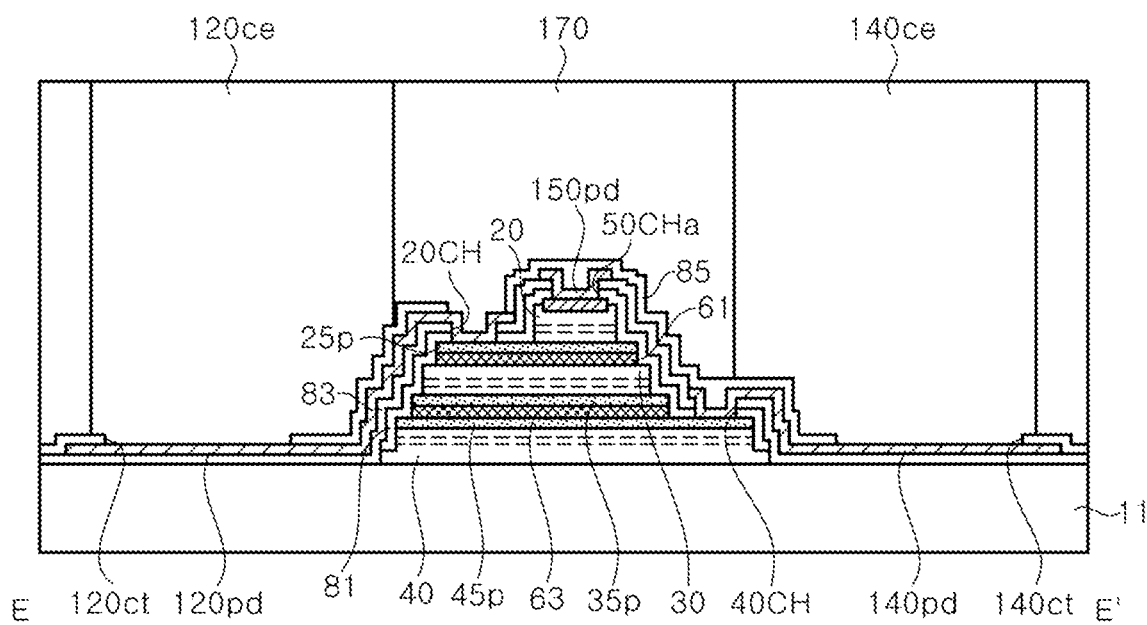

Additionally, referring to FIGS. 25A, 25B, and 25C, a light absorbing material 170 filling a region between the connection electrodes 120*ce*, 130*ce*, 140*ce*, and 150*ce* may be formed. The light absorbing material 170 may be formed of PDMA, black EMC, or the like.

Thereafter, by separating the substrate 11 for each light emitting device region using laser scribing or the like, the light emitting device 100*a* described with reference to FIGS. 21A, 21B, and 21C may be provided.

Figure 26:
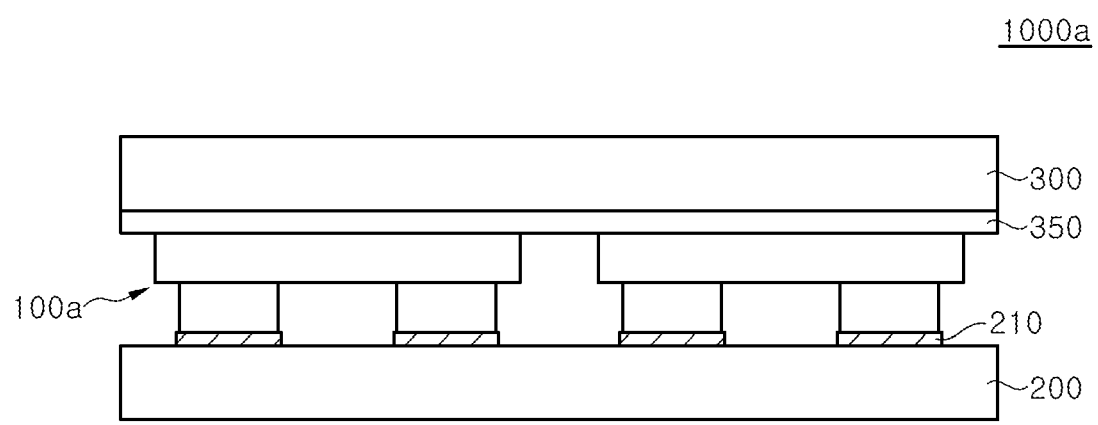
FIG. 26 is a schematic cross-sectional view of a display apparatus according to an exemplary embodiment.

FIG. 26 is a schematic cross-sectional view of a display apparatus 1000*a* according to an exemplary embodiment.

Referring to FIG. 26, the display apparatus 1000*a* according to the illustrated exemplary embodiment is similar to the display apparatus 1000 described with reference to FIGS. 20A and 20B, but the light emitting device 100*a* according to the illustrated exemplary embodiment is mounted on a circuit board 200.

The light emitting device 100*a* may be bonded to bonding pads 210 on the circuit board 200 using a solder paste, and may be bonded to the bonding pads 210 on the circuit board 200 including bonding metal layers by eutectic bonding, as in the above-described exemplary embodiment.

The region between the connection electrodes 120ce, 130ce, 140ce, and 150ce may be empty or may be filled with the light absorbing material 170 as described above.

In the illustrated exemplary embodiment, the light emitting device 100a includes the substrate 11, but in some exemplary embodiments, the substrate 11 may be removed. For example, after the light emitting device 100a is bonded onto the circuit board 200, the substrate 11 may be removed from the third light emitting stack 40 using a technique such as laser lift-off.

Although the light emitting devices 100 and 100a having the stacked structure of LEDs have been described above, the inventive concepts are not limited to the light emitting devices having the stacked structure, such as the light emitting devices 100 and 100a. Hereinafter, the light emitting device 10 having a single light emitting stack structure and a pixel module 1000b using the same will be described.

Figure 27A:
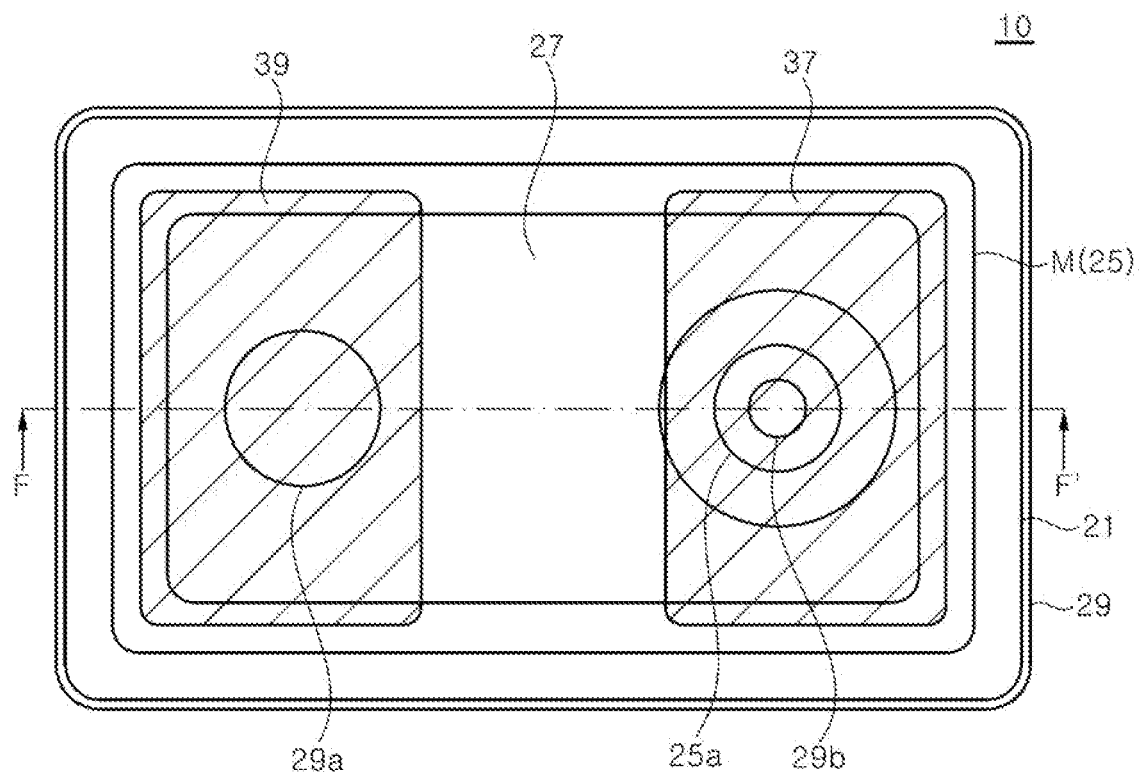
FIG. 27A is a schematic plan view of a light emitting device according to an exemplary embodiment.
Figure 27B:
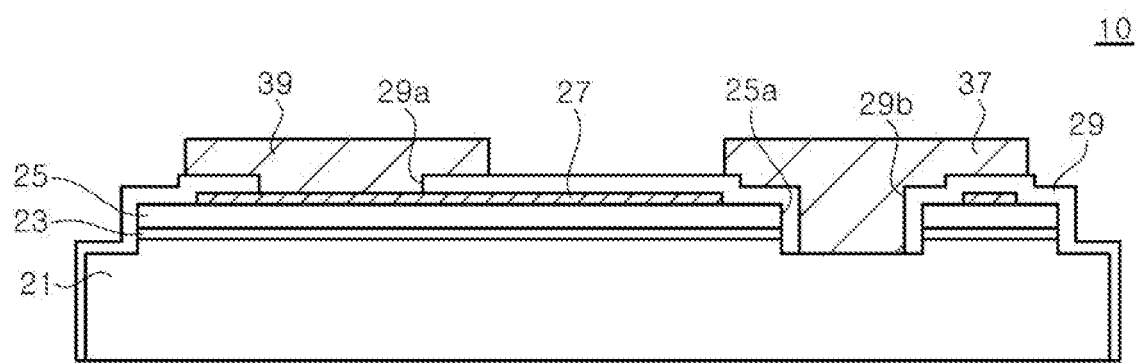
FIG. 27B is a cross-sectional view taken along line F-F' of FIG. 27A.

FIG. 27A is a schematic plan view of a light emitting device 10 according to an exemplary embodiment, and FIG. 27B is a cross-sectional view taken along line F-F' of FIG. 27A.

Referring to FIGS. 27A and 27B, the light emitting device 10 includes a light emitting structure including a first conductivity type semiconductor layer 21, an active layer 23, and a second conductivity type semiconductor layer 25.

The light emitting device 10 may include an ohmic contact layer 27, an insulation layer 29, a first electrode pad 37, and a second electrode pad 39. The first conductivity type semiconductor layer 21, the active layer 23, and the second conductivity type semiconductor layer 25 may be grown on a substrate. The substrate may be selected according to a type of semiconductor layer to be grown, such as gallium nitride substrate, GaAs substrate, Si substrate, and sapphire substrate, more particularly, patterned sapphire substrate. A growth substrate may be separated from the semiconductor layers using a process such as a mechanical grinding, a laser lift off process, a chemical lift off process, or the like. However, the inventive concepts are not limited thereto, and, in some exemplary embodiments, a portion of the substrate may be retained on the first conductivity type semiconductor layer 21.

Hereinafter, although the light emitting device 10 will be exemplarily described as including the semiconductor layers 21, 23, and 25 emitting red light such as the first light emitting stack 20, the light emitting device 10 may include semiconductor layers of the second light emitting stack 30 emitting blue light and/or the third light emitting stack 40 emitting green light.

In an exemplary embodiment, when the light emitting device 10 emits red light, the semiconductor layers may include gallium arsenide (AlGaAs), gallium arsenide phosphide (GaAsP), aluminum gallium indium phosphide (AlGaInP), or gallium phosphide (GaP).

When the light emitting device 10 emits green light, the semiconductor layers may include indium gallium nitride (InGaN), gallium nitride (GaN), gallium phosphide (GaP), aluminum gallium indium phosphide (AlGaInP), or aluminum gallium phosphide. (AlGaP).

In an exemplary embodiment, when the light emitting device 10 emits blue light, the semiconductor layer may include gallium nitride (GaN), indium gallium nitride (InGaN), or zinc selenide (ZnSe).

The first conductivity type and the second conductivity type have opposite polarities, when the first conductivity type is an n-type, the second conductivity type becomes a p-type, and, when the second conductivity type is a p-type, the second conductivity type becomes an n-type.

Although the first conductivity type semiconductor layer 21 and the second conductivity type semiconductor layer 25 are exemplarily illustrated as single layers in the drawings, these layers may be multiple layers, and may also include a superlattice layer. The active layer 23 may include a single quantum well structure or a multiple quantum well structure, and a composition ratio of a nitride-based semiconductor may be adjusted to emit light having a desired wavelength.

The second conductivity type semiconductor layer 25 and the active layer 23 may have a mesa M structure and may be disposed on the first conductivity type semiconductor layer 21. The mesa M may include the second conductivity type semiconductor layer 25 and the active layer 23, and may include a portion of the first conductivity type semiconductor layer 21 as shown in FIG. 27B. The mesa M may be disposed on the portion of the first conductivity type semiconductor layer 21, and an upper surface of the first conductivity type semiconductor layer 21 may be exposed around the mesa M.

The first conductivity type semiconductor layer 21 may have a concave-convex pattern by surface texturing. Surface texturing may be carried out by patterning, for example, using a dry etching process. For example, cone-shaped protrusions may be formed, an elevation of the cone may be about 2.5 μm to about 3 μm, a distance between the cones may be about 1.5 μm to about 2 μm, and a diameter of a bottom of the cone may be about 3 μm. In this manner, color difference may be reduced by forming the concave-convex pattern on the surface of the first conductivity type semiconductor layer 21.

When the first, second, and third light emitting devices are linearly arranged in a unit pixel 100 which will be described later, color difference between the left and right of a pixel may be reduced by including the surface-textured first conductivity type semiconductor layer 21.

The mesa M may have a through hole 25a exposing the first conductivity type semiconductor layer 21. The through hole 25a may be adjacently disposed to one edge of the mesa M, but the inventive concepts are not limited thereto. In some exemplary embodiments, the through hole 25a may be disposed at a center of the mesa M.

The ohmic contact layer 27 is disposed on the second conductivity type semiconductor layer 25 to be in ohmic contact with the second conductivity type semiconductor layer 25. The ohmic contact layer 27 may be formed of a single layer or multiple layers, and may be formed of a transparent conductive oxide film or a metal film. For example, the transparent conductive oxide film may include ITO, ZnO, or the like, and the metal film may include metal, such as Al, Ti, Cr, Ni, Au, or the like or an alloy thereof.

The insulation layer 29 covers the mesa M and the ohmic contact layer 27. The insulation layer 29 may further cover upper and side surfaces of the first conductivity type semiconductor layer 21 exposed around the mesa M. The insulation layer 29 may have an opening 29a exposing the ohmic contact layer 27, and an opening 29b exposing the first conductivity type semiconductor layer 21 in the through hole 25a. The insulation layer 29 may be formed of a single layer or multiple layers of a silicon oxide film or a silicon nitride film. The insulation layer 29 may also include an insulation reflector, such as a distributed Bragg reflector.

The first electrode pad 37 and the second electrode pad 39 are disposed on the insulation layer 29. The second electrode pad 39 may be electrically connected to the ohmic contact layer 27 through the opening 29a, and the first electrode pad 37 may be electrically connected to the first conductivity type semiconductor layer 21 through the opening 29b.

The first and/or second electrode pads 37 and 39 may be formed of a single layer or a multiple layer. The first and/or second electrode pads 37 and 39 may include metal, such as Al, Ti, Cr, Ni, Au, or the like or an alloy thereof.

In some exemplary embodiments, the light emitting device 10 may further include a layer having additional functions in addition to the above-described layers. For example, various layers such as a reflection layer for reflecting light, an additional insulation layer for insulating a specific element, and a solder preventing layer for preventing diffusion of solder may be further included.

When a flip chip type light emitting device is formed, the mesa may be formed to have various shapes, and the locations and shapes of the first and second electrode pads 37 and 39 may also be variously modified. In addition, the ohmic contact layer 27 may be omitted, and the second electrode pad 39 may directly contact the second conductivity type semiconductor layer 25. Although the first electrode pad 37 is exemplarily shown as being directly connected to the first conductivity type semiconductor layer 21, in some exemplary embodiments, a contact layer may be formed first on the first conductivity type semiconductor layer 21 exposed to the through hole 25a, and the first electrode pad 37 may be connected to the contact layer.

Figure 28A:
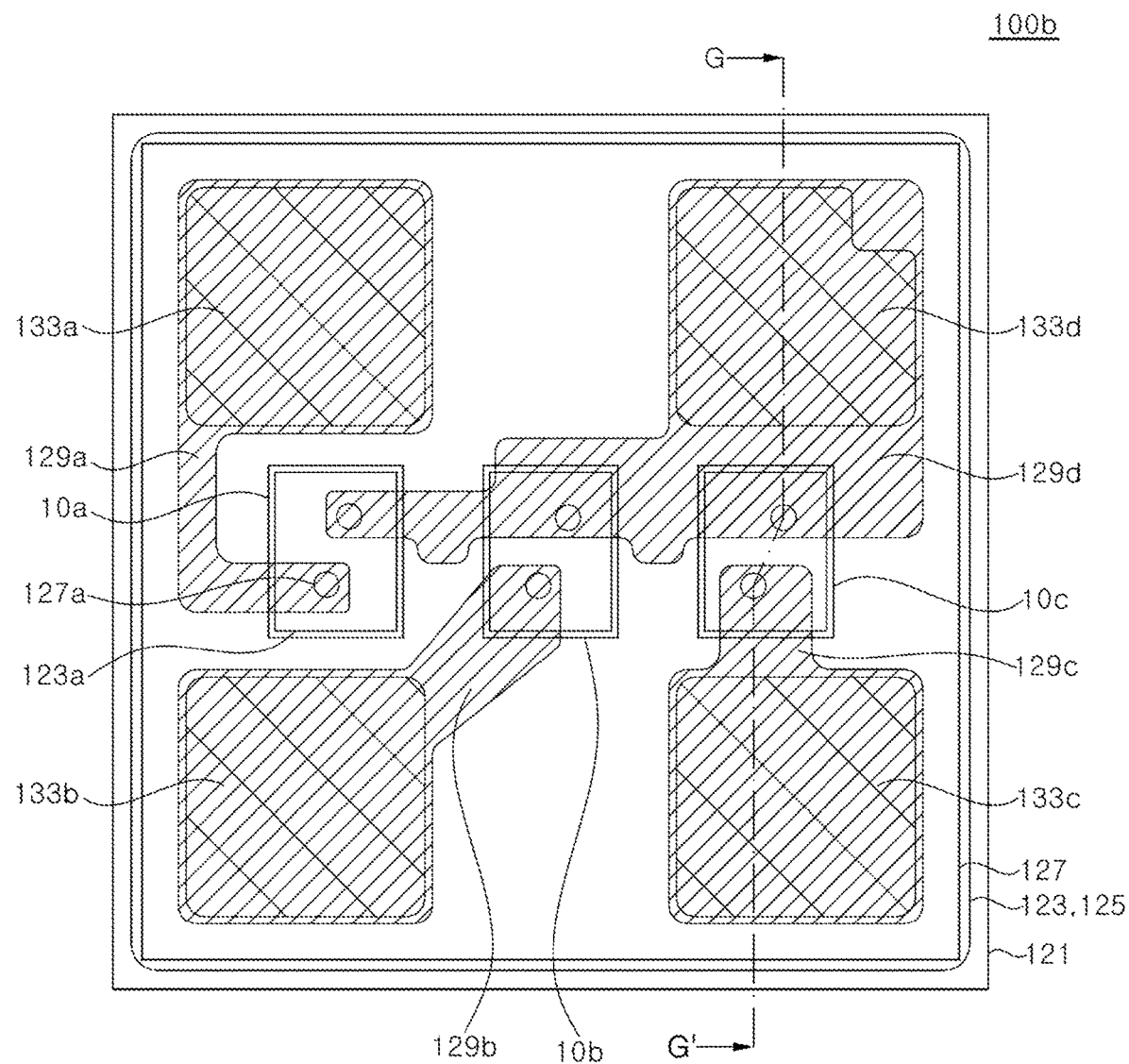
FIG. 28A is a schematic plan view of a unit pixel according to an exemplary embodiment.
Figure 28B:
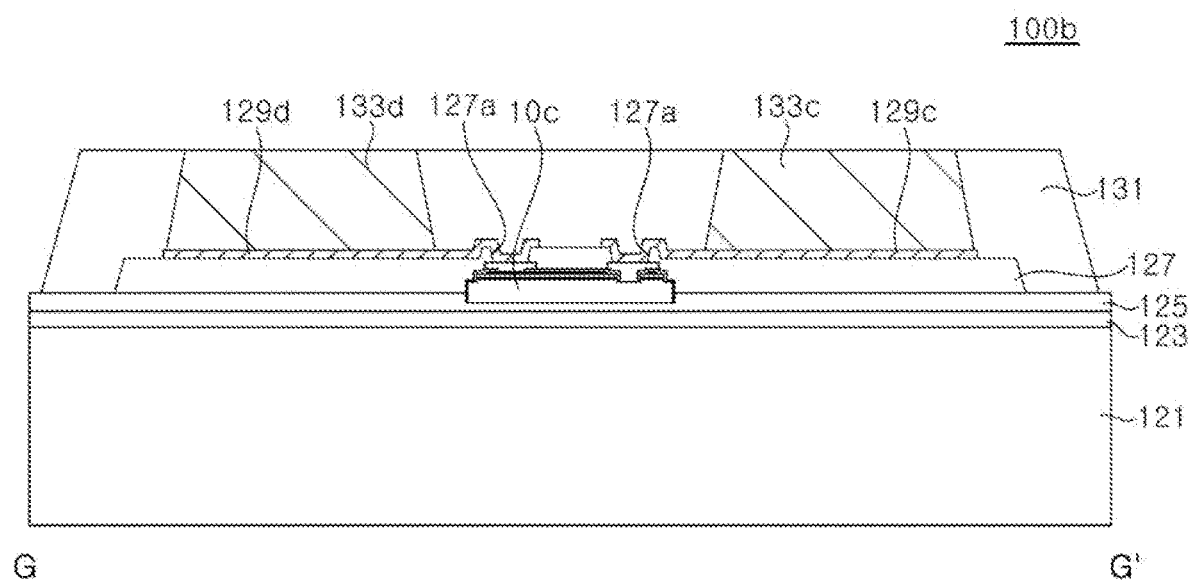
FIG. 28B is a schematic cross-sectional view taken along the line G-G' of FIG. 28A.

FIG. 28A is a schematic plan view of a unit pixel 100b according to an exemplary embodiment, and FIG. 28B is a schematic cross-sectional view taken along the line G-G' of FIG. 28A.

Referring to FIG. 28A and FIG. 28B, the unit pixel 100b may include a transparent substrate 121, first, second, and third light emitting devices 10a, 10b, and 10c, a light absorbing layer 123, and an adhesive layer 125, a step adjustment layer 127, connection layers 129a, 129b, 129c, and 129d, bumps 133a, 133b, 133c, and 133d, and a protection layer 131.

The unit pixel 100b may form a single pixel and includes the first, second, and third light emitting devices 10a, 10b, and 10c. The first, second, and third light emitting devices 10a, 10b, and 10c emit light of different colors, and the first, second, and third light emitting devices 10a, 10b, and 10c correspond to sub-pixels, respectively.

The transparent substrate 121 is a light transmissive substrate such as PET, glass substrate, quartz, sapphire substrate, or the like. Light emitted from the light emitting devices 10a, 10b, and 10c is emitted to the outside through the transparent substrate 121. The transparent substrate 121 may include a concave-convex pattern on the light emitting surface to improve light emission efficiency and uniformity of light. The transparent substrate 121 may also include an anti-reflection coating, or may include an antiglare layer or may be antiglare treated. The transparent substrate 121 may have a thickness of, for example, 50 μm to 500 μm.

Although a single unit pixel 100b is exemplarily illustrated to be formed on a single transparent substrate 121, a plurality of unit pixels 100b may be formed on the single transparent substrate 121.

The light absorbing layer 123 may include an absorbing material which absorbs light, such as PDMA, black EMC, or carbon black. The light absorbing material may prevent light generated in the light emitting devices 10a, 10b, and 10c from leaking from a region between the transparent substrate 121 and the light emitting devices 10a, 10b, and 10c toward a side surface thereof, and may improve contrast of a display apparatus. The light absorbing layer 123 is disposed on a path of light generated by the light emitting devices 10a, 10b, and 10c.

The adhesive layer 125 is attached onto the transparent substrate 121. The adhesive layer 125 may cover the light absorbing layer 123. The adhesive layer 125 may be attached to an entire surface of the transparent substrate 121, but the inventive concepts are not limited thereto. In some exemplary embodiments, the adhesive layer 125 may be attached to a portion of the transparent substrate 121 to expose a region near an edge of the transparent substrate 121. The adhesive layer 125 may attach the light emitting devices 10a, 10b, and 10c to the transparent substrate 121.

The adhesive layer 125 may be formed of a light transmissive layer, and transmits light emitted from the light emitting devices 10a, 10b, and 10c. The adhesive layer 125 may include a diffuser, such as $SiO_2$, $TiO_2$, ZnO, or the like to diffuse light. The light diffusing material prevents the light emitting devices 10a, 10b, and 10c from being observed from the light emitting surface.

The first, second, and third light emitting devices 10a, 10b, and 10c are disposed on the transparent substrate 121. The first, second, and third light emitting devices 10a, 10b, and 10c may be attached to the transparent substrate 121 by the adhesive layer 125.

The first, second, and third light emitting devices 10a, 10b, and 10c may be, for example, green light emitting devices, red light emitting devices, and blue light emitting devices. Since the configuration of each of the first, second, and third light emitting devices 10a, 10b, and 10c is substantially the same as that described with reference to FIG. 27A and FIG. 27B, repeated descriptions thereof will be omitted.

The first, second, and third light emitting devices 10a, 10b, and 10c may be linearly arranged as shown in FIG. 28A. In particular, when the transparent substrate 121 is a sapphire substrate, the sapphire substrate may include clean-cut surfaces (e.g., m-plane) and non clean-cut surfaces (e.g., a-plane) due to a location of a crystal plane along a cutting direction. For example, when the sapphire substrate is cut into a quadrangular shape, two cutting planes on both sides thereof (e.g., m-plane) may be cut clean along the crystal plane, and the remaining two cutting planes (e.g., a-plane) disposed in a direction perpendicular to the cutting planes may not cut clean. In this case, the clean-cut surfaces of the sapphire substrate 121 may be parallel with an arrangement direction of the light emitting devices 10a, 10b, and 10c. For example, in FIG. 28A, the clean-cut surfaces (e.g., m-plane) may be disposed up and down, and the remaining two cut surfaces (e.g., a-plane) may be disposed left and right.

The first, second, and third light emitting devices 10a, 10b, and 10c may be substantially the same as that described above with reference to FIGS. 27A and 27B, but the inventive concepts are not limited thereto, and various light emitting devices having a lateral or flip chip structure may be used in other exemplary embodiments.

The step adjustment layer 127 covers the first, second, and third light emitting devices 10a, 10b, and 10c. The step adjustment layer 127 has openings 127a exposing the first and second electrode pads 37 and 39 of the light emitting devices 10a, 10b, and 10c. The step adjustment layer 127 may facilitate forming the connection layers 129a, 129b, 129c, and 129d and the bumps 133a, 133b, 133c, and 133d. In particular, the step adjustment layer 127 may planarize a surface on which the bumps 133a, 133b, 133c, and 133d are to be formed. The step adjustment layer 127 may be formed of, for example, photosensitive polyimide.

The step adjustment layer 127 may be formed to partially expose an edge of the adhesive layer 125 as illustrated in FIG. 28B, but the inventive concepts are not limited thereto. In particular, the step adjustment layer 127 may be disposed within a region surrounded by edges of the adhesive layer 125.

The connection layers 129a, 129b, 129c, and 129d are formed on the step adjustment layer 127. The connection layers 129a, 129b, 129c, and 129d may be connected to the first and second electrode pads 37 and 39 of the first, second, and third light emitting devices 10a, 10b, and 10c through the openings 127a of the step adjustment layer 127.

For example, the connection layer 129a may be electrically connected to a first conductivity type semiconductor layer of the first light emitting device 10a, the connection layer 129b may be electrically connected to a first conductivity semiconductor layer of the second light emitting device 10b, the connection layer 129c may be electrically connected to a first conductivity type semiconductor layer of the third light emitting device 10c, and the connection layer 129d may be commonly electrically connected to second conductivity type semiconductor layers of the first, second, and third light emitting devices. 10a, 10b, and 10c. The connection layers 129a, 129b, 129c, and 129d may be formed together on the step adjustment layer 127, and may include, for example, Au.

The bumps 133a, 133b, 133c, and 133d are formed on the connection layers 129a, 129b, 129c, and 129d, respectively. For example, the first bump 133a may be electrically connected to the first conductivity type semiconductor layer of the first light emitting device 10a through the connection layer 129a, the second bump 133b may be electrically connected to the first conductivity type semiconductor layer of the second light emitting device 10b through the connection layer 129b, and the third bump 133c may be electrically connected to the first conductivity type semiconductor layer of the third light emitting device 10c through the connection layer 129c. The fourth bump 133d may be commonly electrically connected to the second conductivity type semiconductor layers of the first, second, and third light emitting devices 10a, 10b, and 10c through the connection layer 129d. The bumps 133a, 133b, 133c, and 133d may be formed of, for example, metal and/or a metal alloy, such as AuSn, SnAg, Sn, CuSn, CuN, CuAg, Sb, Ni, Zn, Mo, Co, solder, or the like.

The protection layer 131 may cover side surfaces of the bumps 133a, 133b, 133c, and 133d, and may cover the step adjustment layer 127. In addition, the protection layer 131 may cover the adhesive layer 125 exposed around the step adjustment layer 127. The protection layer 131 may be formed of, for example, a photosensitive solder resist (PSR). As such, the protection layer 131 may be patterned first through photolithography and development processes, and then the bumps 133a, 133b, 133c, and 133d may be formed. To this end, the protection layer 131 may be formed to have openings exposing the connection layers 129a, 129b, 129c, and 129d, and the bumps 133a, 133b, 133c, and 133d may be formed in the openings of the protection layer 131. In some exemplar embodiments, the bumps 133a, 133b, 133c, and 133d may be omitted.

The protection layer 131 may be formed of a light absorbing material such as a white reflective material or a black epoxy to prevent light leakage.

Figure 29:
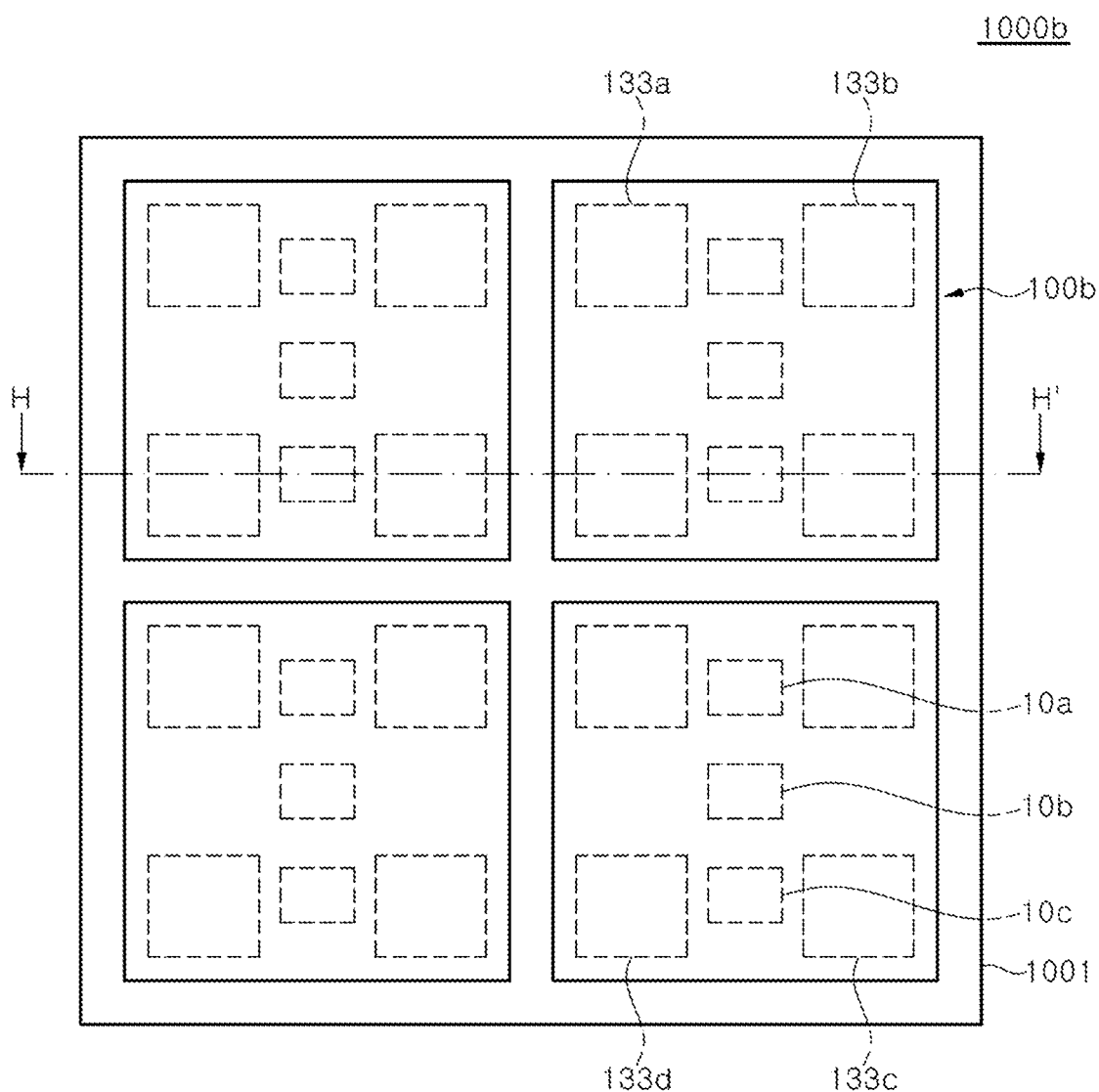
FIG. 29A is a schematic plan view of a pixel module according to an exemplary embodiment.
FIG. 29B is a schematic cross-sectional view taken along line H-H' of FIG. 29A.
FIG. 29C is a schematic rear view of the pixel module according to an exemplary embodiment.
FIG. 29D is a circuit diagram of a pixel module according to an exemplary embodiment.
FIG. 29E is a circuit diagram of a pixel module according to another exemplary embodiment.
Figure 29B:
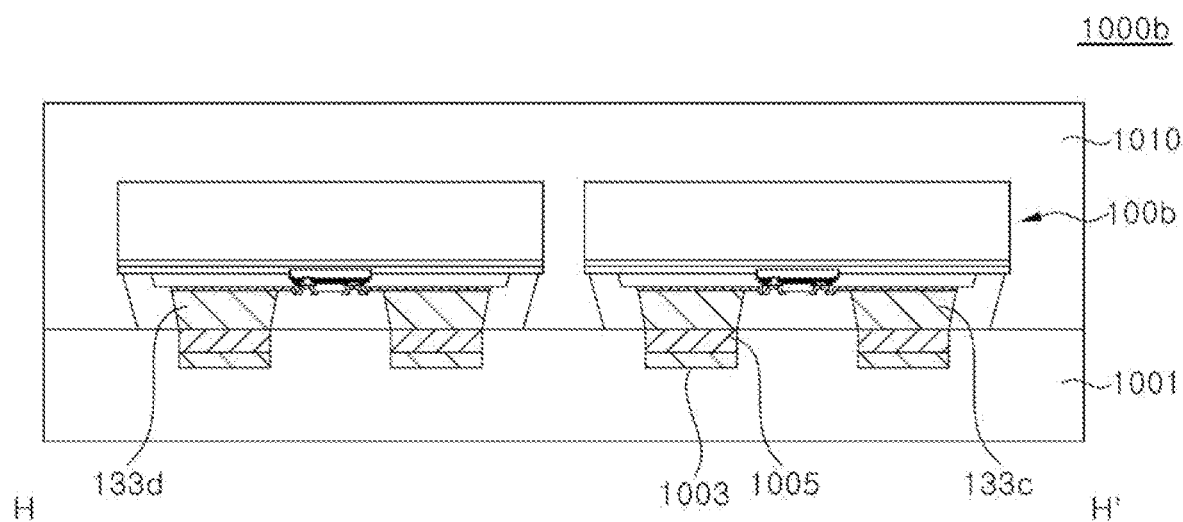
Figure 29C:
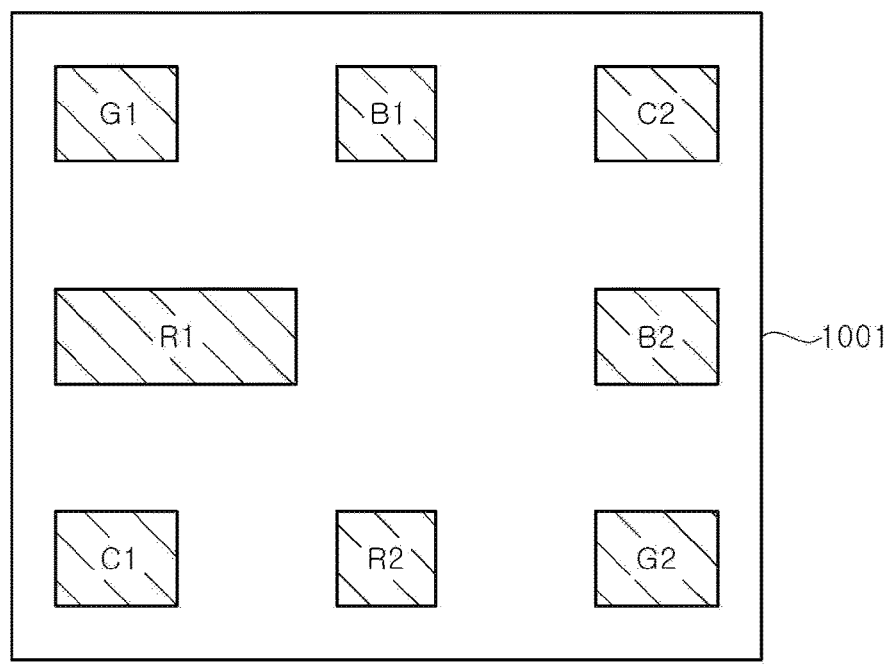
Figure 29D:
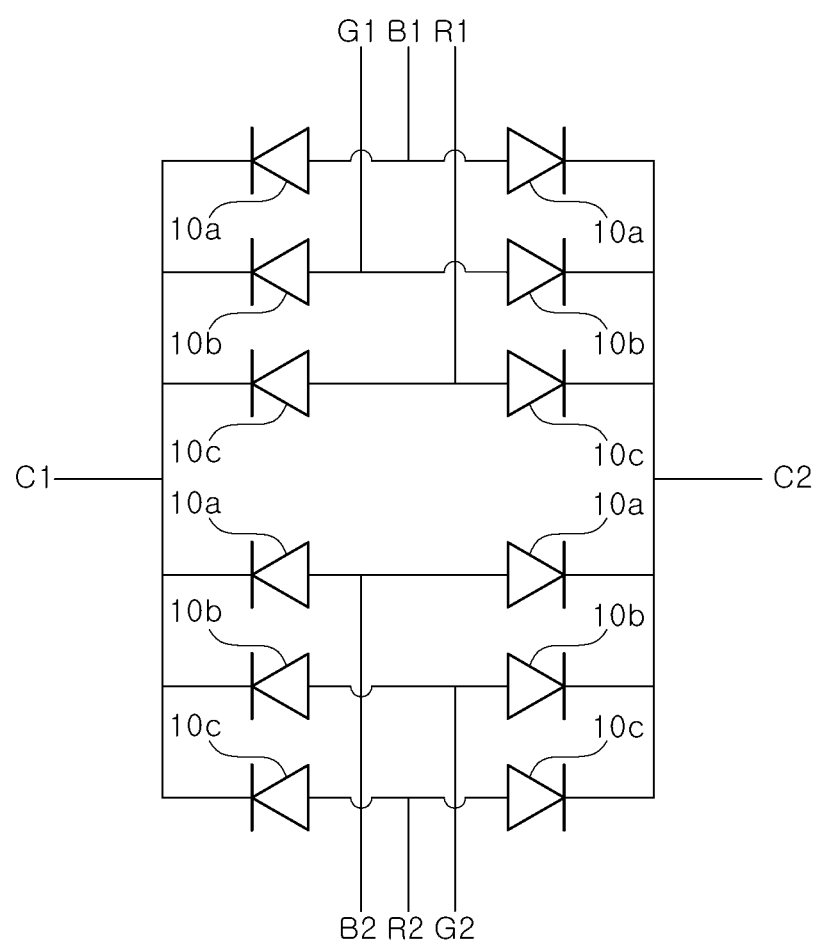

FIG. 29A is a schematic plan view of a pixel module 1000b according to an exemplary embodiment, FIG. 29B is a schematic cross-sectional view taken along line H-H' of FIG. 29A, FIG. 29C is a rear view of the pixel module 1000b, and FIG. 29D is an exemplary circuit diagram of the pixel module 1000b.

Referring to FIGS. 29A and 29B, the pixel module 1000b includes a circuit board 1001 and unit pixels 100b arranged on the circuit board 1001. The pixel module 1000b may further include a cover layer 1010 covering the unit pixels 100b.

The circuit board 1001 may have a circuit for electrically connecting light emitting devices 10a, 10b, and 10c. The circuit in the circuit board 1001 may be formed to have a multilayer structure. The circuit board 1001 may also include a passive circuit for driving the light emitting devices 10a, 10b, and 10c in a passive matrix driving manner or an active circuit for driving the light emitting devices 10a, 10b, and 10c in an active matrix driving manner. The circuit board 1001 may include pads 1003 exposed on a surface thereof. The pads 1003 may be arranged to correspond to bumps in the unit pixels 100b to be mounted thereon.

Since the of the unit pixels 100b is substantially the same as that described with reference to FIGS. 28A and 28B, repeated descriptions thereof will be omitted to avoid redundancy. The unit pixels 100b may be arranged on the circuit board 1001. The unit pixels 100b may be arranged in a 2×2 matrix as shown in FIG. 29A, but the inventive concepts are not limited thereto. In some exemplary embodiments, the unit pixels 100b may be arranged in various matrices such as 2×3, 3×3, 4×4, 5×5, or the like.

The unit pixels 100b are bonded to the circuit board 1001 by a bonding material 1005. For example, the bonding material 1005 may bond the bumps 133a, 133b, 133c, and 133d to the pads 1003. When the bumps 133a, 133b, 133c, and 133d are formed of solder, the bonding material 1005 may be omitted.

The cover layer 1010 covers a plurality of unit pixels 100b. The cover layer 1010 may improve contrast of the display apparatus by preventing optical interference between the unit pixels 100b.

The cover layer 1010 may be formed of, for example, a dry-film type solder resist (DFSR), a photo-imageable solder resist (PSR), a black material (BM), an epoxy molding compound (EMC), or the like. The cover layer 1010 may be formed using, for example, a technique such as lamination, spin coating, slit coating, printing, or the like. In some exemplary embodiments, the cover layer 1010 may be omitted.

The pixel module 1000b shown in FIGS. 29A and 29B may display an image. In addition, a display apparatus may be provided by mounting a plurality of the pixel modules 1000b on a panel substrate. In this case, the circuit board 1001 may have bottom pads connected to the pads 1003. The bottom pads may be arranged in a one-to-one correspondence with the pads 1003, but the number of the bottom pads may be reduced through a common connection. Hereinafter, the pixel module 1000b having the unit pixels 100b arranged in a 2×2 matrix will exemplarily be described with reference to FIG. 29C and FIG. 29D.

FIG. 29C illustrates a rear view of the pixel module 1000b, and bottom pads C1, C2, R1, R2, G1, G2, B1, and B2 of the circuit board 1001 are illustrated. Since the pixel modules 1000b according to an exemplary embodiment are arranged in a 2×2 matrix, a total of four pixel modules are arranged on the circuit board 1001. Three light emitting devices 10a, 10b, and 10c and four bumps 133a, 133b, 133c, and 133d are disposed on each pixel module 1000b. Accordingly, sixteen pads 1003 corresponding to the bumps of the four unit pixels 100b would be provided on the circuit board 1001. However, according to the illustrated exemplary embodiment, only eight bottom pads may be disposed, which may be connected onto the panel substrate to individually drive each of the light emitting devices 10a, 10b, and 10c.

FIG. 29D illustrates a schematic circuit diagram in which each of the light emitting devices 10a, 10b, and 10c are connected to the bottom pads C1, C2, R1, R2, G2, G2, B1, and B2.

Referring to FIG. 29D, the bottom pad C1 is commonly connected to cathodes of the light emitting devices 10a, 10b, and 10c disposed in the left column, and the bottom pad C2 is commonly connected to cathodes of the light emitting devices 10a, 10b, and 10c disposed in the right column.

In the unit pixels 100b arranged in the upper row, the bottom pad B1 may be connected to anodes of the first light emitting devices 10a, the bottom pad G1 may be connected to anodes of the second light emitting devices 10b, and the bottom pad R1 may be connected to anodes of the third light emitting devices 10c.

In the unit pixels 100b arranged in the lower row, the bottom pad B2 may be connected to the anodes of the first light emitting devices 10a, the bottom pad G2 may be connected to the anodes of the second light emitting devices 10b, and the bottom pad R2 may be connected to the anodes of the third light emitting devices 10c.

The bottom pads R1, G1, B1, R2, G2, and B2 represent pads connected to red, green, and blue light emitting devices, respectively. However, the order of arrangement of the red, green, and blue light emitting devices may be changed, and, accordingly, locations to which the bottom pads R1, G1, B1, R2, G2, and B2 are connected may also be changed. For example, the circuit diagram of FIG. 29D exemplarily shows the bottom pads assuming that the first light emitting devices 10a are blue light emitting devices, the second light emitting devices 10b are green light emitting devices, and the third light emitting devices 10c are red light emitting devices. Alternatively, the first light emitting devices 10a may be the red light emitting devices, and the third light emitting devices 10c may be the blue light emitting devices, and, in this case, the locations of the bottom pads R1 and R2 and the bottom pads B1 and B2 may be interchanged.

According to the illustrated exemplary embodiment, since the bottom pads C1 and C2 are commonly connected to the cathodes of the light emitting devices in each column, and each of the bottom pads R1, G1, B1, R2, B2, and G2 are connected to the anodes of the two light emitting devices. In this manner, each of the light emitting devices 10a, 10b, and 10c may be driven independently while reducing the total number of the bottom pads.

Figure 29E:
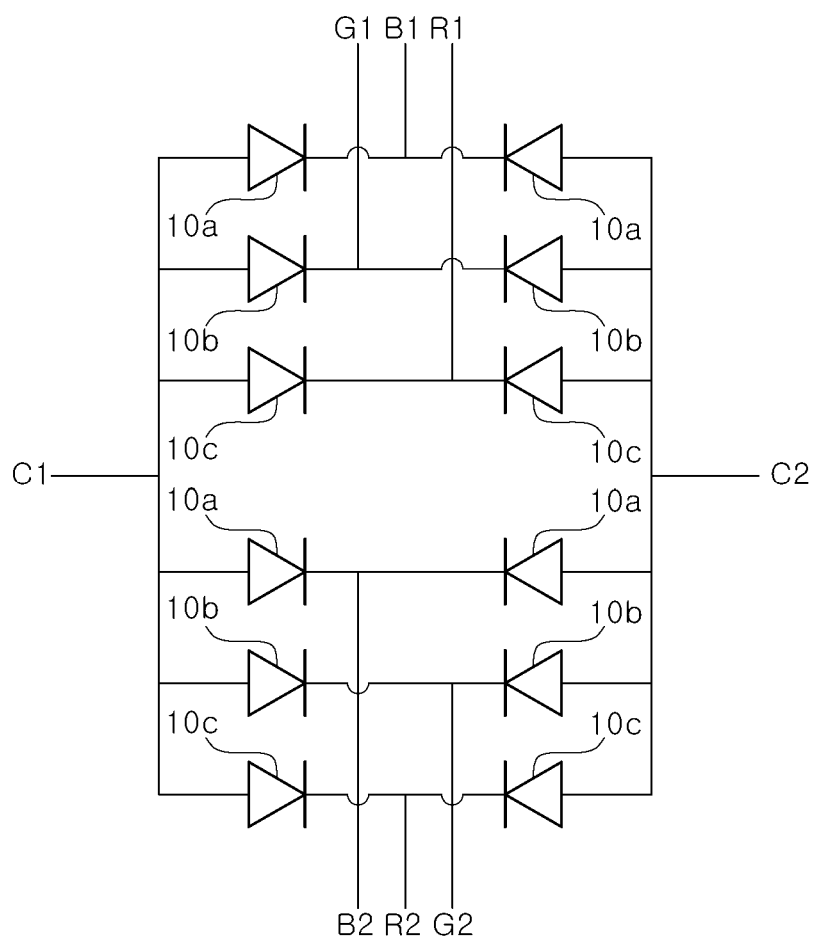

Although it is described and illustrated that the bottom pads C1 and C2 are connected to the cathodes of the light emitting devices and the bottom pads R1, G1, B1, R2, B2 and G2 are connected to the anodes of the light emitting device in the illustrated exemplary embodiment, the bottom pads C1 and C2 may be connected to the anodes of the light emitting devices, and the bottom pads R1, G1, B1, R2, B2 and G2 may be connected to the cathodes of the light emitting device as shown in FIG. 29E.

Although the pixel module 1000b is exemplarily described as including the unit pixels 100 arranged in a 2×2 matrix, the number of the bottom pads may be reduced using a common connection circuit even when the unit pixels 100 are arranged in another matrix such as 3×3, 5×5, or the like.

The light emitting devices 10a, 10b, and 10c in the pixel module 1000b may be individually driven by a driving IC disposed on the panel substrate, and images may be displayed by a plurality of pixel modules 1000b.

According to exemplary embodiments, optical interference between adjacent light emitting devices may be reduced by employing a light absorbing layer, and the light emitting devices may be protected by employing the transparent substrate.

Although some embodiments have been described herein, it should be understood that these embodiments are provided for illustration only and are not to be construed in any way as limiting the present disclosure. It should be understood that features or components of an exemplary embodiment can also be applied to other embodiments without departing from the spirit and scope of the present disclosure.

What is claimed is:

1. A display apparatus, comprising:
a circuit board;
a plurality of pixels mounted on the circuit board, each of the pixels including:
a first emitter, a second emitter, and a third emitter stacked in the vertical direction;
first, second, third, and fourth connection electrodes electrically connected to the first, second, and third emitters and configured to electrically connect the first, second, and third emitters to the circuit board;
a first pad electrically connecting the first connection electrode to the first emitter;
a second pad electrically connecting the second connection electrode to the second emitter;
a third pad electrically connecting the third connection electrode to the third emitter; and
a fourth pad electrically connecting the fourth connection electrode to the first, second, and third emitters;
a transparent layer disposed on the pixels; and
a light absorbing layer covering upper regions of the pixels and a region between the pixels,
wherein the first, second, and third connection electrodes are disposed within a lower region of the third emitter.

2. The display apparatus of claim 1, wherein the light absorbing layer includes at least one of PDMA and black EMC.

3. The display apparatus of claim 2, wherein the light absorbing layer contacts a lower surface of the transparent layer.

4. The display apparatus of claim 1, wherein each of the pixels includes a single light emitting stack.

5. The display apparatus of claim 4, further comprising an adhesive layer disposed between the pixels and the light absorbing layer.

6. The display apparatus of claim 1, wherein:
the pixel further includes a growth substrate of the third emitter; and
the light absorbing layer contacts the growth substrate.

7. The display apparatus of claim 1, wherein the light absorbing layer contacts the third emitter.

8. The display apparatus of claim 1, further comprising bonding metal layers disposed on upper surfaces of the first, second, third, and fourth connection electrodes, respectively,
wherein the bonding metal layers are eutectic bonded to the circuit board.

9. The display apparatus of claim 8, wherein:
each of the first, second, third, and fourth connection electrodes includes a groove on the upper surface thereof, respectively; and the bonding metal layers cover the grooves of the first, second, third, and fourth connection electrodes, respectively.

10. The display apparatus of claim 8, wherein the first, second, third, and fourth connection electrodes include Cu, and the bonding metal layers include Au.

11. The display apparatus of claim 1, wherein the first, second, third, and fourth connection electrodes are located within lower regions of the first, second, and third emitters.

12. The display apparatus of claim 1, wherein:
each of the first, second, third, and fourth pads extends outward from the lower region of the third emitter; and
the first, second, third, and fourth connection electrodes are connected to the first, second, third, and fourth pads at locations spaced apart from the lower region of the third emitter in the lateral direction.

13. The display apparatus of claim 1, wherein:
each of the first, second, and third emitters includes a first conductivity type semiconductor layer and a second conductivity type semiconductor layer;
the first, second, and third connection electrodes are electrically connected to the second conductivity type semiconductor layers of the first, second, and third emitters, respectively; and
the fourth connection electrode is electrically connected to the first conductivity type semiconductor layers of the first, second, and third emitters.

14. The display apparatus of claim 13, further including a first upper contact electrode in ohmic contact with the first conductivity type semiconductor layer of the first emitter, wherein:
the first conductivity type semiconductor layer of the first emitter has a recessed region; and
the first upper contact electrode is disposed in the recessed region.

15. A unit pixel, comprising:
a transparent layer;
a plurality of pixels arranged on the transparent layer, each of the pixels including:
a first emitter, a second emitter, and a third emitter stacked in the vertical direction;
first, second, third, and fourth connection electrodes electrically connected to the first, second, and third emitters;
a first pad electrically connecting the first connection electrode to the first emitter;
a second pad electrically connecting the second connection electrode to the second emitter;
a third pad electrically connecting the third connection electrode to the third emitter; and
a fourth pad electrically connecting the fourth connection electrode to the first, second, and third emitters;
a light absorbing layer covering upper regions of the pixels and a region between the pixels;
an adhesive layer bonding the pixels to the light absorbing layer; and
a step adjustment layer covering the pixel and adhered to the adhesive layer,
wherein the first, second, and third connection electrodes are disposed within a lower region of the third emitter.

16. The unit pixel of claim 15, wherein:
the first, second, and third emitters are configured to emit light of different colors from one another; and
the first, second, and third emitters are linearly arranged along a line.

17. A pixel module, comprising:
a circuit board;
a plurality of unit pixels disposed on the circuit board, each of the unit pixels including:
a transparent layer;
a first emitter, a second emitter, and a third emitter stacked in the vertical direction;
first, second, third, and fourth connection electrodes electrically connected to the first, second, and third emitters and configured to electrically connect the first, second, and third emitters to the circuit board;
a first pad electrically connecting the first connection electrode to the first emitter;
a second pad electrically connecting the second connection electrode to the second emitter;
a third pad electrically connecting the third connection electrode to the third emitter; and
a fourth pad electrically connecting the fourth connection electrode to the first, second, and third emitters;
a light absorbing layer covering upper regions of the unit pixels and a region between the unit pixels;
an adhesive layer bonding the unit pixels to the light absorbing layer; and
a step adjustment layer covering the unit pixels and adhered to the adhesive layer.

* * * * *